(12) United States Patent
Kimura et al.

(10) Patent No.: US 10,224,101 B2
(45) Date of Patent: Mar. 5, 2019

(54) DATA HOLDING DEVICE, NONVOLATILE DATA HOLDING DEVICE, AND DATA READING METHOD

(71) Applicant: Rohm Co., Ltd., Kyoto (JP)

(72) Inventors: Hiromitsu Kimura, Kyoto (JP); Takanori Ozawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/722,501

(22) Filed: Oct. 2, 2017

(65) Prior Publication Data

US 2018/0108414 A1    Apr. 19, 2018

(30) Foreign Application Priority Data

| Oct. 4, 2016 | (JP) | 2016-196430 |
| Oct. 4, 2016 | (JP) | 2016-196432 |
| Oct. 4, 2016 | (JP) | 2016-196435 |
| Oct. 7, 2016 | (JP) | 2016-199032 |
| Sep. 13, 2017 | (JP) | 2017-175874 |

(51) Int. Cl.

| *G11C 14/00* | (2006.01) |
| *G11C 11/56* | (2006.01) |
| *G11C 11/22* | (2006.01) |
| *H03K 19/0948* | (2006.01) |
| *H02M 3/07* | (2006.01) |
| *H03K 19/0185* | (2006.01) |
| *G11C 13/00* | (2006.01) |

(52) U.S. Cl.
CPC ........ *G11C 14/0072* (2013.01); *G11C 11/221* (2013.01); *G11C 11/5657* (2013.01); *H02M 3/07* (2013.01); *H03K 19/018521* (2013.01); *H03K 19/09485* (2013.01); *G11C 2013/0042* (2013.01)

(58) Field of Classification Search
CPC .............. G11C 14/0072; G11C 11/221; G11C 11/5657
USPC .................................................. 365/205, 145
See application file for complete search history.

(56) References Cited

U.S. PATENT DOCUMENTS

| 2008/0089155 A1* | 4/2008 | Bae ...................... G11C 7/1078 |
| | | 365/205 |
| 2008/0239849 A1* | 10/2008 | Do .......................... G11C 7/08 |
| | | 365/205 |

(Continued)

FOREIGN PATENT DOCUMENTS

| JP | 5514574 B2 | 4/2013 |
| JP | 5421779 B2 | 11/2013 |
| JP | 2016-058120 | 4/2016 |

*Primary Examiner* — Vu A Le

(74) *Attorney, Agent, or Firm* — Fish & Richardson P.C.

(57) ABSTRACT

A data holding device 100 has an inverter loop 101, a differential pair circuit 102 connected to the ground terminals of inverters, a first potential setter 103 configured to turn the output terminals of the inverters to a first potential (VDD), and a second potential setter 104 configured to turn the ground terminals of the inverters to a second potential (VSS). During data holding, the differential pair circuit 102 and the first potential setter 103 are disabled so that the ground terminals of the inverters are at the second potential. During data writing, the differential pair circuit 102 is disabled so that the output terminal of one inverter is at the first potential and the ground terminal of the other inverter is at the second potential.

19 Claims, 64 Drawing Sheets

(56) References Cited

U.S. PATENT DOCUMENTS

| | | | |
|---|---|---|---|
| 2008/0285364 A1* | 11/2008 | Kim | G11C 7/065 |
| | | | 365/193 |
| 2011/0128769 A1 | 6/2011 | Kimura | |
| 2011/0199810 A1 | 8/2011 | Kimura et al. | |
| 2014/0269128 A1* | 9/2014 | Hsieh | G11C 7/065 |
| | | | 365/203 |
| 2016/0071569 A1 | 3/2016 | Kimura | |

* cited by examiner

DATA HOLDING DEVICE, NONVOLATILE DATA HOLDING DEVICE, AND DATA READING METHOD

CROSS-REFERENCE TO RELATED APPLICATIONS

This nonprovisional application claims priority under 35 U.S.C. § 119(a) on Patent applications listed below filed in Japan, the entire contents of which are hereby incorporated by reference.
(1) No. 2016-196430 filed on Oct. 4, 2016
(2) No. 2016-196432 filed on Oct. 4, 2016
(3) No. 2016-196435 filed on Oct. 4, 2016
(4) No. 2016-199032 filed on Oct. 7, 2016
(5) No. 2017-175874 filed on Sep. 13, 2017

BACKGROUND OF THE INVENTION

Field of the Invention

The invention disclosed in this specification relates to a data holding device, a nonvolatile data holding device, and a data reading method.

Description of Related Art

FIG. 22 is a circuit diagram showing a conventional example of a data holding device (corresponding to FIG. 1 of JP-A-2016-58120 filed by the present applicant). A data holding device 3b of this conventional example includes a data holding portion M, a ferroelectric storing portion K, and a sense amplifier SA, and it functions as a nonvolatile latch capable of holding (latching), saving (storing), and restoring (recalling) a data signal Din responding to various signals from a control unit 3a.

However, in the data holding device 3b of FIG. 22, an inverter loop (NAND loop) of the data holding portion M and an inverter loop (not shown) of the sense amplifier SA are overlapped, and there is room for further improvement in reduction of circuit scale.

From another point of view, the conventional sense amplifier SA uses the inverter loop for only sensing function (i.e. a function of fixing a logic level of an output signal according to an input signal), and there is room for further study about utilizing the inverter loop.

Note that also in a sense amplifier incorporated in a semiconductor memory other than a nonvolatile latch or a nonvolatile flip-flop (e.g. a ferroelectric random access memory (FeRAM), a static RAM (SRAM), a dynamic RAM (DRAM) or the like), the inverter loop is dedicated for sensing, and there was no idea of utilizing the inverter loop for other use.

In addition, FIG. 55 is a circuit diagram showing a conventional example of a nonvolatile data holding device (corresponding to FIG. 15 of Japanese Patent No. 5421779 filed by the present applicant). The nonvolatile data holding device of this conventional example includes a loop structure LOOP that holds an input data signal D, and ferroelectric elements (CL1xa, CL1xb, CL2xa, and CL2xb) (x=1, 2, ... m) that store m-bit (m≥2) data signal D in a nonvolatile manner.

However, the nonvolatile data holding device of FIG. 55 includes only transistors (Q1xa, Q1xb, Q2xa, and Q2xb) that short-circuit both terminals of the individual ferroelectric elements as data protection means thereof, and there is room for further improvement in reliability of data protection.

In addition, FIG. 64 is a circuit diagram showing a conventional example of a nonvolatile data holding device (corresponding to FIG. 26 of Japanese Patent No. 5514574 filed by the present applicant). The nonvolatile data holding device of this conventional example includes a nonvolatile storing portion NVM that stores the data signal D in a nonvolatile manner by using hysteresis characteristics of the ferroelectric elements.

Note that when the data signal D is written in the nonvolatile storing portion NVM, complementary data are written to the ferroelectric elements CL1a and CL1b, and to the ferroelectric elements CL2a and CL2b. On the other hand, when the data signal D is read from the nonvolatile storing portion NVM, input signals SDnC and SDC corresponding to the complementary data described above are generated using capacitive coupling between the ferroelectric elements CL1a and CL1b, and capacitive coupling between the ferroelectric elements CL2a and CL2b, and a logic level of the data signal D is determined based on a magnitude relationship between them.

However, in the nonvolatile data holding device of FIG. 64, if the capacitive-coupled ferroelectric elements have different effective areas due to a variation in manufacturing process, then offset fluctuation of the input signals SDnC and SDC occurs, which may cause a reduction in operation margin when reading data.

In particular, because offset fluctuations of the input signals SDnC and SDC due to effective area variation of the ferroelectric elements are large in the conventional data reading method, the operation margin when reading data may not be sufficiently secured, and there is room for further improvement.

SUMMARY OF THE INVENTION

In view of the problem discovered by the present inventor, it is one of objects of the present invention disclosed in this specification to provide a data holding device capable of achieving both a latch function and a sensing function using a single inverter loop.

Therefore the data holding device disclosed in this specification includes an inverter loop including two inverters connected in a loop, a differential pair circuit connected to ground nodes or power supply nodes of the inverters, a first potential setter arranged to set output nodes of the inverters to a first potential, and a second potential setter arranged to set the ground nodes or the power supply nodes of the inverters to a second potential.

In addition, the data holding device disclosed in this specification includes an inverter loop including two inverters connected in a loop, a differential pair circuit connected to ground nodes or power supply nodes of the inverters, a first potential setter arranged to set output nodes of the inverters to a first potential, and a differential pair control unit arranged to perform gate control of the differential pair circuit so as to set the ground nodes or the power supply nodes of the inverters to a second potential.

In addition, in view of the problem discovered by the present inventor, it is another object of the present invention disclosed in this specification to provide a nonvolatile data holding device capable of more securely protecting data stored in a nonvolatile manner.

Therefore the nonvolatile data holding device disclosed in this specification includes a loop structure arranged to hold data using a plurality of logic gates connected in a loop, a nonvolatile storing portion arranged to store in a nonvolatile manner data held in the loop structure using hysteresis characteristics of a ferroelectric element, a circuit separating portion arranged to electrically separate the loop structure from the nonvolatile storing portion, and a circuit grounding portion arranged to ground the ferroelectric element.

In addition, in view of the problem discovered by the present inventor, it is still another object of the present invention disclosed in this specification to provide a nonvolatile data holding device and a data reading method thereof, which are capable of improving operation margin when reading data.

Therefore the nonvolatile data holding device disclosed in this specification includes a nonvolatile storing portion arranged to store data in a nonvolatile manner, a sense amplifier arranged to read data from the nonvolatile storing portion, and a control unit arranged to control the nonvolatile storing portion and the sense amplifier. The nonvolatile storing portion includes a first ferroelectric element connected between an application terminal of a first signal and a first input terminal of the sense amplifier, and a second ferroelectric element connected between an application terminal of a second signal and the first input terminal of the sense amplifier, in which when reading data from the nonvolatile storing portion, the control unit sets the first signal and the second signal to different first and second potentials in a state where the sense amplifier is stopped, and then operates the sense amplifier in a state where the first signal and the second signal are set to the same third potential.

In addition, the data reading method disclosed in this specification is a method for reading data from a ferroelectric element pair connected in series between an application terminal of a first signal and an application terminal of a second signal. The data reading method includes the steps of setting the first signal and the second signal to different first and second potentials in a state where a sense amplifier connected to the ferroelectric element pair is stopped, and operating the sense amplifier in a state where the first signal and the second signal are set to the same third potential.

Note that other features, elements, steps, advantages, and characteristics of the present invention will become more apparent from the description of the best mode embodiment given below and the related attached drawings.

DETAILED DESCRIPTION OF THE PREFERRED EMBODIMENTS

<Data Holding Device (First Embodiment)>

Figure 1:
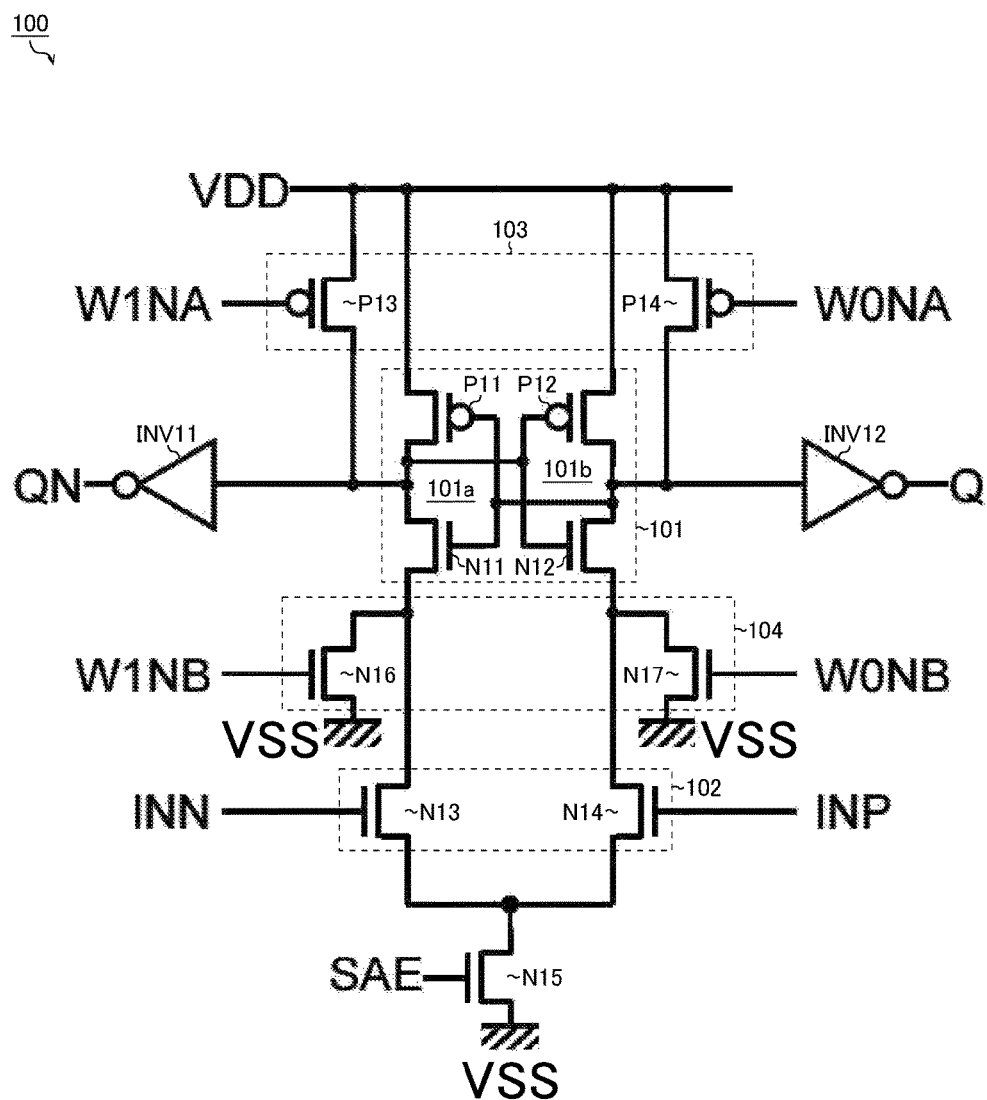
FIG. 1 is a circuit diagram showing a first embodiment of a data holding device.

FIG. 1 is a circuit diagram showing a first embodiment of a data holding device. A data holding device 100 of this embodiment includes N-channel metal oxide semiconductor (MOS) field-effect transistors N11 to N17, P-channel MOS field-effect transistors P11 to P14, and inverters INV11 and INV12.

The sources of the transistors P11 to P14 are connected to a power supply terminal (i.e. a node set to a power supply potential VDD). The drains of the transistors P11, P13, and N11 and the gates of the transistors P12 and N12 are connected to the input terminal of the inverter INV11. The drains of the transistors P12, P14, and N12 and the gates of the transistors P11 and N11 are connected to the input terminal of the inverter INV12. The gate of the transistor P13 is supplied with a signal W1NA. The gate of the transistor P14 is supplied with a signal W0NA. The output terminal of the inverter INV11 is connected to the output terminal of an inverted output signal QN. The output terminal of the inverter INV12 is connected to the output terminal of an output signal Q.

The source of the transistor N11 is connected to the drains of the transistors N13 and N16. The source of the transistor N12 is connected to the drains of the transistors N14 and N17. The sources of the transistors N13 and N14 are connected to the drain of the transistor N15. The sources of the transistors N15 to N17 are connected to a ground terminal (i.e. a node set to a ground potential VSS). The gate of the transistor N13 is supplied with an input signal INN (negative). The gate of the transistor N14 is supplied with an input signal INP (positive). The gate of the transistor N15 is supplied with a signal SAE. The gate of the transistor N16 is supplied with a signal W1NB. The gate of the transistor N17 is supplied with a signal W0NB.

In the data holding device 100 having the structure described above, the transistors P11 and N11 constitute a complementary MOS (CMOS) inverter 101a, and the transistors P12 and N12 constitute a CMOS inverter 101b.

Note that the output node of the CMOS inverter 101a (i.e. the drains of the transistors P11 and N11 is connected to the input node of the CMOS inverter 101b (i.e. the gates of the transistors P12 and N12). In addition, the output node of the CMOS inverter 101b (i.e. the drains of the transistors P12 and N12) is connected to the input node of the CMOS inverter 101a (i.e. the gates of the transistors P11 and N11).

In other words, the four transistors (P11, P12, N11, and N12) described above function as an inverter loop 101 including two CMOS inverters 101a and 101b connected in a loop. Note that not only inverters in a narrow sense but also inverters in a broad sense (NAND and NOR) may be used as logic gates constituting the inverter loop 101.

In addition, the data holding device 100 having the structure described above, the transistors N13 and N14 function as a differential pair circuit 102 connected to ground nodes of the CMOS inverters 101a and 101b (i.e. the sources of the transistors N11 and N12).

The transistors P13 and P14 function as a first potential setter 103 (so-called charge-up circuit), which sets the output nodes of the CMOS inverters 101a and 101b to a first potential (i.e. the power supply potential VDD or a high potential equivalent to the same).

The transistors N16 and N17 function as a second potential setter 104, which sets the ground nodes of the CMOS inverters 101a and 101b to a second potential (i.e. the ground potential VSS or a low potential equivalent to the same).

In this way, the data holding device 100 of this embodiment has a structure based on a general sense amplifier, to which the second potential setter 104 is added so as to realize a latch function using the inverter loop 101. The operation thereof is described below in detail.

<Description of Operation>

Figure 2:
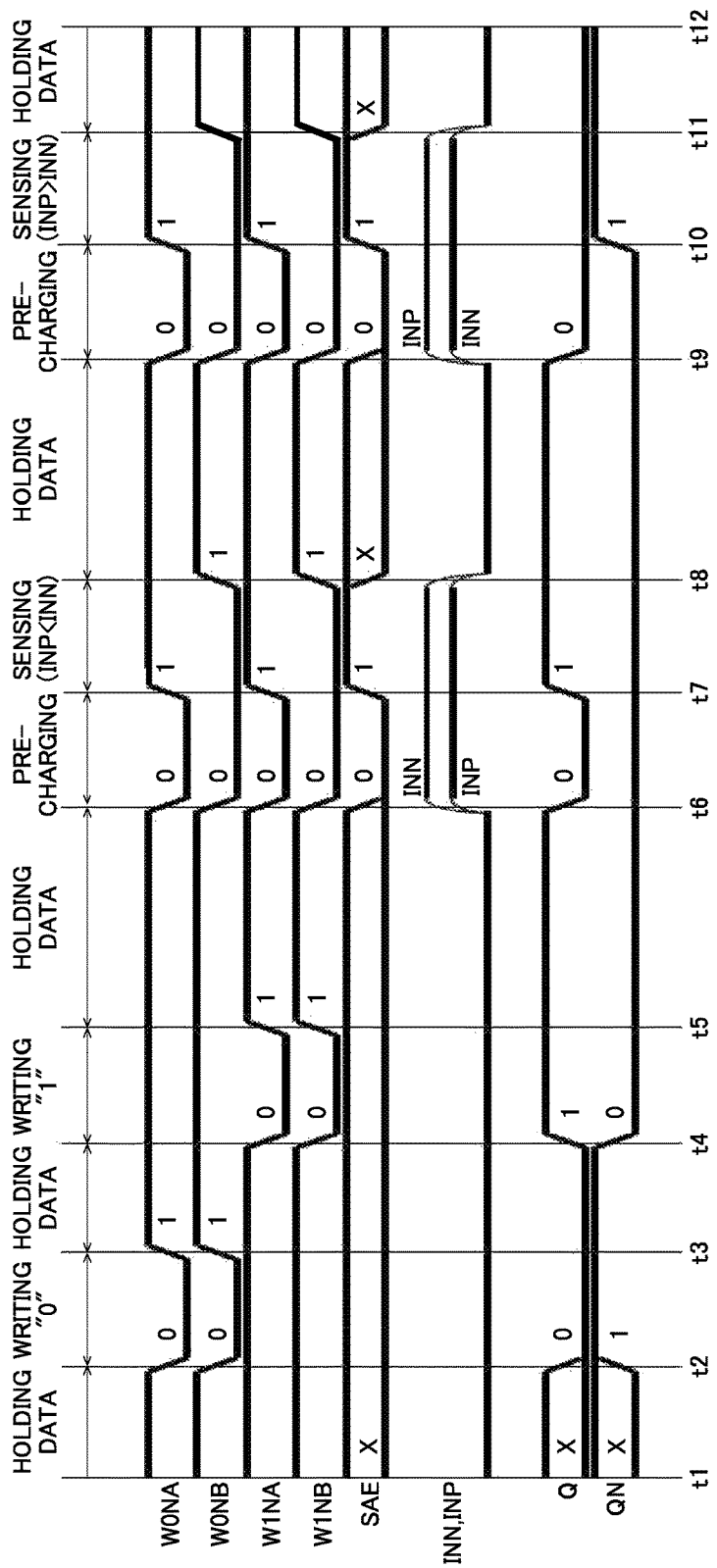
FIG. 2 is a timing chart showing an operation example of the data holding device.

FIG. 2 is a timing chart illustrating an operation example of the data holding device 100, in which the signals W0NA and W0NB, the signals W1NA and W1NB, the signal SAE, the input signals INN and INP, the output signal Q, and the inverted output signal QN are shown in order from top to bottom.

First, an operation state of the data holding device 100 when holding data is described. As shown in time t1 to time t2, time t3 to time t4, time t5 to time t6, time t8 to time t9, or time t11 to time t12 in FIG. 2, when holding data using the inverter loop 101, the signals W0NA and W0NB, and the signals W1NA and W1NB are all set to high level, while the input signals INN and INP are both set to low level. Note that a logic level of the signal SAE does not matter.

Figure 3:
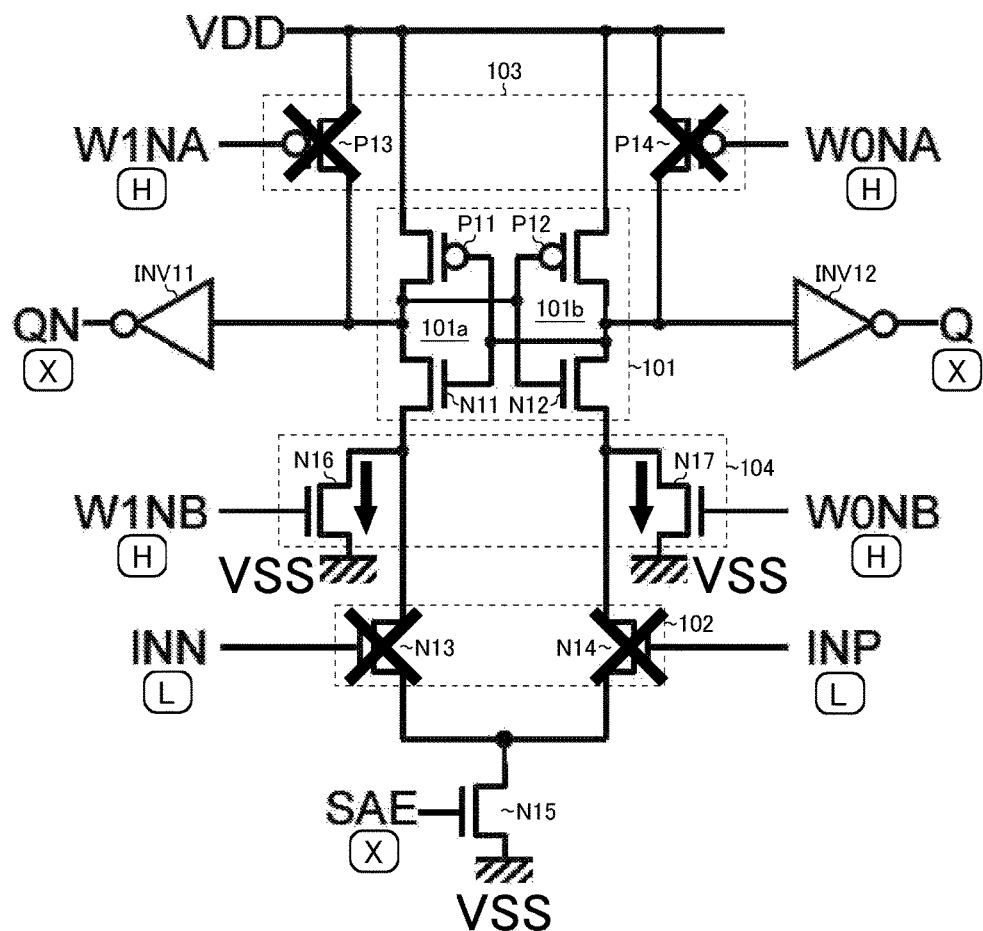
FIG. 3 is a circuit diagram showing a state of the data holding device when holding data.

With the control described above, as shown in FIG. 3, the transistors N13 and N14, and the transistors P13 and P14 are all turned off, and the transistors N16 and N17 are both turned on. In other words, the differential pair circuit 102 and the first potential setter 103 are both disabled, and the second potential setter 104 sets the ground nodes of the CMOS inverters 101a and 101b to the second potential (e.g. the ground potential VSS).

Therefore the data holding device 100 is equivalent to the inverter loop 101 as a single unit, and it holds the data stored in the inverter loop 101. For example, when data "0" is written to the inverter loop 101, the output signal Q is held at low level, and the inverted output signal QN is held at high level (see time t3 to time t4 or time t11 to time t12). On the contrary, when data "1" is written to the inverter loop 101, the output signal Q is held at high level, and the inverted output signal QN is held at low level (see time t5 to time t6 or time t8 to time t9).

Next, an operation state of the data holding device 100 when writing "0" is described. As shown in time t2 to time t3 in FIG. 2, when writing data "0" to the inverter loop 101, the signals W1NA and W1NB are both set to high level, while the signals W0NA and W0NB, and the input signals INN and INP are all set to low level. Note that a logic level of the signal SAE does not matter.

Figure 4:
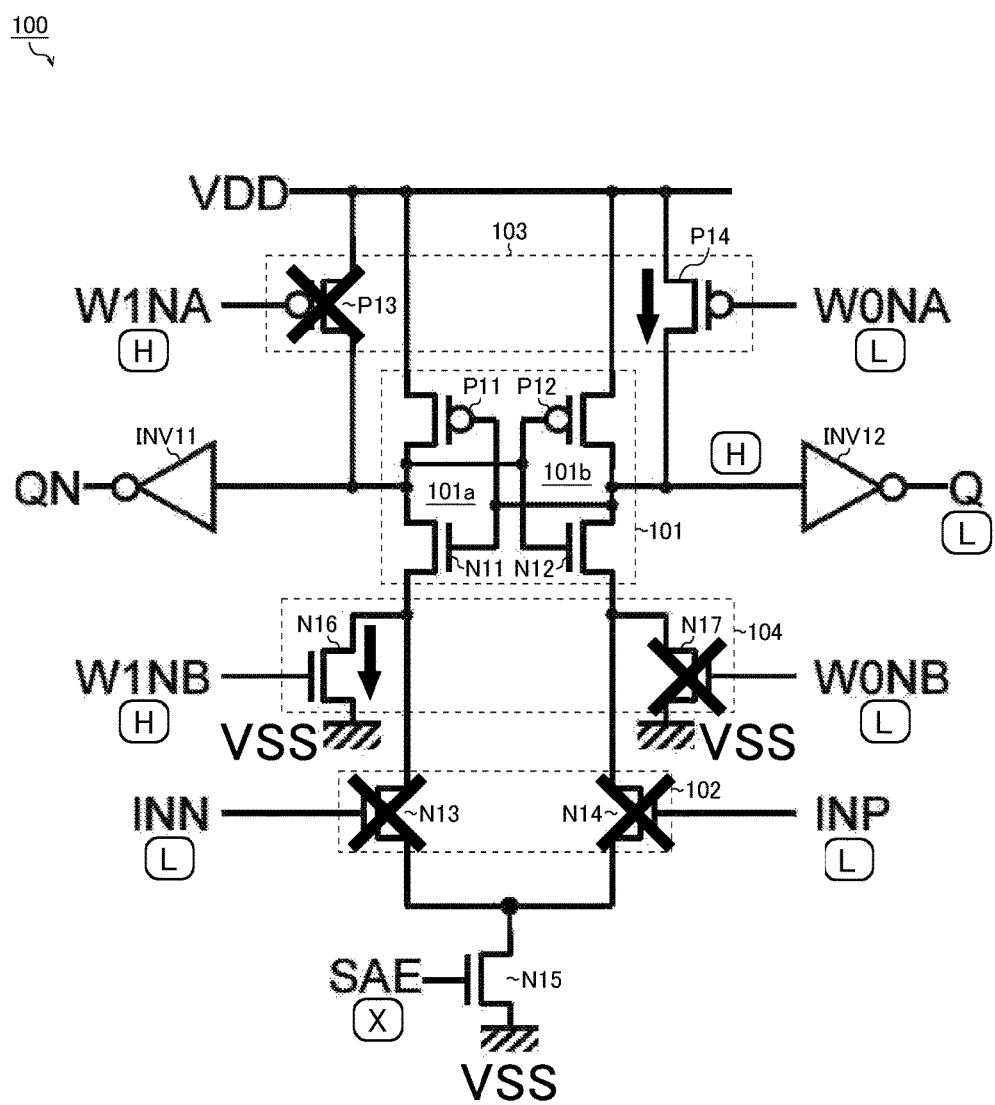
FIG. 4 is a circuit diagram showing a state of the data holding device when writing "0".

With the control described above, as shown in FIG. 4, the transistors N13 and N14, the transistor P13, and the transistor N17 are all turned off, while the transistors P14 and N16 are both turned on. In other words, the differential pair circuit 102 is disabled, and the first potential setter 103 sets the output node of the CMOS inverter 101b to the first potential (e.g. the power supply potential VDD), while the second potential setter 104 sets the ground node of the CMOS inverter 101a to the second potential (e.g. the ground potential VSS).

Therefore the output node of the CMOS inverter 101b is forced to increase to high level, and hence the output signal Q is decreased to low level, while the inverted output signal QN is increased to high level. This state corresponds to a state where the data "0" written to the inverter loop 101 is output without processing.

Next, an operation state of the data holding device 100 when writing "1" is described. As shown in time t4 to time t5 in FIG. 2, when writing data "1" to the inverter loop 101, the signals W0NA and W0NB are both set to high level, while the signals W1NA and W1NB, and the input signals INN and INP are all set to low level. Note that a logic level of the signal SAE does not matter.

Figure 5:
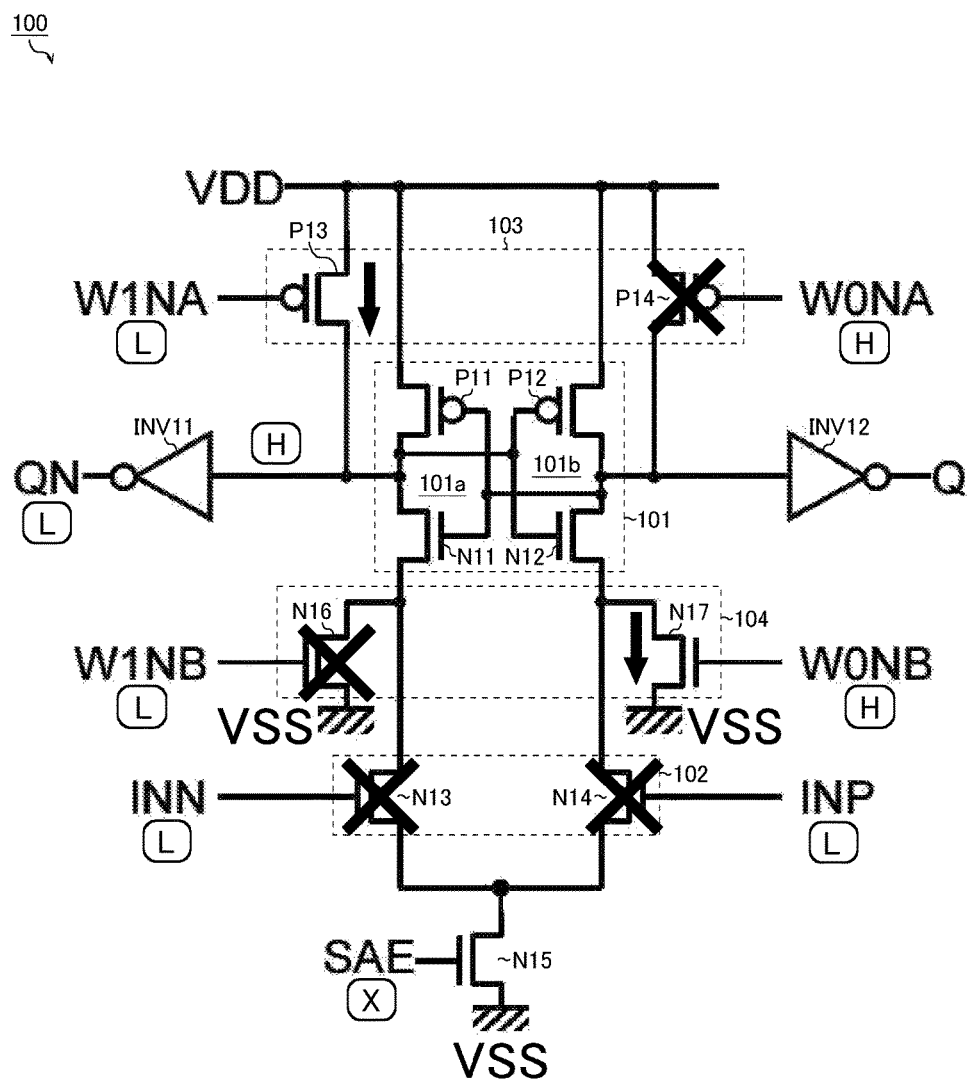
FIG. 5 is a circuit diagram showing a state of the data holding device when writing "1".

With the control described above, as shown in FIG. 5, the transistors N13 and N14, the transistor P14, and the transistor N16 are all turned off, while the transistors P13 and N17 are both turned on. In other words, the differential pair circuit 102 is disabled, and the first potential setter 103 sets the output node of the CMOS inverter 101a to the first potential (e.g. the power supply potential VDD), while the second potential setter 104 sets the ground node of the CMOS inverter 101b to the second potential (e.g. the ground potential VSS).

Therefore the output node of the CMOS inverter 101a is forced to increase to high level, and hence the inverted output signal QN is decreased to low level, while the output signal Q is increased to high level. This state corresponds to a state where data "1" written to the inverter loop 101 is output without processing.

Next, an operation state of the data holding device 100 when precharging is described. As shown in time t6 to time t7 or time t9 to time t10 in FIG. 2, when precharging parasitic capacitances at the output nodes of the CMOS inverters 101a and 101b prior to sensing operation of the input signals INN and INP, the signals W0NA and W0NB, the signals W1NA and W1NB, and the signal SAE are all set to low level. Note that it is preferred to input the input signals INN and INP to be sensed to the differential pair circuit 102 when this precharging operation is started.

With the control described above, as shown in FIG. 6, the transistors N15 to N17 are all turned off, and the transistors P13 and P14 are both turned on. In other words, the differential pair circuit 102 and the second potential setter 104 are both disabled, and the first potential setter 103 sets the output nodes of the CMOS inverters 101a and 101b to the first potential (e.g. the power supply potential VDD).

Therefore the output nodes of the CMOS inverters 101a and 101b are forced to increase to high level, and hence parasitic capacitances accompanying them are precharged. In this case, both the output signal Q and the inverted output signal QN become low level.

Next, an operation state of the data holding device 100 when sensing is described. As shown in time t7 to time t8 or time t10 to time t1 in FIG. 2, when sensing the input signals INN and INP to the differential pair circuit 102, the signals W0NA and W1NA and the signal SAE are all set to high level, while the signals W0NB and W1NB are both set to low level.

With the control described above, as shown in FIG. 7, the transistors N16 and N17, and the transistors P13 and P14 are all turned off, while the transistor N15 is turned on. In other words, the differential pair circuit 102 is enabled, while the first potential setter 103 and the second potential setter 104 are both disabled.

Therefore currents corresponding to the input signals INN and INP flow in the transistors N13 and N14, respectively, and hence a potential difference is generated between the output nodes of the CMOS inverters 101a and 101b. The inverter loop 101 amplifies this potential difference so as to determine logic levels of the output signal Q and the inverted output signal QN.

Figure 7:
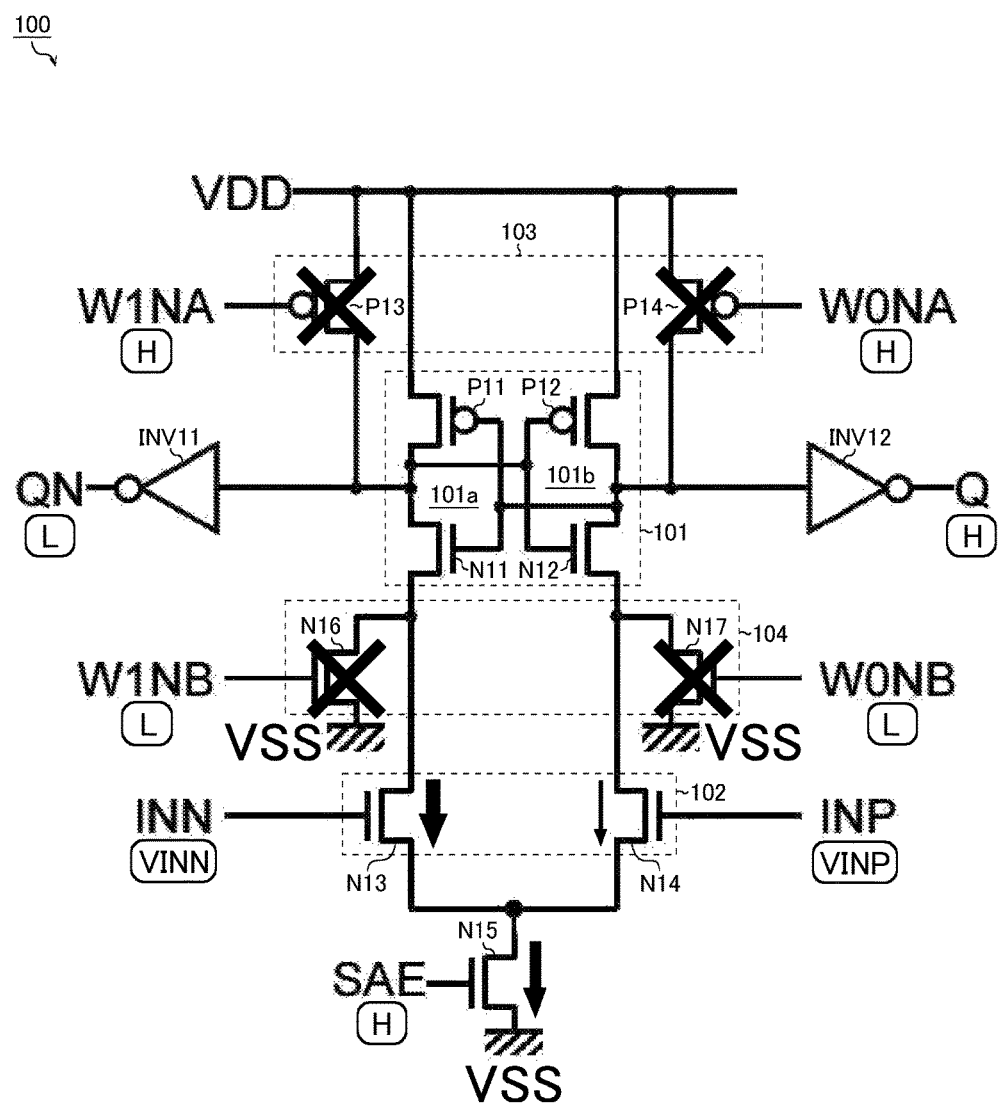
FIG. 7 is a circuit diagram showing a state of the data holding device when sensing.

For example, as shown in time t7 to time t8 in FIG. 2, when INP<INN is satisfied, as shown in FIG. 7, current flowing in the transistor N14 becomes larger than current flowing in the transistor N13, and hence the output node of the CMOS inverter 101b has a lower potential than the output node of the CMOS inverter 101a. When this potential difference occurs, due to the amplifying action of the inverter loop 101, the output node of the CMOS inverter 101a having a relatively high potential is increased to high level, while the output node of the CMOS inverter 101b having a relatively low potential is decreased to low level. As a result, the output signal Q becomes high level, while the inverted output signal QN becomes low level.

On the other hand, as shown in time t10 to time t11 in FIG. 2, when INP>INN is satisfied, a magnitude relationship between currents flowing in the transistors N13 and N14 in FIG. 7 becomes opposite, and logic levels of the output signal Q and the inverted output signal QN become opposite. More specifically, the current flowing in the transistor N14 becomes smaller than the current flowing in the transistor N13, and hence the output node of the CMOS inverter 101b has a higher potential than the output node of the CMOS inverter 101a. Therefore, due to the amplifying action of the inverter loop 101, the output node of the CMOS inverter 101a having a relatively low potential is decreased to low level, while the output node of the CMOS inverter 101b having a relatively high potential is increased to high level. As a result, the output signal Q becomes low level, while the inverted output signal QN becomes high level.

Figure 6:
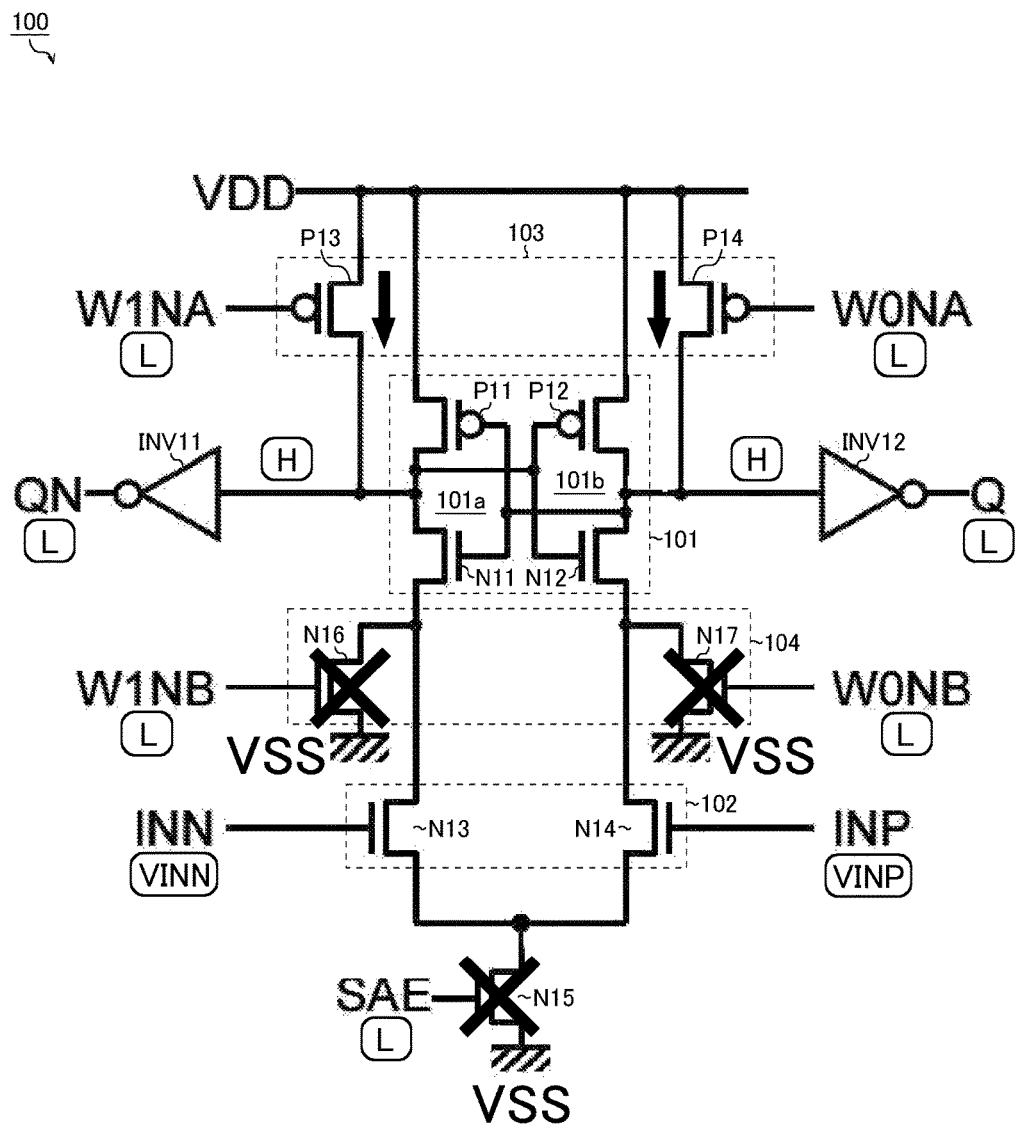
FIG. 6 is a circuit diagram showing a state of the data holding device when precharging.

In this way, the data holding device 100 of this embodiment utilizes the single inverter loop 101 and can achieve both the latch function (see time t1 to time t6, time t8 to time t9, and time t11 to time t12 in FIG. 2, and FIGS. 3 to 5) and the sensing function (see time t6 to time t8, and time t9 to time t10 in FIG. 2, and FIGS. 6 and 7).

Figure 22:
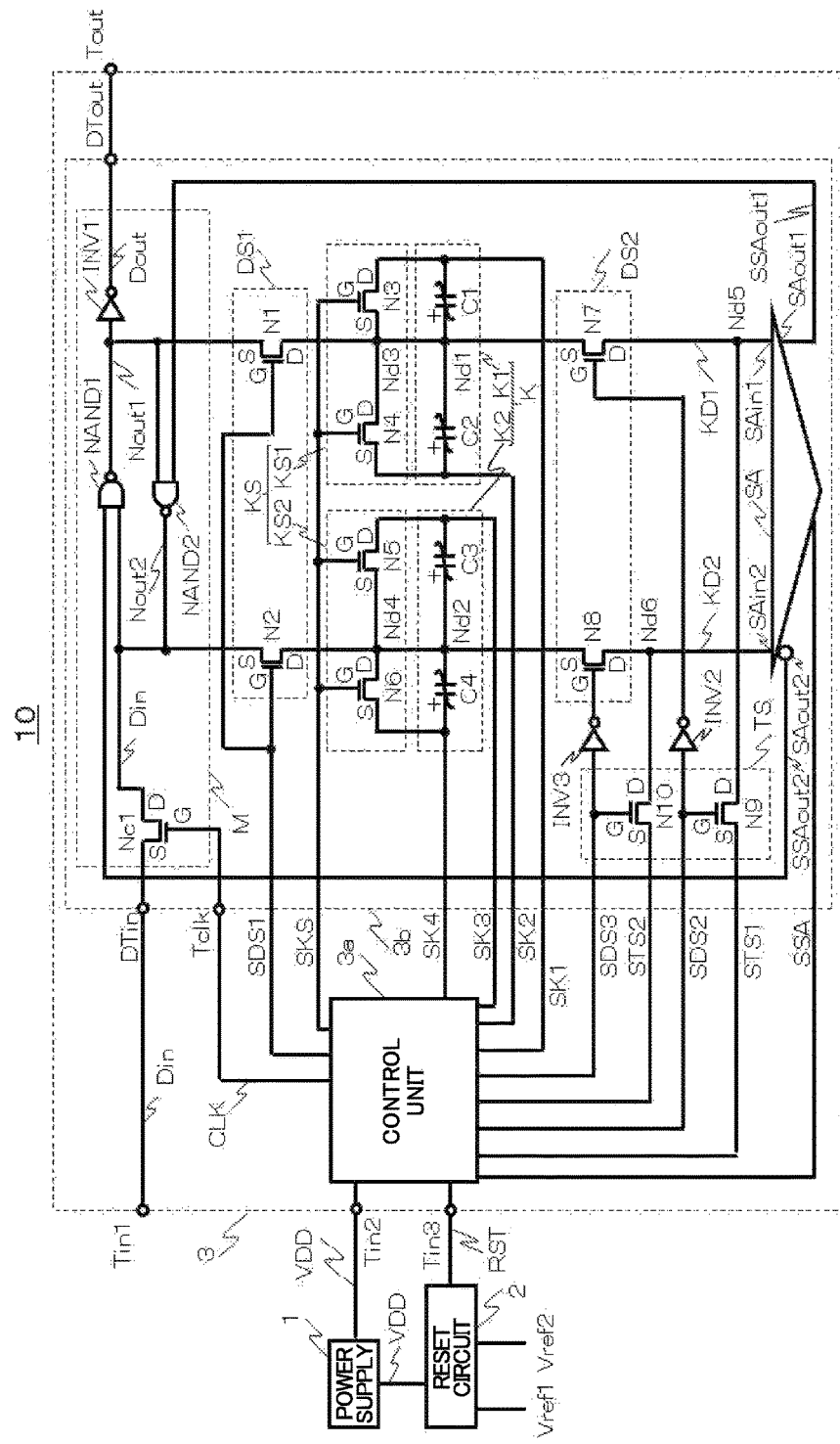
FIG. 22 is a circuit diagram showing a conventional example of the data holding device.

Therefore, for example, by using the data holding device 100 of this embodiment as the sense amplifier SA of FIG. 22, the data holding portion M becomes unnecessary, and thus it is possible to cancel duplication of the inverter loop so that a circuit area can be reduced (by approximately half).

<Data Holding Device (Second Embodiment)>

Figure 8:
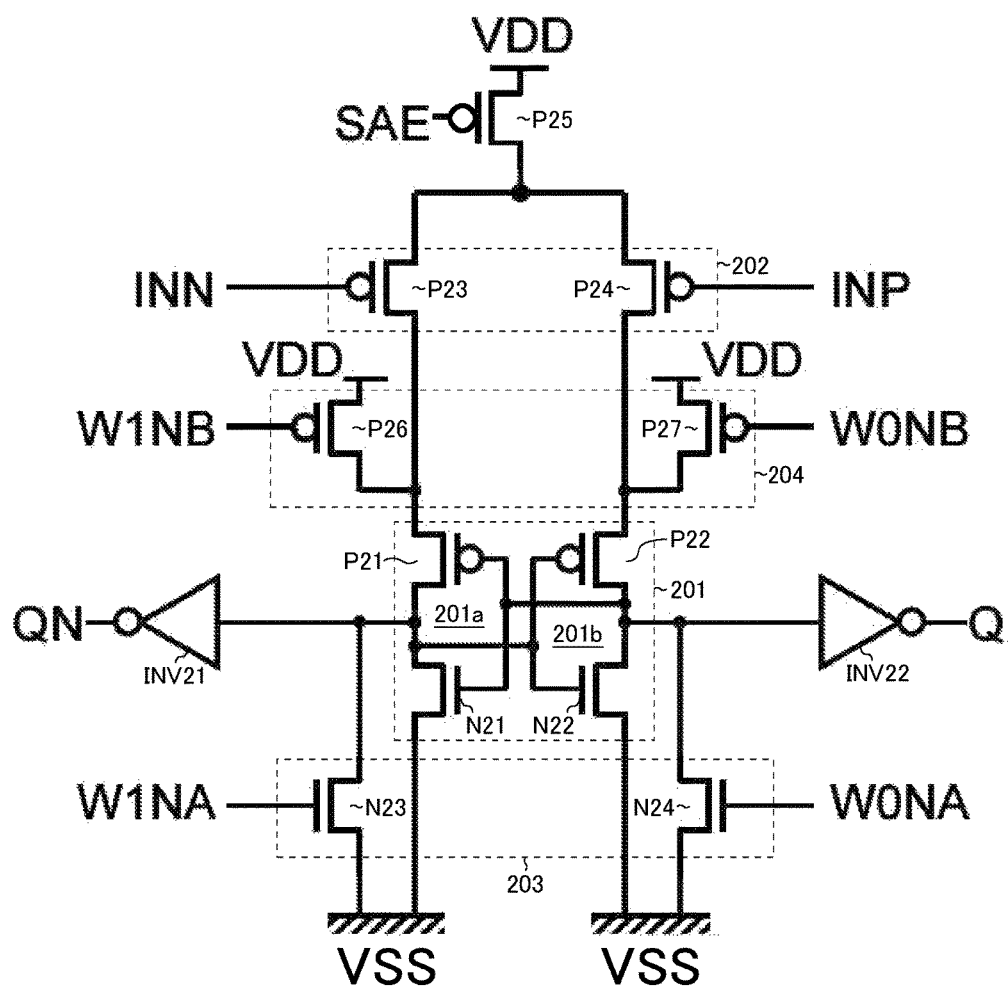
FIG. 8 is a circuit diagram showing a second embodiment of the data holding device.

FIG. 8 is a circuit diagram showing a second embodiment of a data holding device. A data holding device 200 of this embodiment includes N-channel MOS field-effect transistors N21 to N24, P-channel MOS field-effect transistors P21 to P27, and inverters INV21 and INV22.

The sources of the transistors N21 to N24 are connected to the ground terminal (i.e. the node set to the ground potential VSS). The drains of the transistors N21, N23, and P21 and the gates of the transistors N22 and P22 are connected to the input terminal of the inverter INV21. The drains of the transistors N22, N24, and P22 and the gates of the transistors N21 and P21 are connected to the input terminal of the inverter INV22. The gate of the transistor N23 is supplied with the signal W1NA. The gate of the transistor N24 is supplied with the signal W0NA. The output terminal of the inverter INV21 is connected to the output terminal of the inverted output signal QN. The output terminal of the inverter INV22 is connected to the output terminal of the output signal Q.

The source of the transistor P21 is connected to the drains of the transistors P23 and P26. The source of the transistor P22 is connected to the drains of the transistors P24 and P27. The sources of the transistors P23 and P24 are connected to the drain of the transistor P25. The sources of the transistors P25 to P27 are connected to the power supply terminal (i.e. the node set to the power supply potential VDD). The gate of the transistor P23 is supplied with the input signal INN (negative). The gate of the transistor P24 is supplied with the input signal INP (positive). The gate of the transistor P25 is supplied with the signal SAE. The gate of the transistor P26 is supplied with the signal W1NB. The gate of the transistor P27 is supplied with the signal W0NB.

In the data holding device 200 having the structure described above, the transistors P21 and N21 constitute a CMOS inverter 201a, while the transistors P22 and N22 constitute a CMOS inverter 201b.

Note that the output node of the CMOS inverter 201a (i.e. the drains of both the transistors P21 and N21) is connected to the input node of the CMOS inverter 201b (i.e. the gates of both the transistors P22 and N22). In addition, the output node of the CMOS inverter 201b (i.e. the drains of both the transistors P22 and N22) is connected to the input node of the CMOS inverter 201a (i.e. the gates of both the transistors P21 and N21).

In other words, the four transistors described above (P21, P22, N21, and N22) function as an inverter loop 201 including the two CMOS inverters 201a and 201b connected in a loop. Note that not only inverters in a narrow sense but also inverters in a broad sense (NAND and NOR) may be used as logic gates constituting the inverter loop 201.

In addition, in the data holding device 200 having the structure described above, the transistors P23 and P24 function as a differential pair circuit 202 connected to the power supply nodes of the CMOS inverters 201a and 201b (i.e. the sources of the transistors P21 and P22).

The transistors N23 and N24 function as a first potential setter 203, which sets the output nodes of the CMOS inverters 201a and 201b to a first potential (i.e. the ground potential VSS or a low potential equivalent to the same).

The transistors P26 and P27 function as a second potential setter 204, which sets the power supply nodes of the CMOS inverters 201a and 201b to a second potential (i.e. the power supply potential VDD or a high potential equivalent to the same).

In this way, the data holding device 200 of this embodiment has a structure in which the polarities in the data holding device 100 of the first embodiment (FIG. 1) are inverted (the NMOS differential pair type to the PMOS differential pair type, NMOS to PMOS, and VDD to VSS), and is capable of achieving both the latch function and the sensing function by using the single inverter loop 201, in the same manner as described above.

Note that in order to understand the operation of the data holding device 200, in the above description of the operation of the data holding device 100, it is sufficient to replace the numerals (101 to 104 with 201 to 204, N11 to N12 with N21 to N22, N13 to N17 with P23 to P27, P11 to P12 with P21 to P22, P13 to P14 with N23 to N24), to invert logic levels of various control signals (W0NA, W0NB. W1NA, W1NB, and SAE), and to invert amplitude of the input signals (INN and INP), and hence overlapping description of operation is omitted.

<Nonvolatile Latch (First Structural Example)>

Figure 9:
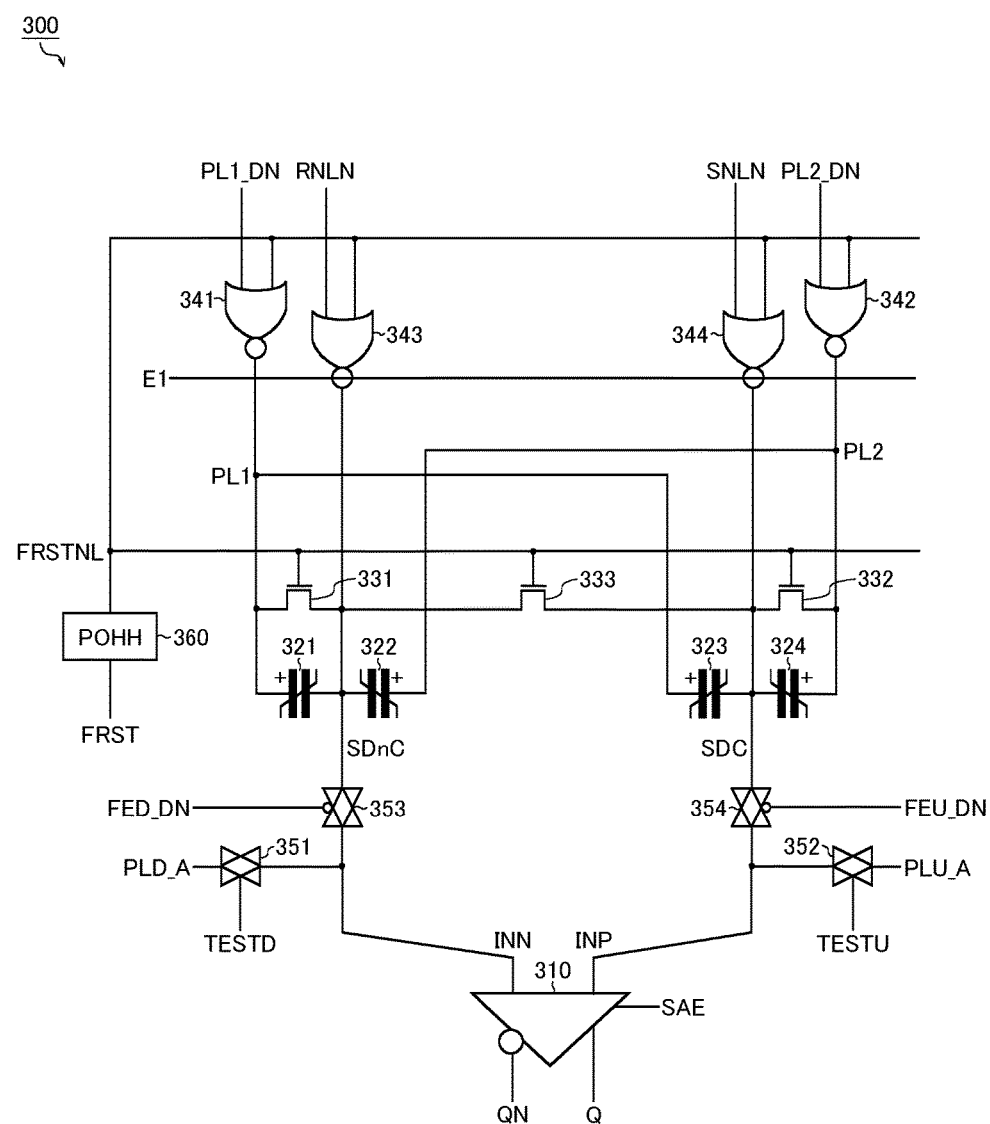
FIG. 9 is a circuit diagram showing an overall structure (a first structural example) of a nonvolatile latch.

Next, an example of an application to a nonvolatile latch is described. FIG. 9 is a circuit diagram showing an overall structure of a nonvolatile latch. A nonvolatile latch 300 of this structural example includes a sense amplifier 310, ferroelectric capacitors 321 to 324, N-channel MOS field-effect transistors 331 to 333, NOR arithmetic units 341 to 344, analog switches 351 to 354, and a power-on high hold circuit 360 (hereinafter referred to as POHH circuit 360).

A first input terminal of the NOR arithmetic unit 341 is supplied with a signal PL1_DN. A first input terminal of the NOR arithmetic unit 342 is supplied with a signal PL2_DN. A first input terminal of the NOR arithmetic unit 343 is supplied with a signal RNLN. A first input terminal of the NOR arithmetic unit 344 is supplied with a signal SNLN. Second input terminals of the NOR arithmetic unit 341 to 344 are all supplied with a signal FRSTNL. Note that the NOR arithmetic units 343 and 344 are a 3-state output type (H/L/output HiZ), and each control terminal thereof is supplied with a signal E1.

The output terminal of the NOR arithmetic unit 341 (i.e. corresponding to the output terminal of the signal PL1) is connected to positive terminals of the ferroelectric capacitors 321 and 323. The output terminal of the NOR arithmetic unit 342 (i.e. corresponding to the output terminal of the signal PL2) is connected to positive terminals of the ferroelectric capacitors 322 and 324. The output terminal of the NOR arithmetic unit 343 (i.e. corresponding to the output terminal of a signal SDnC) is connected to negative terminals of the ferroelectric capacitors 321 and 322. The output terminal of the NOR arithmetic unit 344 (i.e. corresponding to the output terminal of a signal SDC) is connected to negative terminals of the ferroelectric capacitors 323 and 324.

The transistor 331 is connected in parallel to the ferroelectric capacitor 321. The transistor 332 is connected in parallel to the ferroelectric capacitor 324. The transistor 333 is connected between the output terminal of the signal SDnC and the output terminal of the signal SDC. The gates of the transistors 331 to 333 are supplied with the signal FRSTNL.

The analog switch 351 is connected between an application terminal of a signal PLD_A and a negative input terminal of the sense amplifier 310 (i.e. corresponding to an input terminal of the input signal INN), and it is turned on and off according to a signal TESTD input to the control terminal thereof. The analog switch 352 is connected between an application terminal of a signal PLU_A and a positive input terminal of the sense amplifier 310 (i.e. corresponding to an input terminal of the input signal INP), and it is turned on and off according to a signal TESTU input to the control terminal thereof.

The analog switch 353 is connected between an application terminal of the signal SDnC and the negative input terminal of the sense amplifier 310, and it is turned on and off according to a signal FED_DN inversely input to the control terminal thereof. The analog switch 354 is connected between an application terminal of the signal SDC and the positive input terminal of the sense amplifier 310, and it is turned on and off according to a signal FEU_DN inversely input to the control terminal thereof.

The POHH circuit 360 holds the signal FRSTNL at high level until the power supply potential VDD reaches at least a voltage that enables the CMOS circuit to operate, even if the signal FRST becomes high level (VDD) when the power supply is turned on. Note that after the power supply is turned on, the POHH circuit 360 operates as a normal inverter.

The sense amplifier 310 has a sensing function of receiving a differential input of the input signals INP and INN so as to generate the output signal Q and the inverted output signal QN, as well as a latch function of receiving input of a data signal D so as to hold the same. In other words, functions of both the data holding portion M and the sense amplifier SA of FIG. 22 are integrated in the sense amplifier 310. A circuit structure thereof is described below.

<Sense Amplifier>

Figure 10:
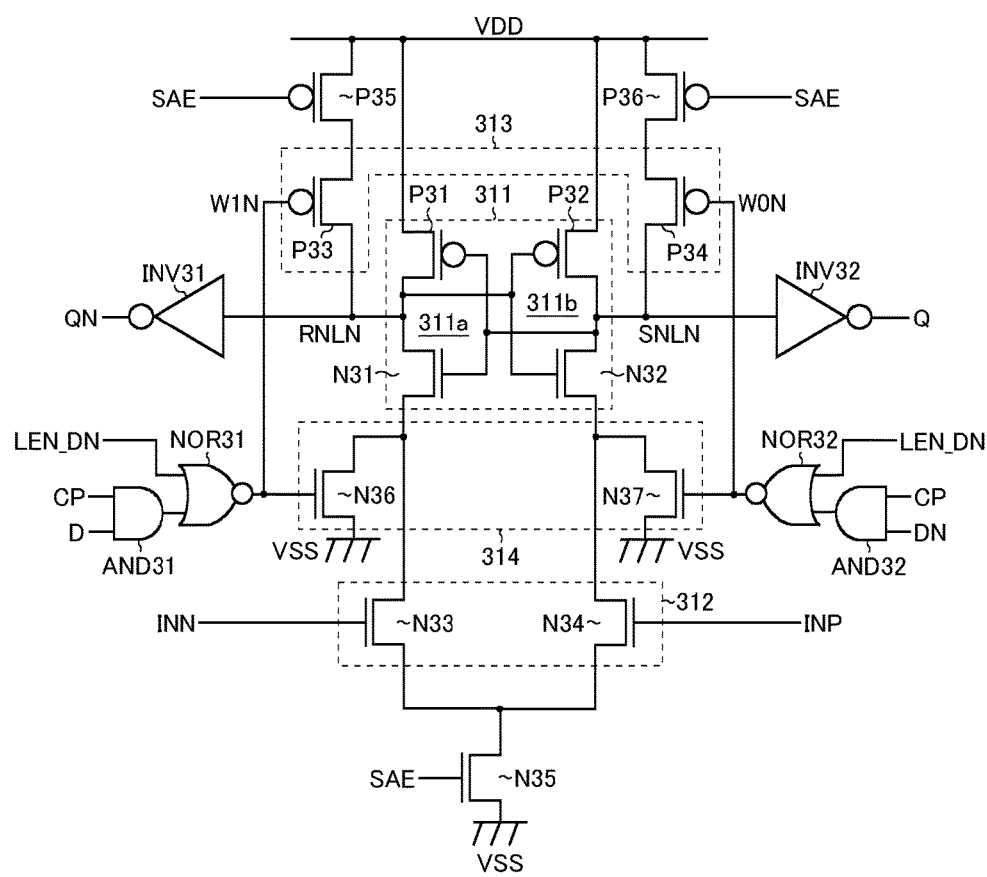
FIG. 10 is a circuit diagram showing a structural example of the sense amplifier (a third embodiment of the data holding device).

FIG. 10 is a circuit diagram showing a structural example of the sense amplifier 310 (corresponding to a third embodiment of the data holding device). The sense amplifier 310 of this structural example has basically the same circuit structure as the data holding device 100 of FIG. 1, which includes N-channel MOS field-effect transistors N31 to N37, P-channel MOS field-effect transistors P31 to P36, inverters INV31 and INV32, AND arithmetic units AND31 and AND32, and NOR arithmetic units NOR31 and NOR32.

The sources of the transistors P31 and P32 are connected to the power supply terminal (i.e. the node set to the power supply potential VDD). The drains of the transistors P31, P33, and N31 and the gates of the transistors P32 and N32 are connected to the input terminal of the inverter INV31 (i.e. an application terminal of the signal RNLN). The drains of the transistors P32, P34, and N32 and the gates of the transistors P31 and N31 are connected to the input terminal of the inverter INV32 (i.e. an application terminal of the signal SNLN). The sources of the transistors P33 and P34 are connected to the drains of the transistors P35 and P36. The sources of the transistors P35 and P36 are connected to the power supply terminal. The gate of the transistor P33 is supplied with a signal W1N. The gate of the transistor P34 is supplied with a signal W0N. The gates of the transistors P35 and P36 are supplied with the signal SAE. The output terminal of the inverter INV31 is connected to the output terminal of the inverted output signal QN. The output terminal of the inverter INV32 is connected to the output terminal of the output signal Q.

The source of the transistor N31 is connected to the drains of the transistors N33 and N36. The source of the transistor N32 is connected to the drains of the transistors N34 and N37. The sources of the transistors N33 and N34 are connected to the drain of the transistor N35. The sources of the transistors N35 to N37 are connected to the ground terminal (i.e. the node set to the ground potential VSS). The gate of the transistor N33 is supplied with the input signal INN (negative). The gate of the transistor N34 is supplied with the input signal INP (positive). The gate of the transistor N35 is supplied with the signal SAE. The gate of the transistor N36 is supplied with the control signal W1N. The gate of the transistor N37 is supplied with the signal W0N.

First input terminals of the AND arithmetic units AND31 and AND32 are supplied with a clock signal CP. Note that when the latch function of the sense amplifier 310 is enabled (LEN_DN=L), the inverter loop 311 operates as a high-through and low-hold type latch corresponding to the clock signal CP (details will be described later). A second input terminal of the AND arithmetic unit AND31 is supplied with the data signal D. A second input terminal of the AND arithmetic unit AND32 is supplied with an inverted data signal DN (i.e. a logically inverted signal of the data signal D).

First input terminals of the NOR arithmetic units NOR31 and NOR32 are supplied with the signal LEN_DN. Note that the signal LEN_DN becomes low level when enabling the latch function as a function of the sense amplifier 310, while it becomes high level when enabling the sensing function (details will be described later). A second input terminal of the NOR arithmetic unit NOR31 is supplied with an output signal of the AND arithmetic unit AND31. A second input terminal of the NOR arithmetic unit NOR32 is supplied with an output signal of the AND arithmetic unit AND32. Note that an output signal of the NOR arithmetic unit NOR31 corresponds to the signal W1N. On the other hand, an output signal of the NOR arithmetic unit NOR32 corresponds to the signal W0N.

In the sense amplifier 310 having the structure described above, the transistors P31 and N31 constitute a CMOS inverter 311*a*, while the transistors P32 and N32 constitute a CMOS inverter 311*b*.

Note that an output node of the CMOS inverter 311*a* (i.e. the drains of the transistors P31 and N31) is connected to an input node of the CMOS inverter 311*b* (i.e. the gates of the transistors P32 and N32). In addition, an output node of the CMOS inverter 311*b* (i.e. the drains of the transistors P32 and N32) is connected to an input node of the CMOS inverter 311*a* (i.e. the gates of the transistors P31 and N31).

In other words, the four transistors (P31, P32, N31, and N32) described above function as the inverter loop 311 including two CMOS inverters 311*a* and 311*b* connected in a loop. Note that not only inverters in a narrow sense but also inverters in a broad sense (NAND and NOR) may be used as logic gates constituting the inverter loop 311.

In addition, in the sense amplifier 310 having the structure described above, the transistors N33 and N34 function as a differential pair circuit 312 connected to the ground nodes of the CMOS inverters 311*a* and 311*b* (i.e. the sources of the transistors N31 and N32).

Note that the gate of the transistor N33 corresponds to the negative input terminal of the sense amplifier 310. Therefore, when the analog switch 353 is turned on, the gate of the transistor N33 is connected to the ferroelectric capacitors 321 and 322.

In the same manner, the gate of the transistor N34 corresponds to the positive input terminal of the sense amplifier 310. Therefore, when the analog switch 354 is turned on, the gate of the transistor N34 is connected to the ferroelectric capacitors 323 and 324.

Note that the ferroelectric capacitors 321 to 324 are an example of the nonvolatile device, and any nonvolatile device can be used as long as it has the same function. For example, one of the ferroelectric capacitors 321 and 322 may be eliminated, or one of them may be replaced with a normal capacitor. The same is true for the ferroelectric capacitors 323 and 324.

In other words, as a data reading method, it is possible to use capacitive coupling between a ferroelectric element in an non-inverted state and a ferroelectric element in an inverted state, or to use capacitive coupling between a ferroelectric element and other capacitive element.

In addition, for example, it is possible to eliminate the ferroelectric capacitors 321 and 322 (or the ferroelectric capacitors 323 and 324) and to fix the input signal INP (or INN) to a predetermined reference potential when the sense amplifier 310 performs the sensing operation.

The transistors P33 and P34 function as a first potential setter 313 (so-called charge-up circuit), which sets the output nodes of the CMOS inverters 311a and 311b to the first potential (i.e. the power supply potential VDD or a high potential equivalent to the same).

The transistors N36 and N37 function as a second potential setter 314, which sets the ground nodes of the CMOS inverters 311a and 311b to the second potential (i.e. the ground potential VSS or a low potential equivalent to the same).

In this way, the sense amplifier 310 of this structural example has a structure based on a general sense amplifier, to which the second potential setter 314 is added so as to realize a latch function using the inverter loop 311. The operations of the nonvolatile latch 300 and the sense amplifier 310 used for the same are described below in detail.

<Description of Operation>

Figure 11:
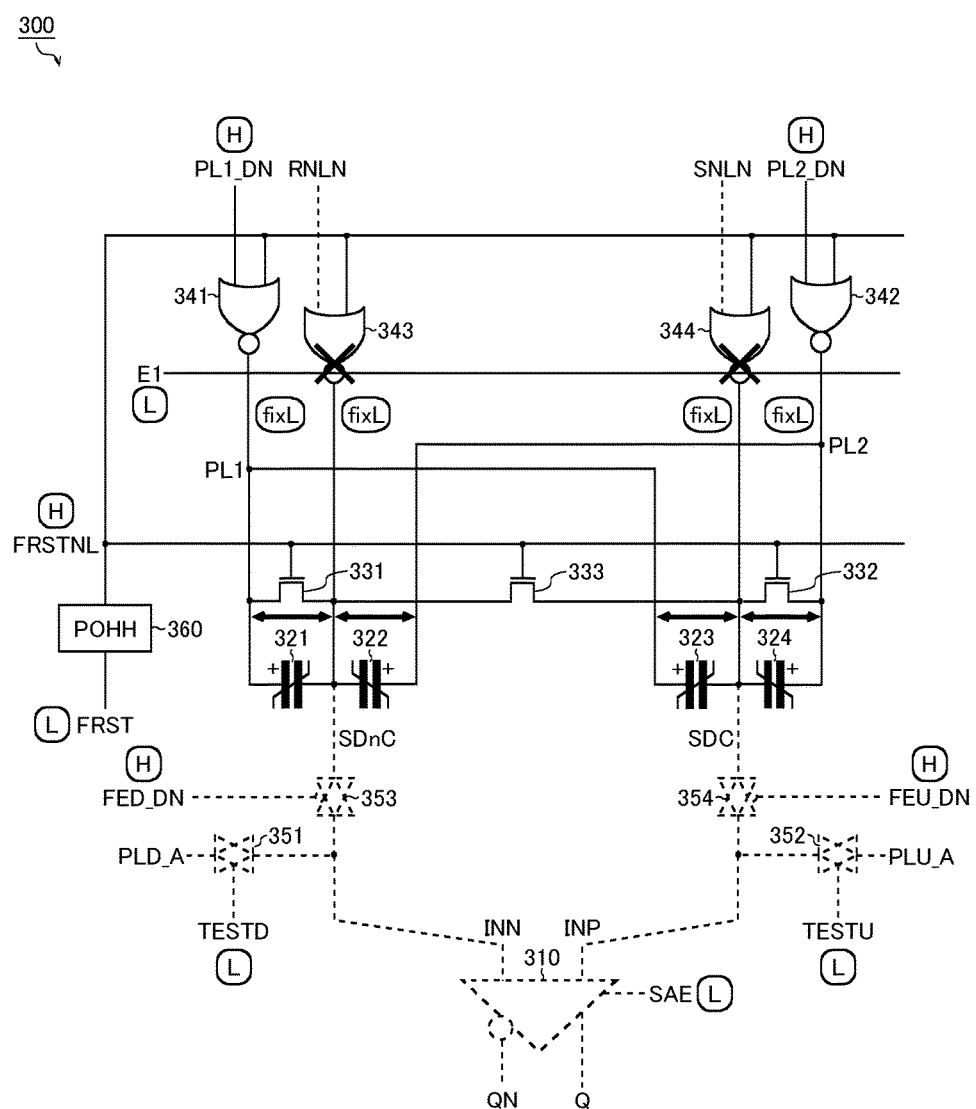
FIG. 11 is a circuit diagram showing a state of the nonvolatile latch when holding data.
Figure 12:
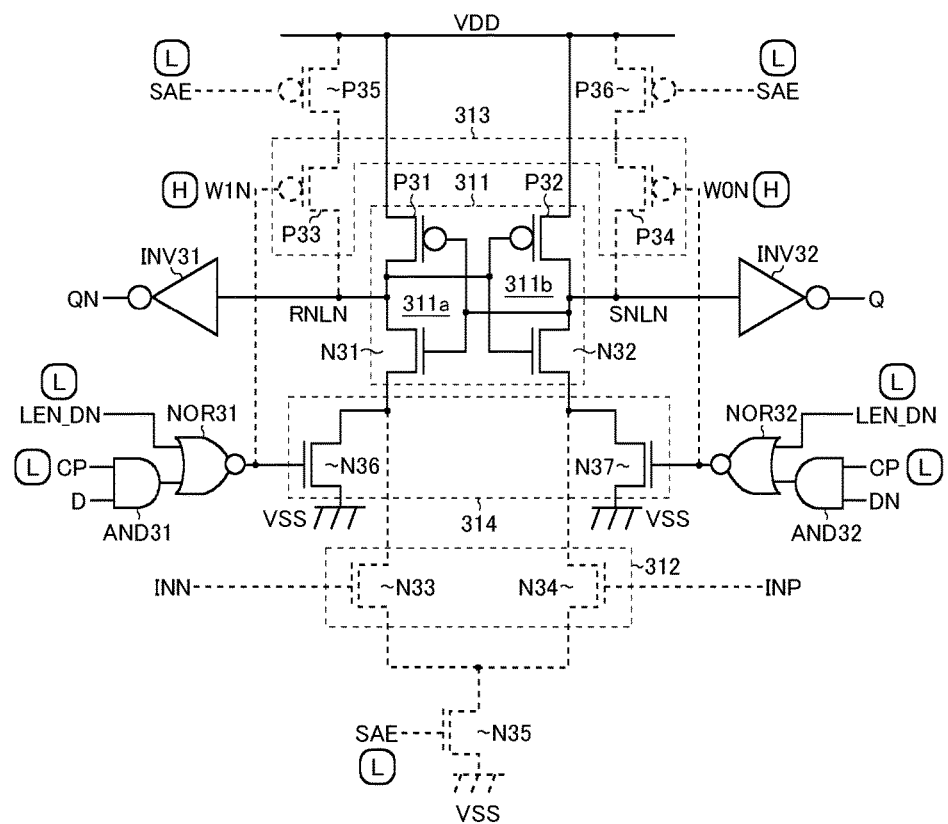
FIG. 12 is a circuit diagram showing a state of the sense amplifier when holding data.

First, an operation state when holding data is described with reference to FIGS. 11 and 12. FIGS. 11 and 12 are circuit diagrams showing operation states of the nonvolatile latch 300 and the sense amplifier 310 when holding data.

When holding data using the inverter loop 311 of the sense amplifier 310, as shown in FIG. 12, both the signal LEN_DN and the clock signal CP become low level, and hence both the signals W1N and W0N become high level. In addition, when holding data, the signal SAE becomes low level.

With the control described above, the transistor N35 and the transistors P33 and P34 are all turned off, while the transistors N36 and N37 and the transistors P35 and P36 are all turned on. In other words, both the differential pair circuit 312 and the first potential setter 313 become disabled, and the second potential setter 314 sets the ground nodes of the CMOS inverters 311a and 311b to the second potential (e.g. the ground potential VSS).

Therefore the sense amplifier 310 becomes equivalent to the inverter loop 311 as a single unit, and hence data written to the inverter loop 311 is held. For example, when data "0" is written to the inverter loop 311, the output signal Q is held at low level, and the inverted output signal QN is held at high level. On the contrary, when data "1" is written to the inverter loop 311, the output signal Q is held at high level, and the inverted output signal QN is held at low level. In this way, the operation state of FIG. 12 is substantially the same as the operation state of FIG. 3 described above.

On the other hand, as for the entire nonvolatile latch 300, when holding data, as shown in FIG. 11, the signal E1 becomes low level, and hence both the NOR arithmetic units 343 and 344 become an output high impedance state (i.e. a state in which potential of each output terminal is floating). In addition, when holding data, the signal FRSTNL becomes high level. Therefore both terminals of each of the ferroelectric capacitors 321 to 324 are short-circuited and fixed to low level (i.e. the ground potential VSS) (PL1=PL2=L, PL1_DN=PL2_DN=H). In this way, it is possible to avoid unintentional voltage application to the ferroelectric capacitors 321 to 324, and hence data corruption can be prevented.

In addition, when holding data, as shown in FIG. 11, both the signals FED_DN and FEU_DN become high level. Therefore both the analog switches 353 and 354 are turned off, and hence the ferroelectric capacitors 321 to 324 are electrically separated from the sense amplifier 310. However, when the input signals INN and INP of the sense amplifier 310 are fixed to low level, it is possible to set the signals FED_DN and FEU_DN to low level so that the analog switches 353 and 354 are turned on.

In addition, the signals TESTD and TESTU become high level when testing characteristics of the sense amplifier 310, while they become low level in other normal operations (when holding data, when writing data, when saving data, and when restoring data). Note that when the signals TESTD and TESTU become high level, the analog switches 351 and 352 are turned on, and hence the signals PLD_A and PLU_A for characteristic test can be input to the sense amplifier 310.

Figure 13:
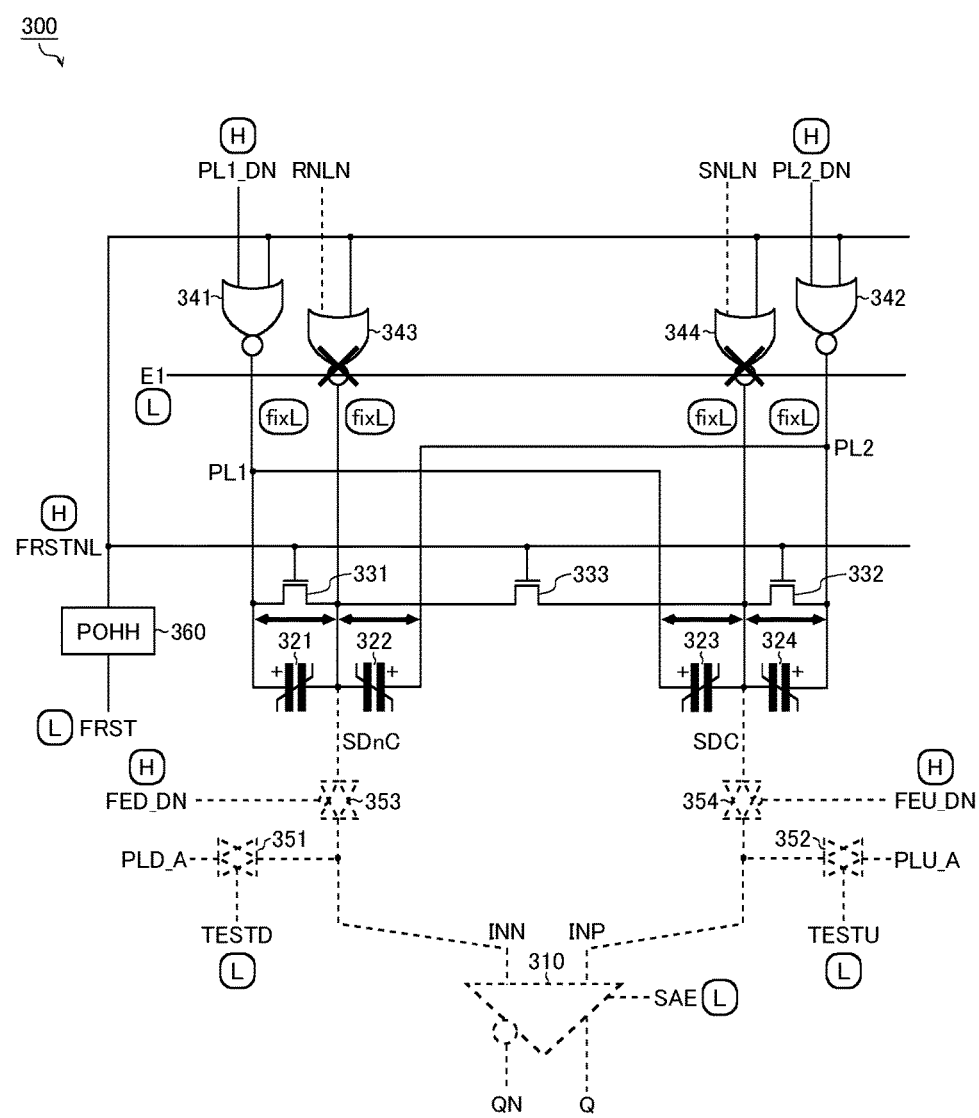
FIG. 13 is a circuit diagram showing a state of the nonvolatile latch when writing "0".
Figure 14:
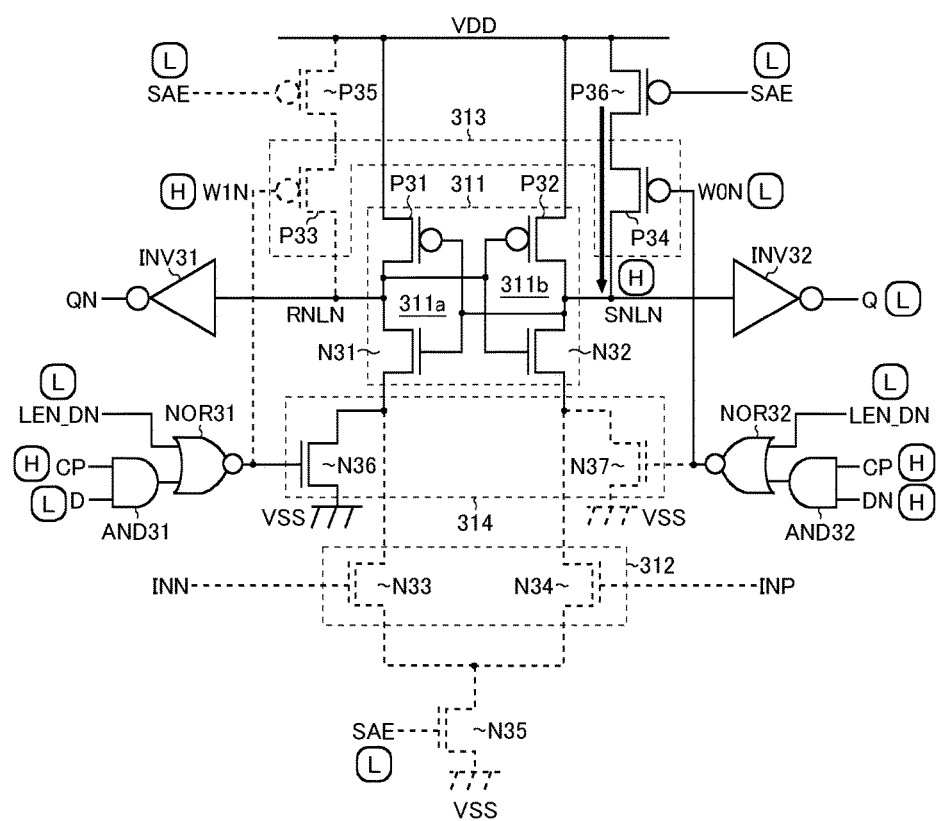
FIG. 14 is a circuit diagram showing a state of the sense amplifier when writing "0".

Next, operation states when writing "0" is described with reference to FIGS. 13 and 14. FIGS. 13 and 14 are circuit diagrams showing operation states of the nonvolatile latch 300 and the sense amplifier 310, respectively, when writing "0".

When writing data "0" to the inverter loop 311 of the sense amplifier 310, as shown in FIG. 14, the signal LEN_DN and the data signal D become low level, and the clock signal CP and the inverted data signal DN become high level. Therefore the signal W1N becomes high level, while the signal W0N becomes low level. In addition, when writing "0", the signal SAE becomes low level.

With the control described above, the transistors N35 and N37, and the transistor P33 are all turned off, while the transistors P34 to P36 and the transistor N36 are all turned on. In other words, the differential pair circuit 312 is disabled, and the first potential setter 313 sets the output node of the CMOS inverter 311b (i.e. SNLN) to the first potential (e.g. the power supply potential VDD), while the second potential setter 314 sets the ground node of the CMOS inverter 311a to the second potential (e.g. the ground potential VSS).

Therefore the output node of the CMOS inverter 311b (i.e. SNLN) is forced to increase to high level, and hence the output signal Q is decreased to low level, while the inverted output signal QN is increased to high level. This state corresponds to a state where the data signal D (i.e. data "0") written to the inverter loop 311 is output without processing. In this way, the operation state of FIG. 14 is substantially the same as the operation state of FIG. 4 described above.

Note that an operation state of the sense amplifier 310 when writing "1" is basically the same as that when writing "0", which is a state where the data signal D (i.e. data "1") written to the inverter loop 311 is output without processing. More specifically, when writing "1", the data signal D among the signals shown in FIG. 14 becomes high level, while the inverted data signal DN becomes low level, and hence ON/OFF states of the transistors N36 and N37 and ON/OFF states of the transistors P33 and P34 are opposite to those described above. Therefore the output node of the CMOS inverter 311a (i.e. RNLN) is forced to increase to high level, and hence the inverted output signal QN is decreased to low level, while the output signal Q is increased to high level. This operation state is substantially the same as the operation state of FIG. 5 described above.

On the other hand, as for the entire nonvolatile latch 300, when writing "0", as shown in FIG. 13, the signal E1 becomes low level, and the both the NOR arithmetic units 343 and 344 become the output high impedance state (i.e. a state in which potential of each output terminal is floating). In addition, when holding data, the signal FRSTNL becomes high level. Therefore both terminals of each of the ferroelectric capacitors 321 to 324 are short-circuited and fixed to low level (i.e. the ground potential VSS) (PL1=PL2=L, PL1_DN=PL2_DN=H). In this way, it is possible to avoid unintentional voltage application to the ferroelectric capacitors 321 to 324, and hence data corruption can be prevented.

In addition, when writing "0", as shown in FIG. 13, both the signals FED_DN and FEU_DN become high level. Therefore both the analog switches 353 and 354 are turned off, and hence the ferroelectric capacitors 321 to 324 are electrically separated from the sense amplifier 310. However, when the input signals INN and INP of the sense amplifier 310 are fixed to low level, it is possible to set the signals FED_DN and FEU_DN to low level so that the analog switches 353 and 354 are turned on.

In this way, the operation state of FIG. 13 is completely the same as the operation state of FIG. 11 described above. Note that the operation state of the entire nonvolatile latch 300 when writing "1" is completely the same as that when writing "0", overlapping description is omitted.

Figure 15:
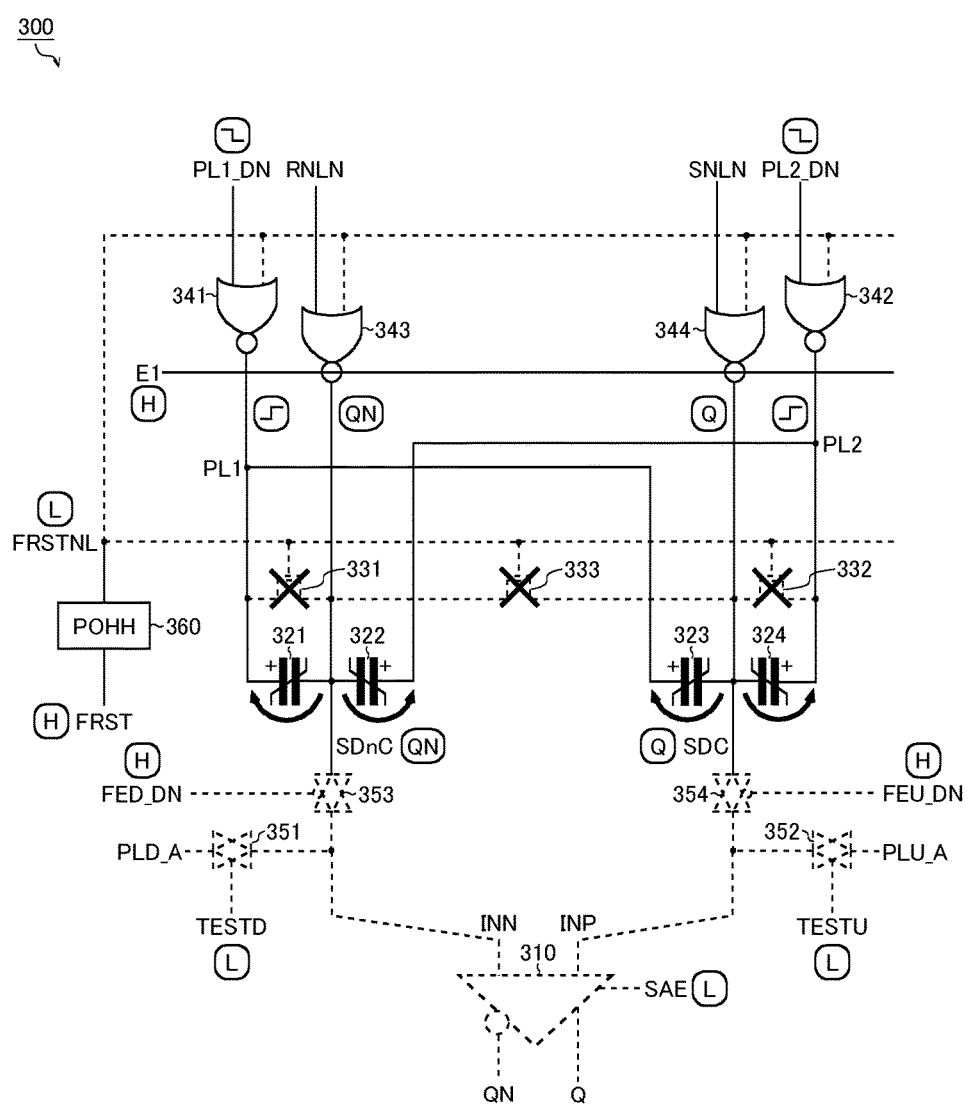
FIG. 15 is a circuit diagram showing a state of the nonvolatile latch when saving data.
Figure 16:
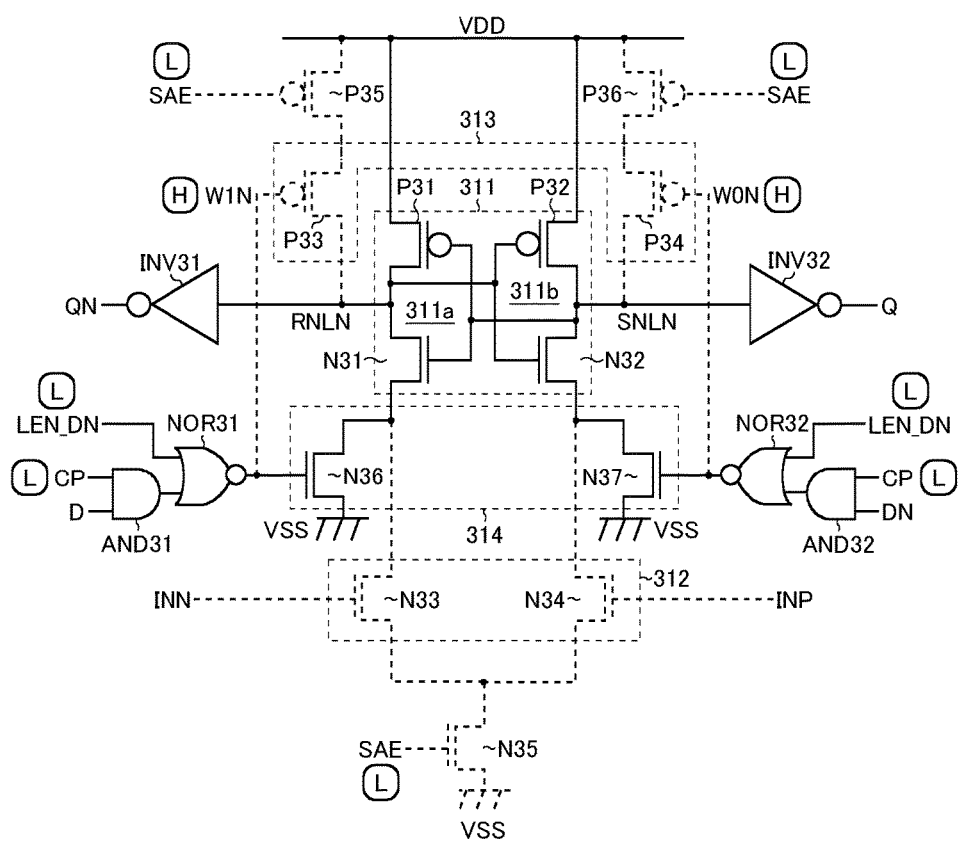
FIG. 16 is a circuit diagram showing a state of the sense amplifier when saving data.

Next, an operation state when saving data is described with reference to FIGS. 15 and 16. FIGS. 15 and 16 are circuit diagrams showing operation states of the nonvolatile latch 300 and the sense amplifier 310, respectively, when saving data.

When saving data from the inverter loop 311 of the sense amplifier 310, as shown in FIG. 16, both the signal LEN_DN and the clock signal CP become low level, and hence both the signals W1N and W0N become high level. Note that a process of stopping the clock signal CP should be performed by using a not-shown controller. In addition, when saving data, the signal SAE becomes low level.

With the control described above, the transistor N35 and the transistors P33 and P34 are all turned off, while the transistors N36 and N37 and the transistors P35 and P36 are all turned on. In other words, both the differential pair circuit 312 and the first potential setter 313 become disabled, and the second potential setter 314 sets the ground nodes of the CMOS inverters 311*a* and 311*b* to the second potential (e.g. the ground potential VSS).

Therefore the sense amplifier 310 becomes equivalent to the inverter loop 311 as a single unit, and hence data written to the inverter loop 311 is held. For example, when data "0" is written to the inverter loop 311, the output signal Q is held at low level, while the inverted output signal QN is held at high level. On the contrary, when data "1" is written to the inverter loop 311, the output signal Q is held at high level, while the inverted output signal QN is held at low level. In this way, the operation state of FIG. 16 is completely the same as the operation state of FIG. 3 or FIG. 12 described above.

On the other hand, as for the entire nonvolatile latch 300, when saving data, as shown in FIG. 15, the signal FRSTNL becomes low level. Therefore the transistors 331 to 333 are all turned off, both terminals of each of the ferroelectric capacitors 321 to 324 are opened (are not short-circuited), and hence a data writing voltage can be applied to each of the ferroelectric capacitors 321 to 324.

Note that when saving data, the signal E1 becomes high level, and hence the NOR arithmetic units 343 and 344 can respectively output logically inverted signals of the signals RNLN and SNLN (i.e. corresponding to the inverted output signal QN and the output signal Q).

In addition, when saving data, each of the signals PL1_DN and PL2_DN is pulse-driven. As a result, the positive terminals of the ferroelectric capacitors 321 to 324 are applied with pulse-like (high level to low level, or low level to high level) signals PL1 and PL2, and hence each of remanent polarization states of the ferroelectric capacitors 321 to 324 is set to either an inverted state or a non-inverted state. This state corresponds to a state where data corresponding to the output signal Q and the inverted output signal QN are written to the ferroelectric capacitors 321 to 324.

However, when saving data, both the signals FED_DN and FEU_DN become high level. Therefore both the analog switches 353 and 354 are turned off, and hence the signals SDnC and SDC are not read from the ferroelectric capacitors 321 to 324.

Figure 17:
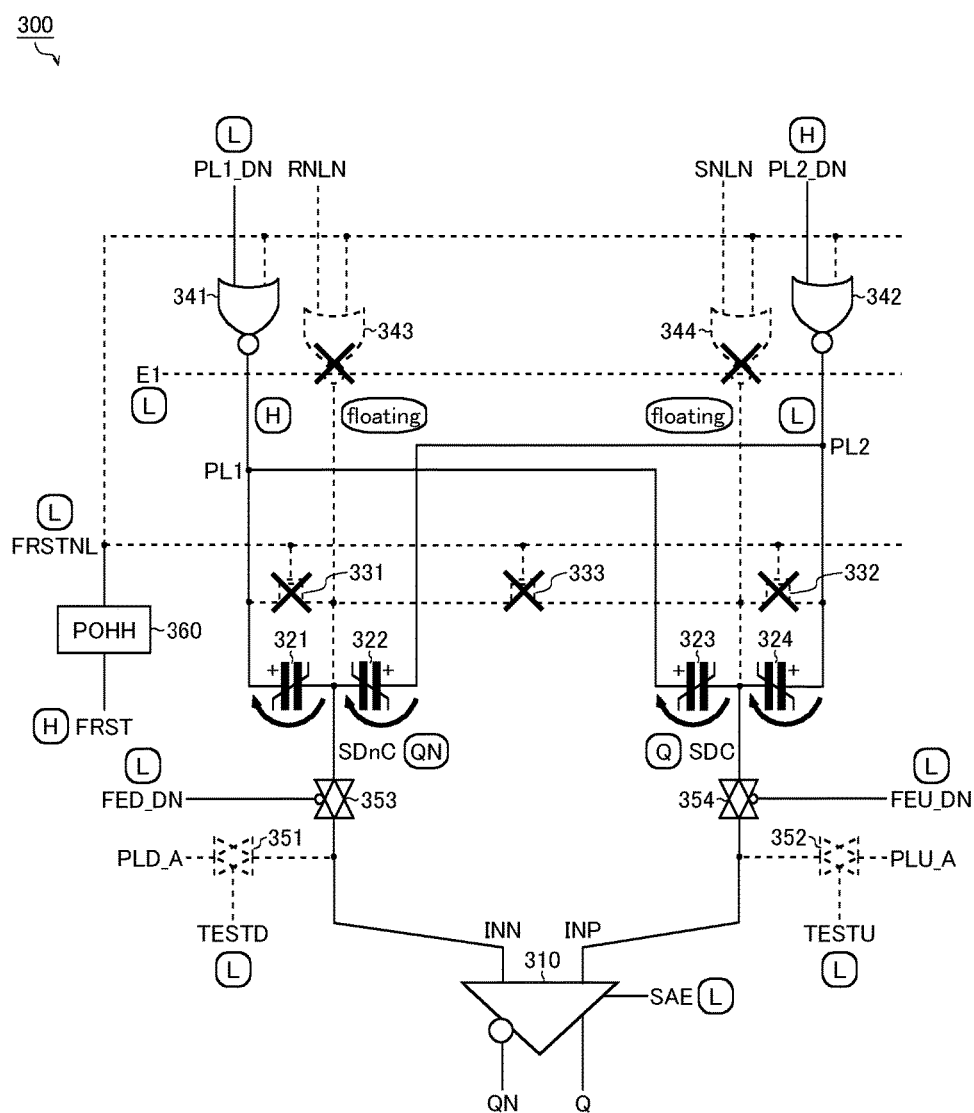
FIG. 17 is a circuit diagram showing a state of the nonvolatile latch when restoring data (precharging).
Figure 18:
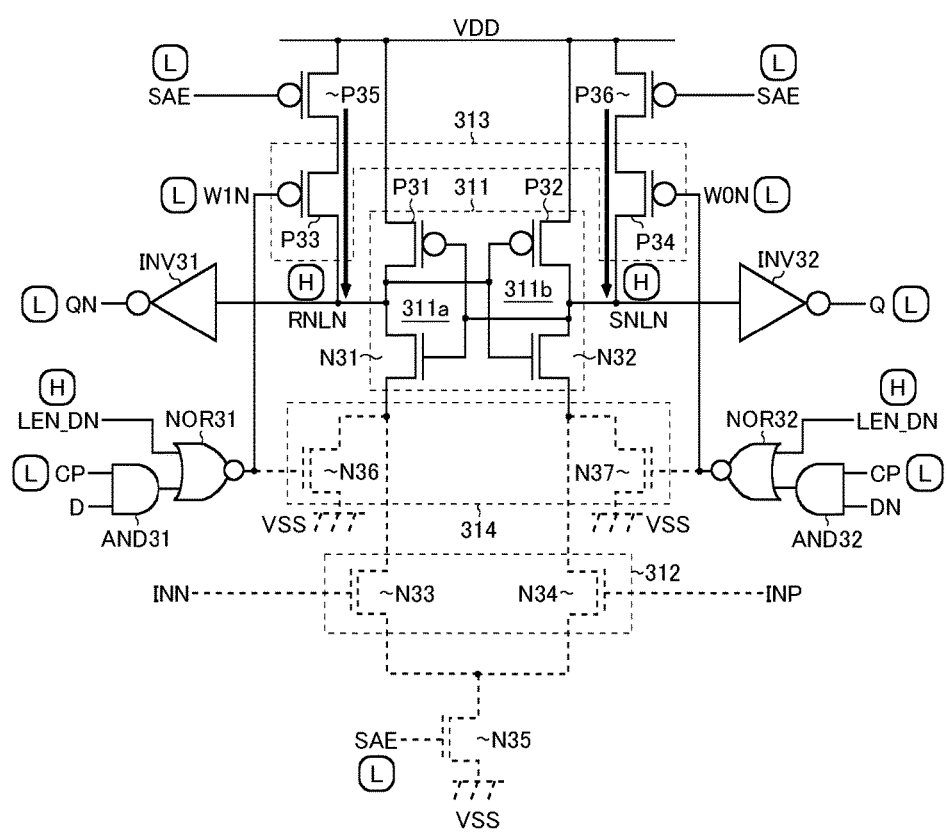
FIG. 18 is a circuit diagram showing a state of the sense amplifier when restoring data (precharging).

Next, an operation state when restoring data (precharging) is described with reference to FIGS. 17 and 18. FIGS. 17 and 18 are circuit diagrams showing operation states of the nonvolatile latch 300 and the sense amplifier 310, respectively, when restoring data (precharging).

Prior to the sensing operation of the input signals INN and INP (i.e. corresponding to the signals SDnC and SDC read from the ferroelectric capacitors 321 to 324) by the sense amplifier 310, when precharging the parasitic capacitances accompanying the output nodes of the CMOS inverters 311*a* and 311*b*, as shown in FIG. 18, the signal LEN_DN becomes high level, and the clock signal CP becomes low level. Therefore both the signals W1N and W0N become low level. In addition, when precharging, the signal SAE becomes low level.

With the control described above, the transistors N35 to N37 are all turned off, and the transistors P33 to P36 are all turned on. In other words, both the differential pair circuit 312 and the second potential setter 314 are disabled, and the first potential setter 313 sets the output nodes of the CMOS inverters 311*a* and 311*b* to the first potential (e.g. the power supply potential VDD).

Therefore the output nodes of the CMOS inverters 311*a* and 311*b* (i.e. RNLN and SNLN) are forced to increase to high level, and parasitic capacitances accompanying them are precharged. In this case, both the output signal Q and the inverted output signal QN become low level. This operation state is substantially the same as the operation state of FIG. 6 described above.

On the other hand, as for the entire nonvolatile latch 300, when restoring data (precharging), as shown in FIG. 17, the signal FRSTNL becomes low level. Therefore the transistors 331 to 333 are all turned off, and both terminals of each of the ferroelectric capacitors 321 to 324 are opened (are not short-circuited), and hence a data reading voltage can be applied to each of the ferroelectric capacitors 321 to 324.

Note that when restoring data (precharging), the signal E1 becomes low level, and hence both the NOR arithmetic units 343 and 344 become the output high impedance state (i.e. the state in which potential of each output terminal is floating).

In addition, when restoring data (precharging), the signal PL1_DN becomes low level, and the signal PL2_DN becomes high level. As a result, the signal PL1 applied to the positive terminals of the ferroelectric capacitors 321 and 323 becomes high level, and the signal PL2 applied to the positive terminals of the ferroelectric capacitors 322 and 324 becomes low level. With this application of the data reading voltage, the signals SDnC and SDC corresponding to the remanent polarization states of the ferroelectric capacitors 321 to 324 appear.

In addition, when restoring data (precharging), both the signals FED_DN and FEU_DN become low level. Therefore the analog switches 353 and 354 are both turned on, and hence the differential pair circuit 312 of the sense amplifier 310 is supplied with the input signals INN and INP to be sensed (i.e. the signals SDnC and SDC read from the ferroelectric capacitors 321 to 324) when the precharging operation is started.

Figure 19:
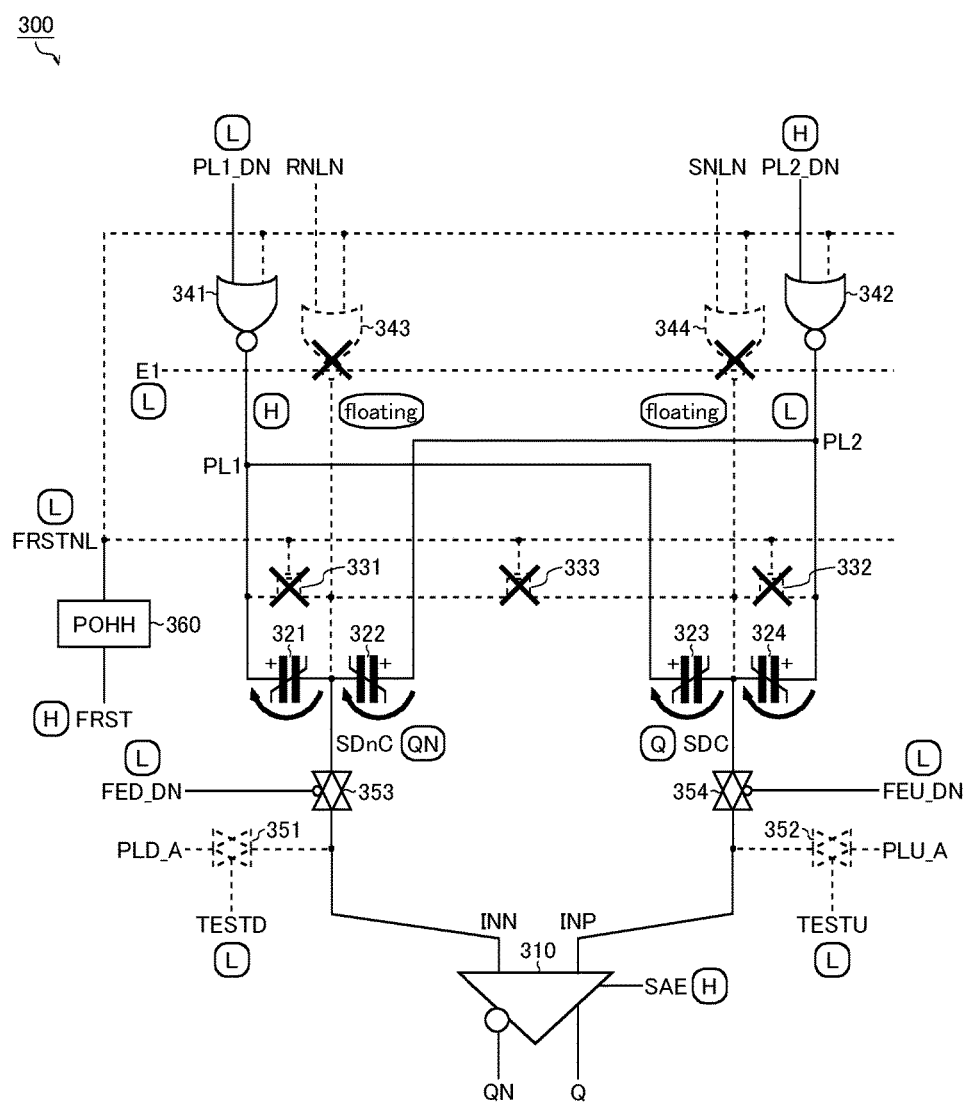
FIG. 19 is a circuit diagram showing a state of the nonvolatile latch when restoring data (sensing).
Figure 20:
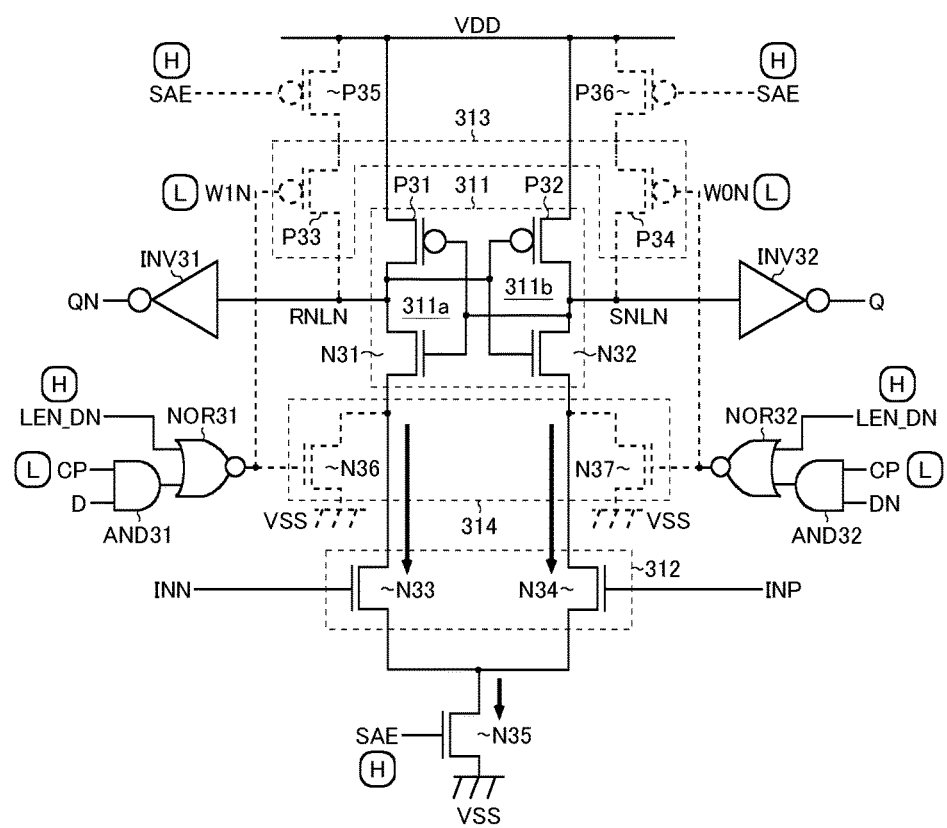
FIG. 20 is a circuit diagram showing a state of the sense amplifier when restoring data (sensing).

Next, an operation state when restoring data (sensing) is described with reference to FIGS. 19 and 20. FIGS. 19 and 20 are circuit diagrams showing operation states of the nonvolatile latch 300 and the sense amplifier 310, respectively, when restoring data (sensing).

When sensing the input signals INN and INP using the sense amplifier 310, as shown in FIG. 20, the signal LEN_DN becomes high level, while the clock signal CP becomes low level, and hence both the signals W1N and W0N become low level. In addition, when sensing, the signal SAE becomes high level.

With the control described above, the transistors N36 and N37 and the transistors P35 and P36 are all turned off, while the transistors N33 to N35 and the transistors P33 and P34 are all turned on. In other words, the differential pair circuit 312 is enabled, while both the first potential setter 313 and the second potential setter 314 are disabled.

Therefore currents corresponding to the input signals INN and INP flow in the transistors N33 and N34, respectively, and hence a potential difference is generated between the output nodes of the CMOS inverters 311a and 311b. The inverter loop 311 amplifies this potential difference so as to determine logic levels of the output signal Q and the inverted output signal QN.

For example, when INP<INN is satisfied, the current flowing in the transistor N34 is larger than the current flowing in the transistor N33, and hence the output node of the CMOS inverter 311b has a lower potential than the output node of the CMOS inverter 311a. When this potential difference is generated, due to the amplifying action of the inverter loop 311, the output node of the CMOS inverter 311a having a relatively high potential is increased to high level, while the output node of the CMOS inverter 311b having a relatively low potential is decreased to low level. As a result, the output signal Q becomes high level, and the inverted output signal QN becomes low level. This operation state means that data "1" saved in the ferroelectric capacitors 321 to 324 is restored to the inverter loop 311.

On the contrary, when INP>INN is satisfied, the current flowing in the transistor N34 is smaller than the current flowing in the transistor N33, and hence the output node of the CMOS inverter 311b has a higher potential than the output node of the CMOS inverter 311a. Therefore, due to the amplifying action of the inverter loop 311, the output node of the CMOS inverter 311a having a relatively low potential is decreased to a low level, while the output node of the CMOS inverter 311b having a relatively high potential is increased to high level. As a result, the output signal Q becomes low level, and the inverted output signal QN becomes high level. This operation state means that data "0" saved in the ferroelectric capacitors 321 to 324 is restored to the inverter loop 311.

On the other hand, as for the entire nonvolatile latch 300, when restoring data (sensing), as shown in FIG. 19, the signal FRSTNL becomes low level. Therefore the transistors 331 to 333 are all turned off, and both terminals of each of the ferroelectric capacitors 321 to 324 are opened (are not short-circuited), and hence the data reading voltage can be applied to each of the ferroelectric capacitors 321 to 324.

Note that when restoring data (sensing), the signal E1 becomes low level, and hence both the NOR arithmetic units 343 and 344 become the output high impedance state (i.e. the state in which potential of each output terminal is floating).

In addition, when restoring data (sensing), the signal PL1_DN becomes low level, and the signal PL2_DN becomes high level. As a result, the signal PL1 applied to the positive terminals of the ferroelectric capacitors 321 and 323 becomes high level, and the signal PL2 applied to the positive terminals of the ferroelectric capacitors 322 and 324 becomes low level. With this application of the data reading voltage, the signals SDnC and SDC corresponding to the remanent polarization states of the ferroelectric capacitors 321 to 324 appear.

In addition, when restoring data (sensing), both the signals FED_DN and FEU_DN become low level. Therefore the analog switches 353 and 354 are both turned on, and hence the differential pair circuit 312 of the sense amplifier 310 is supplied with the input signals INN and INP to be sensed (i.e. the signals SDnC and SDC read from the ferroelectric capacitors 321 to 324), continuously from start of the precharging operation. In this way, the operation state of FIG. 19 is completely the same as the operation state of FIG. 17 described above.

<Element Layout>

Figure 21:
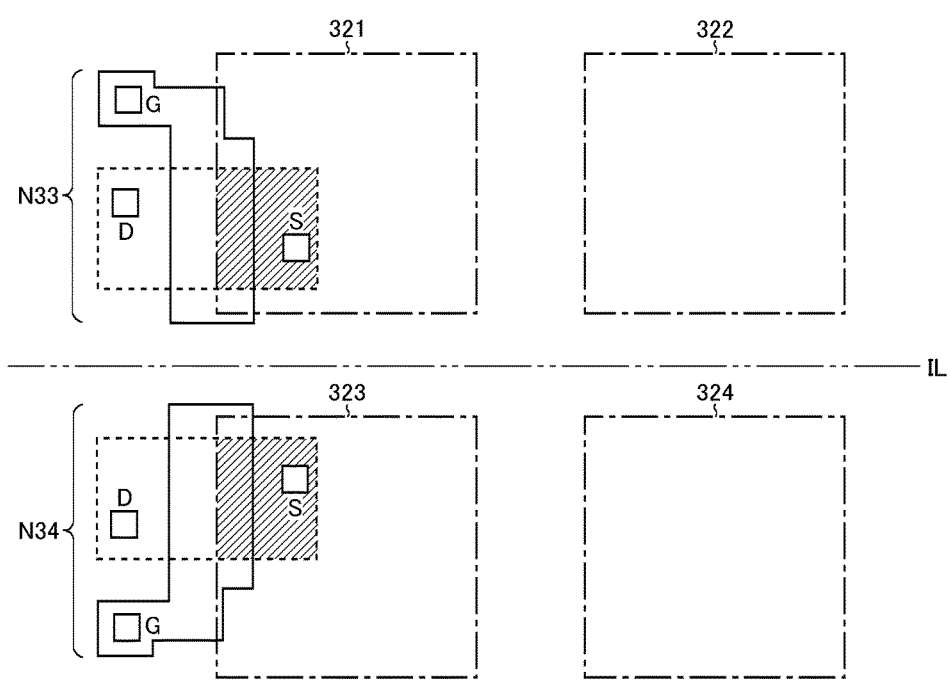
FIG. 21 is a layout diagram of ferroelectric capacitors and a differential pair circuit.

FIG. 21 is a layout diagram in a plan view of a semiconductor device in which the ferroelectric capacitors 321 to 324 and the differential pair circuit 312 (i.e. the transistors N33 and N34) are integrated. Note that in this diagram, solid lines indicate gate areas of the transistors N33 and N34, broken lines indicate active areas of the transistors N33 and N34, and dot-dashed lines indicate forming areas of the ferroelectric capacitors 321 to 324.

When the sense amplifier 310 is integrated, in order to improve its sensing accuracy, it is important to enhance analog characteristics of the differential pair circuit 312, therefore pairing property of the transistors N33 and N34.

Therefore the transistors N33 and N34 are laid out so that active areas thereof are symmetric viewed from the ferroelectric capacitors 321 to 324. Note that in the example of this diagram, the ferroelectric capacitors 321 to 324 are arranged in a lattice, and active areas of the transistors N33 and N34 are arranged to be symmetric with respect to a center line IL between the ferroelectric capacitors 321 and 323.

With this arrangement, the transistors N33 and N34 are arranged so as to have the same area of overlapping regions (see hatched parts) between the active area thereof and forming areas of the ferroelectric capacitors 321 to 324. However, it is not essential to have geometric symmetry as long as the overlapping regions have the same area. For example, even if the transistor N33 is shifted upward from the position in the diagram so that a distance between the transistor N33 and the center line IL is different from a distance between the transistor N34 and the center line IL, the pairing property of the transistors N33 and N34 is maintained as long as the overlapping regions have the same area.

<Variations>

Note that the nonvolatile latch 300 described above may be a slave, and an inverter loop to be a master may be disposed at the pre-stage thereof (i.e. on the upstream side of the data input terminals of the AND arithmetic units AND31 and AND32), so as to realize a nonvolatile flip-flop.

<Data Holding Device (Fourth Embodiment)>

Figure 23:
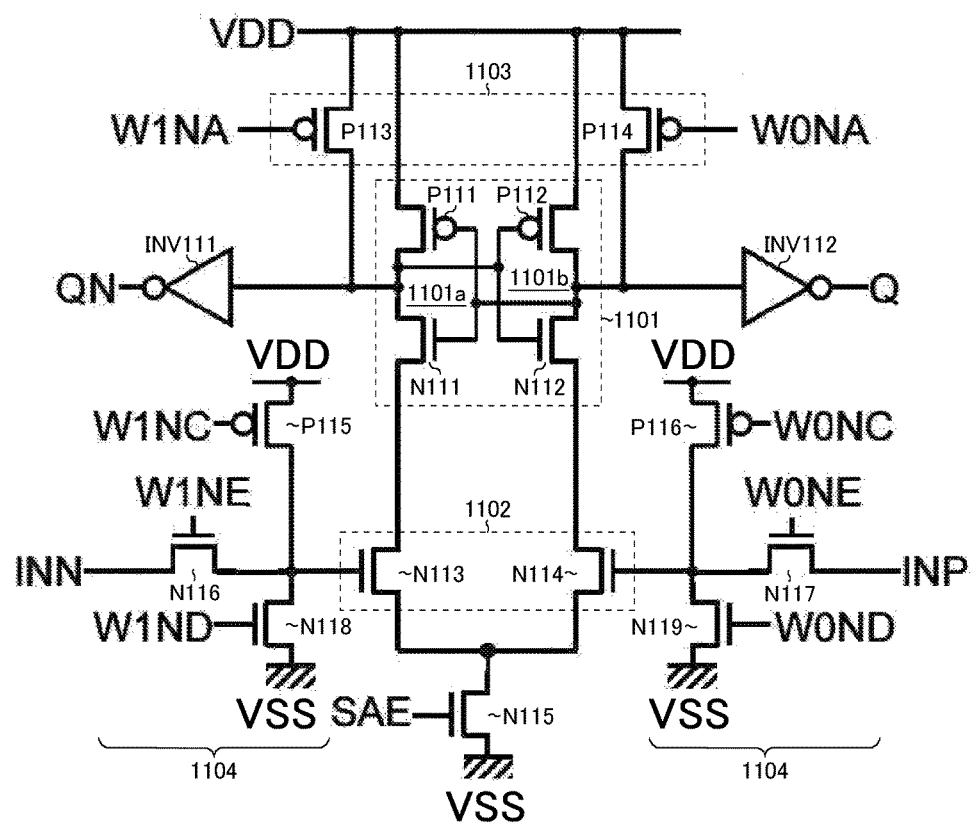
FIG. 23 is a circuit diagram showing a fourth embodiment of the data holding device.

FIG. 23 is a circuit diagram showing a fourth embodiment of a data holding device. A data holding device 1100 of this embodiment includes N-channel metal oxide semiconductor (MOS) field-effect transistors N11 to N119, P-channel MOS field-effect transistors P111 to P116, and inverters INV111 and INV112.

The sources of the transistors P111 to P114 are connected to the power supply terminal (i.e. the node set to the power supply potential VDD). The drains of the transistors P111, P113, and N111 and the gates of the transistors P112 and N112 are connected to the input terminal of the inverter INV111. The drains of the transistors P112, P114, and N112 and the gates of the transistors P111 and N111 are connected to the input terminal of the inverter INV112. The gate of the transistor P1113 is supplied with the signal W1NA. The gate of the transistor P114 is supplied with the signal W0NA. The output terminal of the inverter INV111 is connected to the output terminal of the inverted output signal QN. The output terminal of the inverter INV112 is connected to the output terminal of the output signal Q.

In addition, the source of the transistor N111 is connected to the drain of the transistor N113. The source of the transistor N112 is connected to the drain of the transistor N114. The sources of the transistors N113 and N114 are connected to the drain of the transistor N115. The source of the transistor N115 is connected to the ground terminal (i.e. the node set to the ground potential VSS). The gate of the transistor N115 is supplied with the signal SAE.

The source of the transistor P115 is connected to the power supply terminal. The drains of the transistors P115 and N118 are connected to the gate of the transistor N113. The source of the transistor N118 is connected to the ground terminal. The gate of the transistor P115 is supplied with the signal W1NC. The gate of the transistor N118 is supplied with the signal W1ND. The transistor N116 is connected between an application terminal of the input signal INN (negative) and the gate of the transistor N113. Note that the gate of the transistor N116 is supplied with the signal W1NE.

The source of the transistor P116 is connected to the power supply terminal. The drains of the transistors P116 and N119 are connected to the gate of the transistor N114. The source of the transistor N119 is connected to the ground terminal. The gate of the transistor P116 is supplied with the signal W0NC. The gate of the transistor N119 is supplied with the signal W0ND. The transistor N117 is connected between an application terminal of the input signal INP (positive) and the gate of the transistor N114. Note that the gate of the transistor N117 is supplied with the signal W0NE.

In the data holding device 1100 having the structure described above, the transistors P111 and N111 constitute a complementary MOS (CMOS) inverter 1101a, while the transistors P112 and N112 constitute a CMOS inverter 1101b.

Note that the output node of the CMOS inverter 1101a (i.e. the drains of the transistors P111 and N111) is connected to an input node of the CMOS inverter 1101b (i.e. the gates of the transistors P112 and N112). In addition, the output node of the CMOS inverter 1101b (i.e. the drains of the transistors P112 and N112) is connected to an input node of the CMOS inverter 1101a (i.e. the gates of the transistors P111 and N111).

In other words, the four transistors (P111, P112, N111, and N112) described above function as an inverter loop 1101 including the two CMOS inverters 1101a and 1101b connected in a loop. Note that not only inverters in a narrow sense but also inverters in a broad sense (NAND and NOR) may be used as logic gates constituting the inverter loop 1101.

In addition, in the data holding device 1100 having the structure described above, the transistors N113 and N114 function as a differential pair circuit 1102 connected to the ground nodes of the CMOS inverters 1101a and 1101b (i.e. the sources of the transistors N111 and N112).

The transistors P113 and P114 function as a first potential setter 1103 (so-called charge-up circuit), which sets the output nodes of the CMOS inverters 1101a and 1101b to the first potential (i.e. the power supply potential VDD or a high potential equivalent to the same).

The transistors P115 and P116 and the transistors N116 to N119 function as a differential pair control unit 1104, which performs gate control of the differential pair circuit 1102 so as to set the ground nodes of the CMOS inverters 1101a and 1101b to the second potential (i.e. the ground potential VSS or a low potential equivalent to the same).

Among a plurality of transistors included in the differential pair control unit 1104, the transistors P115 and P116 correspond to first transistors, which set the gates of the differential pair circuit 1102 to an on-potential (e.g. the power supply potential VDD), while the transistors N116 and N117 correspond to second transistors, which connect and disconnect input signal paths to the gates of the differential pair circuit 1102. In addition, the transistors N118 and N119 correspond to third transistors, which set the gates of the differential pair circuit 1102 to an off-potential (e.g. the ground potential VSS).

In this way, the data holding device 1100 of this embodiment has a structure based on a general sense amplifier, to which the differential pair control unit 1104 is added so as to realize a latch function using the inverter loop 1101. The operation thereof is described below in detail.

<Description of Operation>

Figure 24:
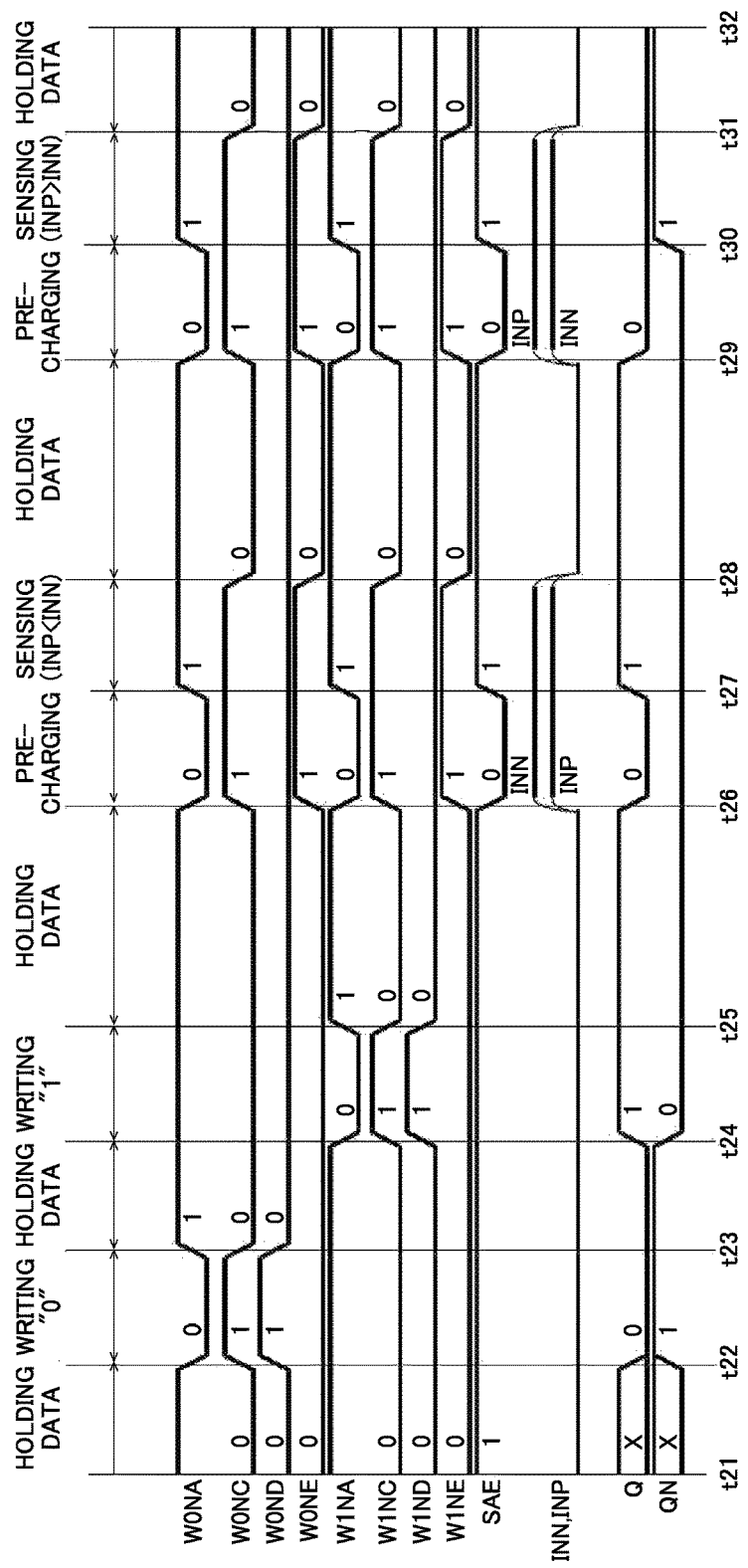
FIG. 24 is a timing chart showing an operation example of the data holding device.

FIG. 24 is a timing chart illustrating an operation example of the data holding device 1100, in which the signals W0NA and W0NC to W0NE, the signals W1NA and W1NC to W1NE, the signal SAE, the input signals INN and INP, the output signal Q, and the inverted output signal QN are shown in order from top to bottom.

First, an operation state of the data holding device 1100 when holding data is described. As shown in time t21 to time t22, time t23 to time t24, time t25 to time t26, time t28 to time t29, or time t31 to time t32 in FIG. 24, when holding data using the inverter loop 1101, the signals W0NA and W1NA and the signal SAE are all set to high level, while the signals W0NC to W0NE and the signals W1NC to W1NE are all set to low level. Note that logic levels of the signals INN and INP do not matter (e.g. low level).

Figure 25:
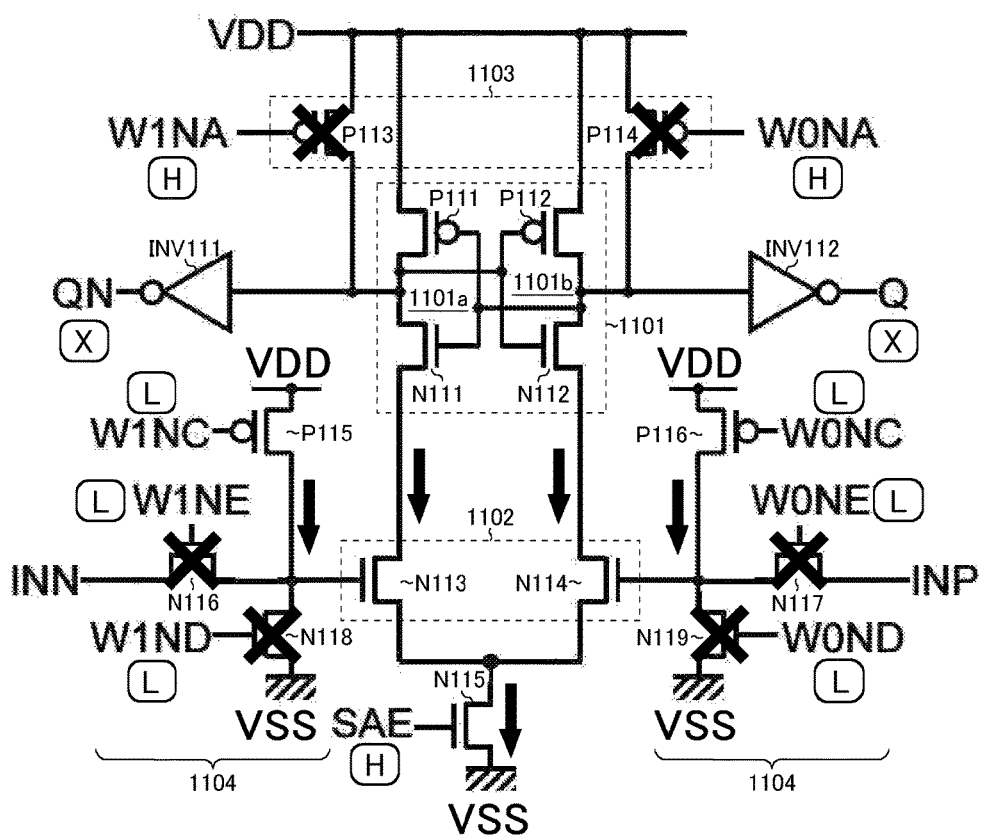
FIG. 25 is a circuit diagram showing a state of the data holding device when holding data.

With the control described above, as shown in FIG. 25, the transistors N116 to N118 and the transistors P113 and P114 are all turned off, while the transistors N113 to N115 and the transistors P115 and P116 are all turned on. In other words, the first potential setter 1103 is disabled, and the differential pair circuit 1102 sets the ground nodes of the CMOS inverters 1101a and 1101b to the second potential (e.g. the ground potential VSS) based on the gate control by the differential pair control unit 1104.

Therefore the data holding device 1100 becomes equivalent to a single unit of the inverter loop 1101, and hence data written to the inverter loop 1101 is held. For example, when data "0" is written to the inverter loop 1101, the output signal Q is held at low level, while the inverted output signal QN is held at high level (see time t23 to time t24 or time t31 to time t32). On the contrary, when data "1" is written to the inverter loop 1101, the output signal Q is held at high level, while the inverted output signal QN is held at low level (see time t25 to time t26 or time t28 to time t29).

Next, an operation state of the data holding device 1100 when writing "0" is described. As shown in time t22 to time t23 in FIG. 24, when data "0" is written to the inverter loop 1101, the signals W0NC and W0ND, the signal W1NA, and the signal SAE are all set to high level, while the signals W0NA and W0NE and the signals W1NC to W1NE are all set to low level. Note that logic levels of the signals INN and INP do not matter (e.g. low level).

Figure 26:
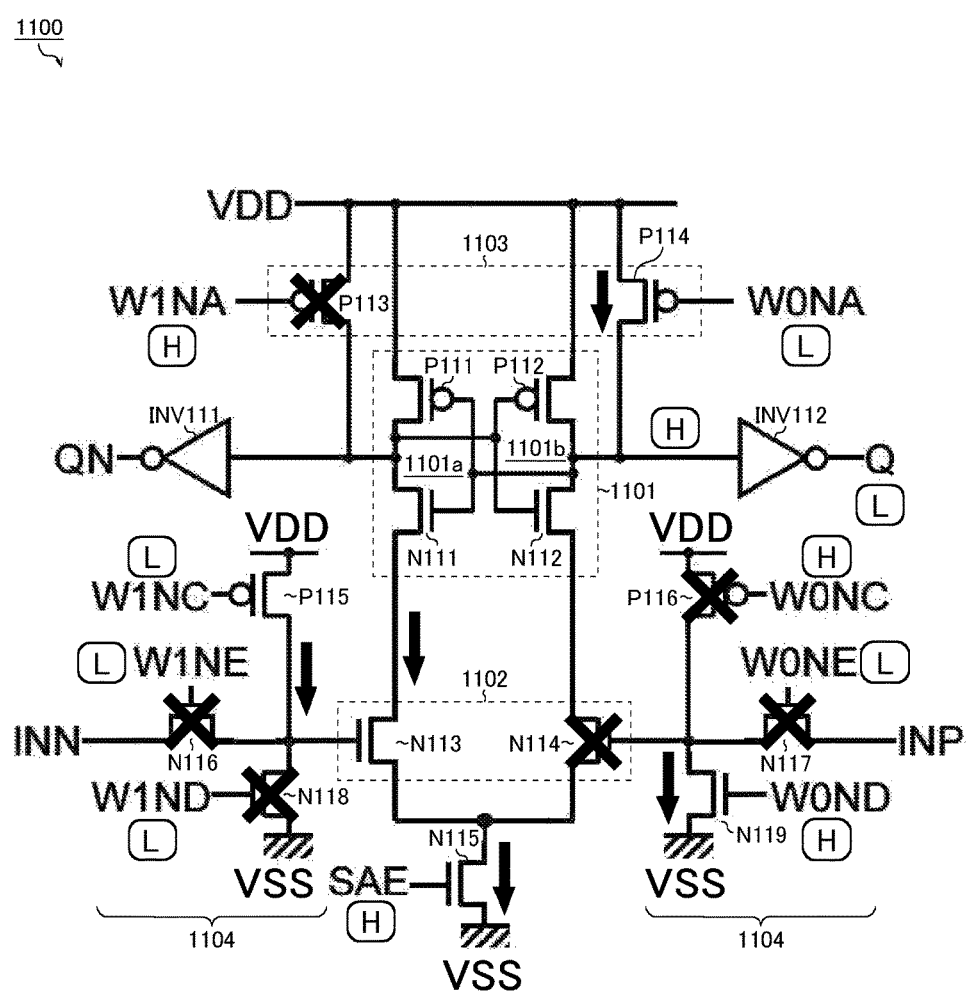
FIG. 26 is a circuit diagram showing a state of the data holding device when writing "O".

With the control described above, as shown in FIG. 26, the transistors N114 and N116 to N118 and the transistors P113 and P116 are all turned off, and the transistors N113, N115 and N119 and the transistors P114 and P115 are all turned on. In other words, the first potential setter 1103 sets the output node of the CMOS inverter 1101b to the first potential (e.g. the power supply potential VDD), and the differential pair circuit 1102 sets the ground node of the CMOS inverter 1101a to the second potential (e.g. the ground potential VSS) based on the gate control by the differential pair control unit 1104.

Therefore the output node of the CMOS inverter 1101b is forced to increase to high level, and hence the output signal Q is decreased to low level, while the inverted output signal QN is increased to high level. This state corresponds to a state where data "0" written to the inverter loop 1101 is output without processing.

Next, an operation state of the data holding device 1100 when writing "1" is described. As shown in time t24 to time t25 in FIG. 24, when data "1" is written to the inverter loop 1101, the signal W0NA, the signals W1NC and W1ND, and the signal SAE are all set to high level, while the signals W0NC to W0NE and the signals W1NA and W1NE are all set to low level. Note that logic levels of the signals INN and INP do not matter (e.g. low level).

Figure 27:
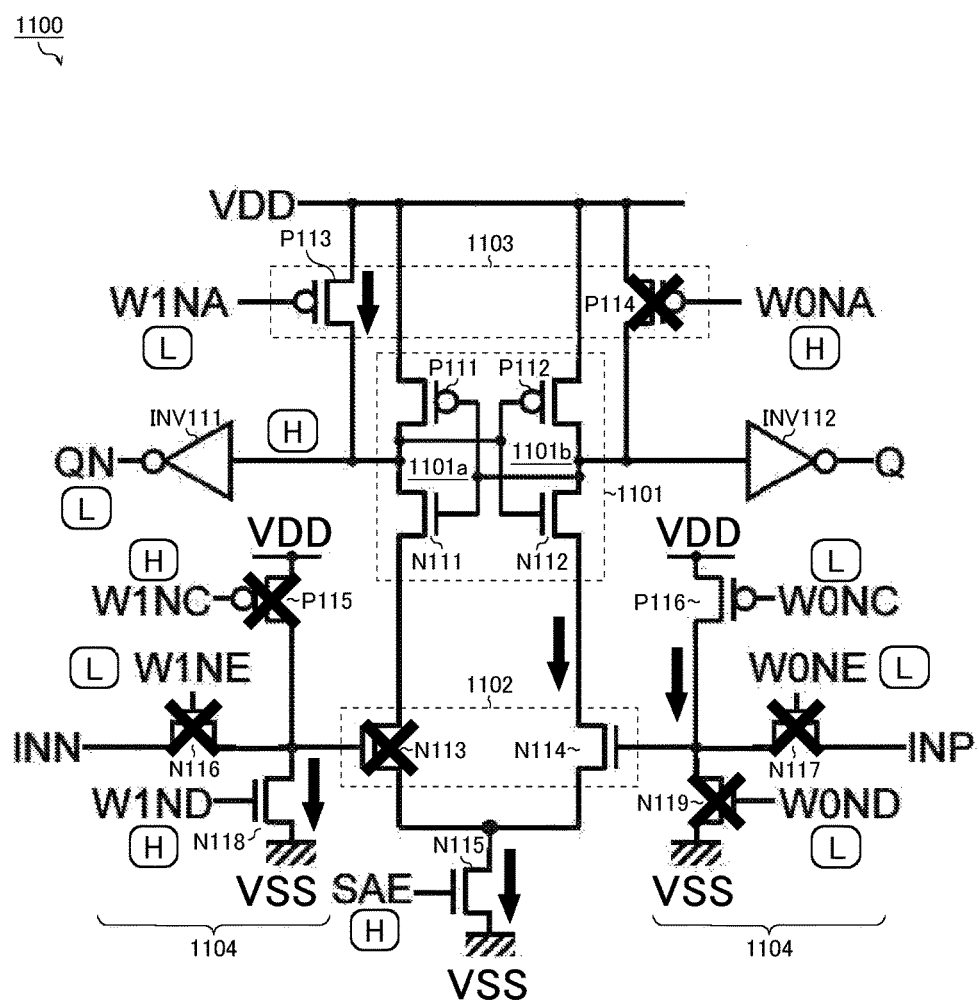
FIG. 27 is a circuit diagram showing a state of the data holding device when writing "1".

With the control described above, as shown in FIG. 27, the transistors N113, N116 to N117, and N119 and the transistors P114 and P115 are all turned off, while the transistors N114, N115, and N118 and the transistors P113 and P116 are all turned on. In other words, the first potential setter 1103 sets the output node of the CMOS inverter 1101a to the first potential (e.g. the power supply potential VDD), and the differential pair circuit 1102 sets the ground node of the CMOS inverter 1101b to the second potential (e.g. the ground potential VSS) based on the gate control by the differential pair control unit 1104.

Therefore the output node of the CMOS inverter 1101a is forced to increase to high level, and hence the inverted output signal QN is decreased to low level, while the output signal Q is increased to high level. This state corresponds to a state where data "1" written to the inverter loop 1101 is output without processing.

Next, an operation state of the data holding device 1100 when precharging is described. As shown in time t26 to time t27 or time t29 to time t30 in FIG. 24, when precharging parasitic capacitances accompanying the output nodes of the CMOS inverters 1101a and 1101b prior to sensing operation of the input signals INN and INP, the signals W0NA and W0ND, the signals W1NA and W1ND, and the signal SAE are all set to low level, while the signals W0NC and W0NE, and the signals W1NC and W1NE are all set to high level. Note that the input signals INN and INP to be sensed should be input to the differential pair circuit 1102 when the precharging operation is started.

With the control described above, as shown in FIG. 28, the transistors N115, N118, and N119 and the transistors P115 and P116 are all turned off, while the transistors N116 and N117 and the transistors P113 and P114 are all turned on. In other words, the differential pair circuit 1102 and the differential pair control unit 1104 are all disabled, and the first potential setter 1103 sets the output nodes of the CMOS inverters 1101a and 1101b to the first potential (e.g. the power supply potential VDD).

Therefore the output nodes of the CMOS inverters 1101a and 1101b are forced to increase to high level, and hence parasitic capacitances accompanying them are precharged. In this case, both the output signal Q and the inverted output signal QN become low level.

Next, an operation state of the data holding device 1100 when sensing is described. As shown in time t27 to time t28 or time t30 to time t31 in FIG. 24, when sensing the input signals INN and INP to the differential pair circuit 1102, the signals W0NA, W0NC, and W0NE, the signals W1NA, W1NC, and W1NE, and the signal SAE are all set to high level, while the signals W0ND and W1ND are both set to low level.

With the control described above, as shown in FIG. 29, the transistors N118 and N119, and the transistors P113 to P116 are all turned off, while the transistors N113 to N117 are all turned on. In other words, the differential pair circuit 1102 is enabled, while the first potential setter 1103 and the differential pair control unit 1104 are both disabled.

Therefore currents corresponding to the input signals INN and INP flow in the transistors N113 and N114, respectively, and hence a potential difference is generated between the output nodes of the CMOS inverters 1101a and 1101b. The inverter loop 1101 amplifies this potential difference so as to determine logic levels of the output signal Q and the inverted output signal QN.

Figure 29:
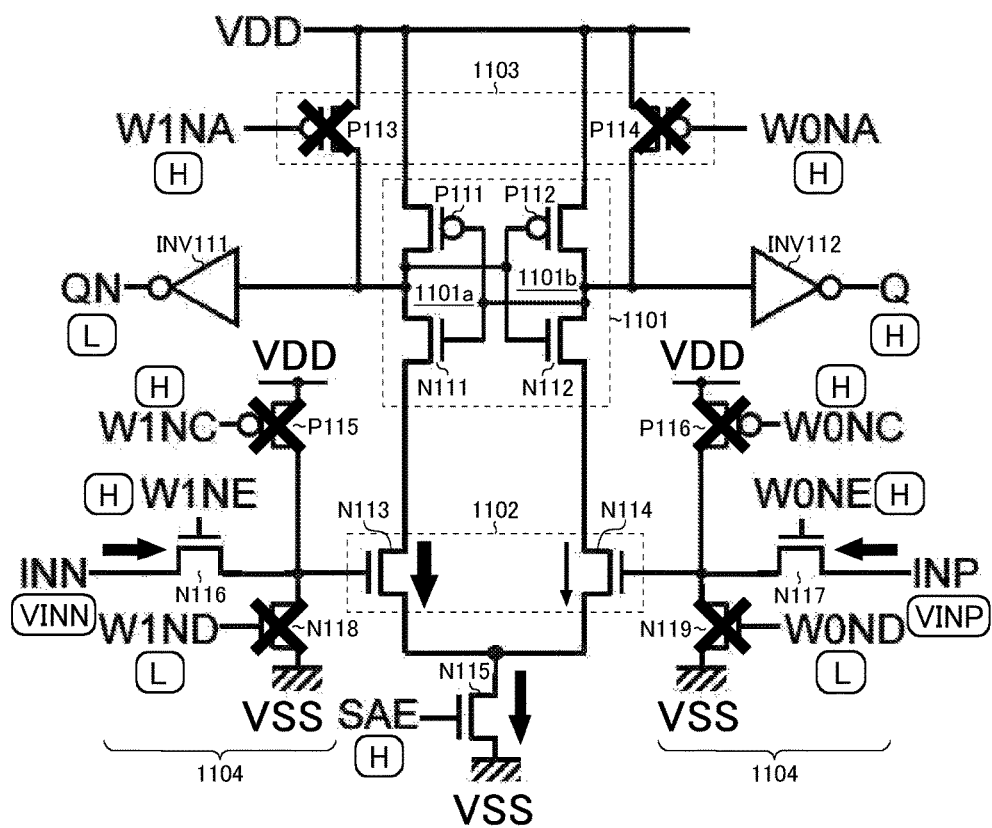
FIG. 29 is a circuit diagram showing a state of the data holding device when sensing.

For example, as shown in time t27 to time t28 in FIG. 24, when INP<INN is satisfied, as shown in FIG. 29, the current flowing in the transistor N114 becomes larger than the current flowing in the transistor N113, and hence the output node of the CMOS inverter 1101b has a lower potential than the output node of the CMOS inverter 1101a. When this potential difference is generated, due to the amplifying action of the inverter loop 1101, the output node of the CMOS inverter 1101a having a relatively high potential is increased to high level, while the output node of the CMOS inverter 1101b having a relatively low potential is decreased to low level. As a result, the output signal Q becomes high level, and the inverted output signal QN becomes low level.

On the other hand, when INP>INN is satisfied as shown in time t30 to time t31 in FIG. 24, a magnitude relationship between currents flowing in the transistors N113 and N114 in FIG. 29 becomes opposite, and logic levels of the output signal Q and the inverted output signal QN become opposite. More specifically, the current flowing in the transistor N114 becomes smaller than the current flowing in the transistor N113, and hence the output node of the CMOS inverter 1101b has a higher potential than the output node of the CMOS inverter 1101a. Therefore, due to the amplifying action of the inverter loop 1101, the output node of the CMOS inverter 1101a having a relatively low potential is decreased to low level, while the output node of the CMOS inverter 1101b having a relatively high potential is increased to high level. As a result, the output signal Q becomes low level, and the inverted output signal QN becomes high level.

Figure 28:
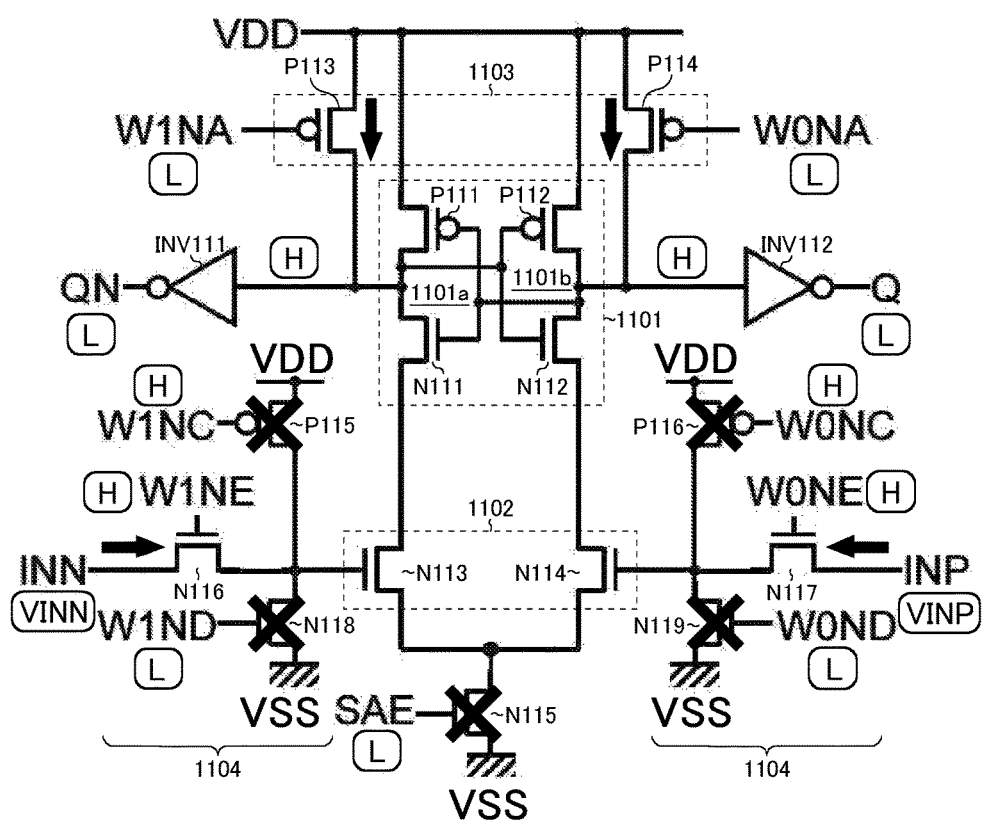
FIG. 28 is a circuit diagram showing a state of the data holding device when precharging.

In this way, the data holding device 1100 of this embodiment utilizes the single inverter loop 1101 and can achieve both the latch function (see time t21 to time t26, time t28 to time t29, time t31 to time 32 in FIG. 24, and FIGS. 25 to 27) and the sensing function (see time t26 to time t28, and time t29 to time t30 in FIG. 24, and FIGS. 28 and 29).

Therefore, for example, by using the data holding device 1100 of this embodiment as the sense amplifier SA of FIG. 22, the data holding portion M becomes unnecessary, and thus it is possible to cancel duplication of the inverter loop so that a circuit area can be reduced (by approximately half).

Note that as shown in the first embodiment (FIG. 1) described above, by additionally disposing a grounding transistor that connects and disconnects between the ground node of the inverter loop 1101 and the ground terminal instead of the differential pair control circuit 1104 described above, it is possible to set the ground node of the inverter loop 1101 to the second potential with a smaller number of elements. However, when adopting this structure, a leak path is formed via the grounding transistor described above, and hence a sense amplifier offset is increased. On the other hand, with the structure using the differential pair control circuit 1104, the leak path described above does not exist, and hence the sense amplifier offset is not increased. Thus, it is possible to improve yield and reliability.

<Data Holding Device (Fifth Embodiment)>

Figure 30:
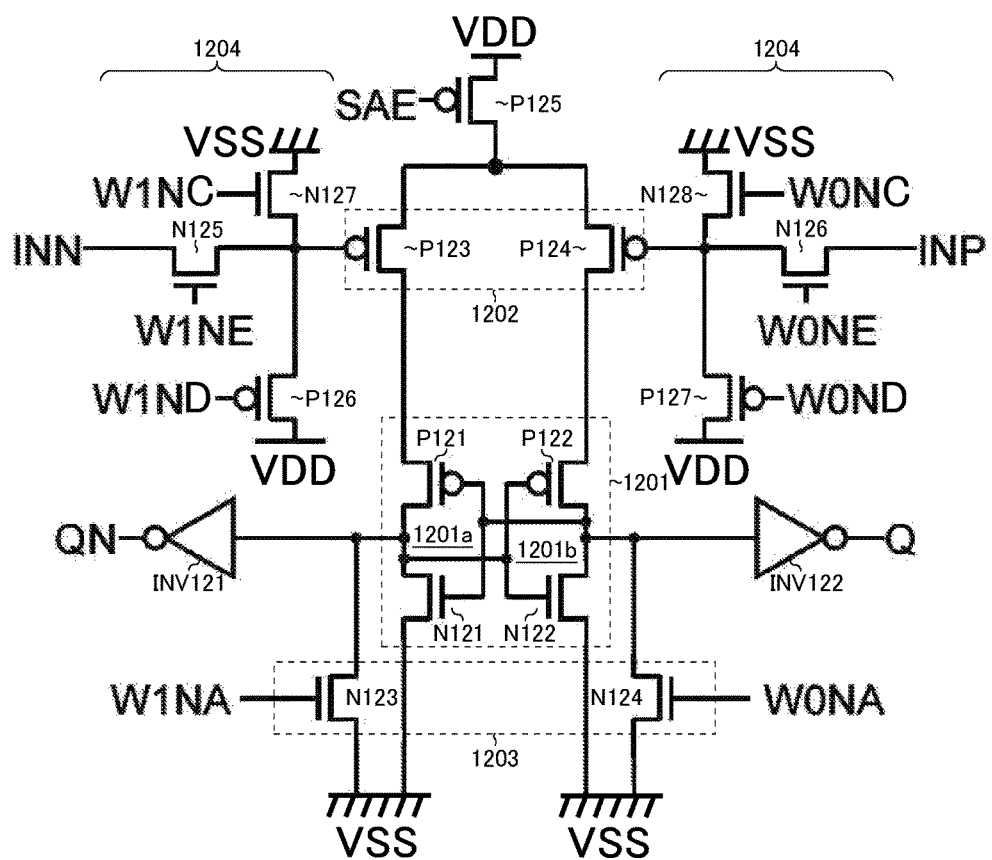
FIG. 30 is a circuit diagram showing a fifth embodiment of the data holding device.

FIG. 30 is a circuit diagram showing a fifth embodiment of a data holding device. A data holding device 1200 of this embodiment includes N-channel MOS field-effect transistors N121 to N128, P-channel MOS field-effect transistors P121 to P127, and inverters INV121 and INV122.

The sources of the transistors N121 to N124 are connected to the ground terminal (i.e. the node set to the ground potential VSS). The drains of the transistors N121, N123, and P121, and the gates of the transistors N122 and P122 are connected to the input terminal of the inverter INV121. The drains of the transistors N122, N124, and P122, and the gates of the transistors N121 and P121 are connected to the input terminal of the inverter INV122. The gate of the transistor N123 is supplied with the signal W1NA. The gate of the transistor N124 is supplied with the signal W0NA. The output terminal of the inverter INV121 is connected to the output terminal of the inverted output signal QN. The output terminal of the inverter INV122 is connected to the output terminal of the output signal Q.

In addition, the source of the transistor P121 is connected to the drain of the transistor P123. The source of the transistor P122 is connected to the drain of the transistor P124. The sources of the transistors P123 and P124 are connected to the drain of the transistor P125. The source of the transistor P125 is connected to the power supply terminal (i.e. the node set to the power supply potential VDD). The gate of the transistor P125 is supplied with the signal SAE.

The source of the transistor P126 is connected to the power supply terminal. The drains of the transistors P126 and N127 are connected to the gate of the transistor P123. The source of the transistor N127 is connected to the ground terminal. The gate of the transistor P126 is supplied with the signal W1ND. The gate of the transistor N127 is supplied with the signal W1NC. The transistor N125 is connected between the application terminal of the input signal INN (negative) and the gate of the transistor P123. The gate of the transistor N125 is supplied with the signal W1NE.

The source of the transistor P127 is connected to the power supply terminal. The drains of the transistors P127 and N128 are connected to the gate of the transistor P124.

The source of the transistor N128 is connected to the ground terminal. The gate of the transistor P127 is supplied with the signal W0ND. The gate of the transistor N128 is supplied with the signal W0NC. The transistor N126 is connected between the application terminal of the input signal INP (positive) and the gate of the transistor P124. The gate of the transistor N126 is supplied with the signal W0NE.

In the data holding device 1200 having the structure described above, the transistors P121 and N121 constitute a CMOS inverter 1201*a*, while the transistors P122 and N122 constitute a CMOS inverter 1201*b*.

Note that the output node of the CMOS inverter 1201*a* (i.e. the drains of the transistors P121 and N121) is connected to the input node of the CMOS inverter 1201*b* (i.e. the gates of the transistors P122 and N122). In addition, the output node of the CMOS inverter 1201*b* (i.e. the drains of the transistors P122 and N122) is connected to the input node of the CMOS inverter 1201*a* (i.e. the gates of the transistors P121 and N121).

In other words, the four transistors (P121, P122, N121, and N122) described above function as an inverter loop 1201, which includes the two CMOS inverters 1201*a* and 1201*b* connected in a loop. Note that not only inverters in a narrow sense but also inverters in a broad sense (NAND and NOR) may be used as logic gates constituting the inverter loop 1201.

In addition, in the data holding device 1200 having the structure described above, the transistors P123 and P124 function as a differential pair circuit 1202 connected to the power supply nodes of the CMOS inverters 1201*a* and 1201*b* (i.e. the sources of the transistors P121 and P122).

The transistors N123 and N124 function as a first potential setter 1203, which sets the output nodes of the CMOS inverters 1201*a* and 1201*b* to the first potential (i.e. the ground potential VSS or a low potential equivalent to the same).

The transistors P126 and P127, and the transistors N125 to N128 function as a differential pair control unit 1204, which performs gate control of the differential pair circuit 1202 so as to set the power supply nodes of the CMOS inverters 1201*a* and 1201*b* to the second potential (i.e. the power supply potential VDD or a high potential equivalent to the same).

Note that among a plurality of transistors included in the differential pair control unit 1204, the transistors N127 and N128 correspond to first transistors, which set the gates of the differential pair circuit 1202 to an on-potential (e.g. the ground potential VSS), while the transistors N125 and N126 correspond to second transistors, which connect and disconnect input signal paths to the gates of the differential pair circuit 1202. In addition, the transistors P126 and P127 correspond to third transistors, which set the gates of the differential pair circuit 1202 to an off-potential (e.g. the power supply potential VDD).

In this way, the data holding device 1200 of this embodiment has a structure in which polarities of the data holding device 1100 of the fourth embodiment (FIG. 23) are inverted (the NMOS differential pair type to the PMOS differential pair type, NMOS to PMOS, and VDD to VSS), and it can achieve both the latch function and the sensing function using the single inverter loop 1201 in the same manner as described above.

Note that in order to understand the operation of the data holding device 1200, in the above description of the operation of the data holding device 1100, it is sufficient to replace the numerals (1101 to 1104 with 1201 to 1204, N111 to N112 with N121 to N122, N113 to N115 with P113 to P127, N116 to N117 with N125 to N126, N118 to N119 with P126 to P127. P11 to P112 with P121 to P122, P113 to P114 with N123 to N124, P115 to P116 with N127 to N128), to invert logic levels of various control signals (W0NA, W0NC to W0NE, W1NA, W1NC to W1NE, and SAE), and to invert amplitude of the input signals (INN and INP), and hence overlapping description of operation is omitted.

<Nonvolatile Latch (Second Structural Example)>

Figure 31:
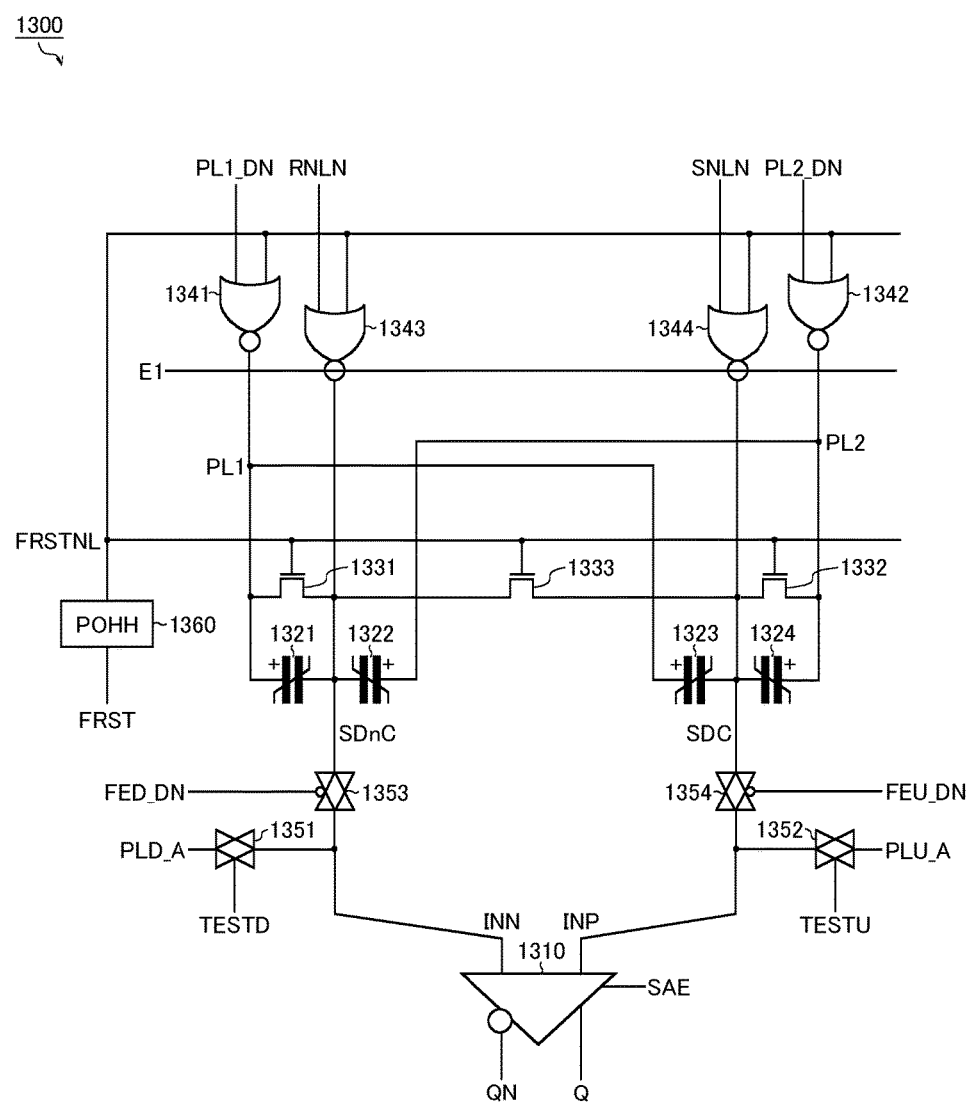
FIG. 31 is a circuit diagram showing an overall structure of the nonvolatile latch (a second structural example).

Next, an example of an application to a nonvolatile latch is described. FIG. 31 is a circuit diagram showing an overall structure of a nonvolatile latch. A nonvolatile latch 1300 of this structural example includes a sense amplifier 1310, ferroelectric capacitors 1321 to 1324, N-channel MOS field-effect transistors 1331 to 1333, NOR arithmetic units 1341 to 1344, analog switches 1351 to 1354, and a power-on high hold circuit 1360 (hereinafter referred to as a POHH circuit 1360).

A first input terminal of the NOR arithmetic unit 1341 is supplied with the signal PL1_DN. A first input terminal of the NOR arithmetic unit 1342 is supplied with the signal PL2_DN. A first input terminal of the NOR arithmetic unit 1343 is supplied with the signal RNLN. A first input terminal of the NOR arithmetic unit 1344 is supplied with the signal SNLN. Each of second input terminals of the NOR arithmetic units 1341 to 1344 is supplied with the signal FRSTNL. Note that the NOR arithmetic units 1343 and 1344 are a 3-state output type (H/L/output HiZ), and control terminals thereof are supplied with the signal E1.

The output terminal of the NOR arithmetic unit 1341 (i.e. corresponding to the output terminal of the signal PL1) is connected to the positive terminals of the ferroelectric capacitors 1321 and 1323. The output terminal of the NOR arithmetic unit 1342 (i.e. corresponding to the output terminal of the signal PL2) is connected to the positive terminals of the ferroelectric capacitors 1322 and 1324. The output terminal of the NOR arithmetic unit 1343 (i.e. corresponding to the output terminal of the signal SDnC) is connected to the negative terminals of the ferroelectric capacitors 1321 and 1322. The output terminal of the NOR arithmetic unit 1344 (i.e. corresponding to the output terminal of the signal SDC) is connected to the negative terminals of the ferroelectric capacitors 1323 and 1324.

The transistor 1331 is connected in parallel to the ferroelectric capacitor 1321. The transistor 1332 is connected in parallel to the ferroelectric capacitor 1324. The transistor 1333 is connected between the output terminal of the signal SDnC and the output terminal of the signal SDC. The gates of the transistors 1331 to 1333 are supplied with the signal FRSTNL.

The analog switch 1351 is connected between the application terminal of the signal PLD_A and the negative input terminal of the sense amplifier 1310 (i.e. the input terminal of the input signal INN), and it is turned on and off according to the signal TESTD input to the control terminal thereof. The analog switch 1352 is connected between the application terminal of the signal PLU_A and the positive input terminals of the sense amplifier 1310 (i.e. the input terminal of the input signal INP), and it is turned on and off according to the signal TESTU input to the control terminal thereof. The analog switch 1353 is connected between the application terminal of the signal SDnC and the negative input terminal of the sense amplifier 1310, and it is turned on and off according to the signal FED_DN inversely input to the control terminal thereof. The analog switch 1354 is connected between the application terminal of the signal SDC and the positive input terminal of the sense amplifier 1310, and it is turned on and off according to the signal FEU_DN inversely input to the control terminal thereof.

The POHH circuit 1360 holds the signal FRSTNL at high level until the power supply potential VDD reaches at least a voltage that enables the CMOS circuit to operate, even if the signal FRST becomes high level (VDD) when the power supply is turned on. Note that the POHH circuit 1360 operates as a normal inverter after the power supply is turned on.

The sense amplifier 1310 has a sensing function of receiving a differential input of the input signals INP and INN so as to generate the output signal Q and the inverted output signal QN, as well as a latch function of receiving input of the data signal D so as to hold the same. In other words, functions of both the data holding portion M and the sense amplifier SA of FIG. 22 are integrated in the sense amplifier 1310. A circuit structure thereof is described below.

<Sense Amplifier>

Figure 32:
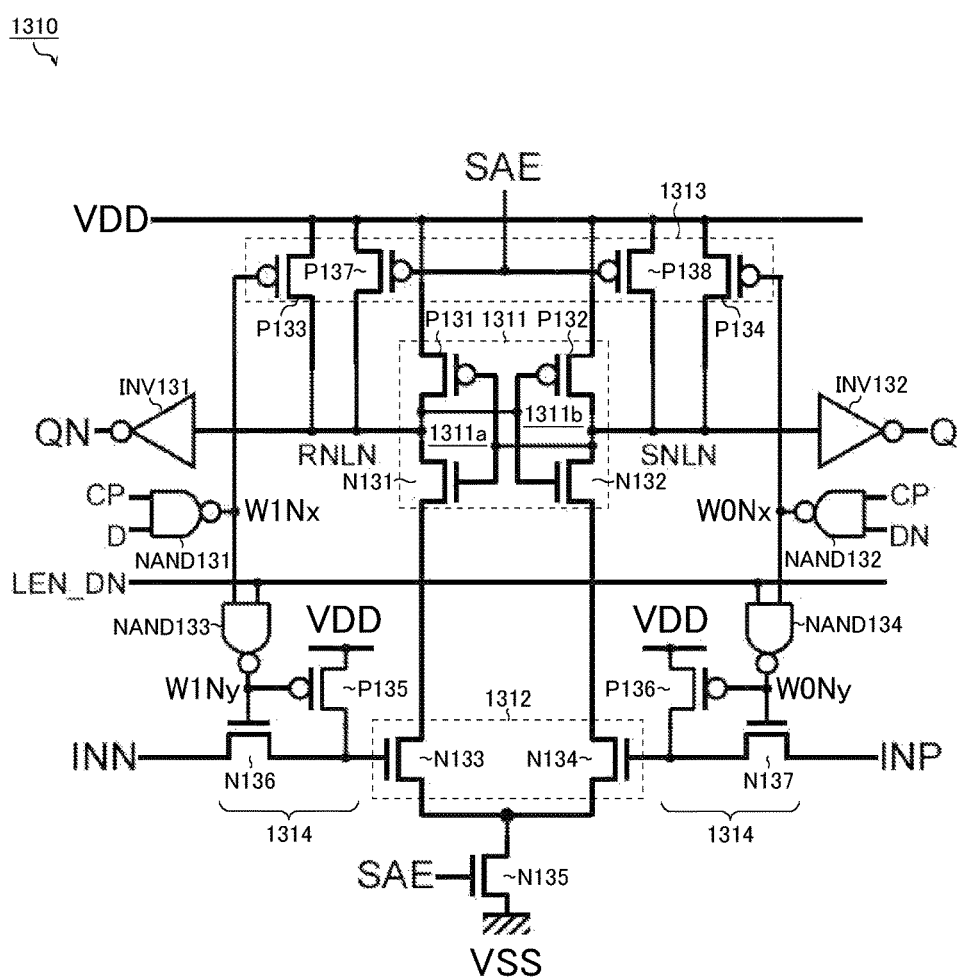
FIG. 32 is a circuit diagram showing a structural example of the sense amplifier (a sixth embodiment of the data holding device).

FIG. 32 is a circuit diagram showing a structural example of the sense amplifier 1310 (corresponding to a sixth embodiment of the data holding device). The sense amplifier 1310 of this structural example has basically the same circuit structure as the data holding device 1100 of FIG. 23, which includes N-channel MOS field-effect transistors N131 to N137, P-channel MOS field-effect transistors P131 to P138, inverters INV131 and INV32, and NAND arithmetic units NAND131 to NAND134.

The sources of the transistors P131 to P134, and the transistors P137 and P138 are connected to the power supply terminal (i.e. the node set to the power supply potential VDD). The drains of the transistors P131, P133, P137 and N131, and the gates of the transistors P132 and N132 are all connected to the input terminal of the inverter INV131 (i.e. the application terminal of the signal RNLN). The drains of the transistors P132, P134, P138 and N132, and the gates of the transistors P131 and N131 are all connected to the input terminal of the inverter INV132 (i.e. the application terminal of the signal SNLN). The gate of the transistor P133 is supplied with a signal W1Nx. The gate of the transistor P134 is supplied with a signal W0Nx. The gates of the transistors P137 and P138 are supplied with the signal SAE. The output terminal of the inverter INV131 is connected to the output terminal of the inverted output signal QN. The output terminal of the inverter INV132 is connected to the output terminal of the output signal Q.

In addition, the source of the transistor N131 is connected to the drain of the transistor N133. The source of the transistor N132 is connected to the drain of the transistor N134. The sources of the transistors N133 and N134 are connected to the drain of the transistor N135. The source of the transistor N135 is connected to the ground terminal (i.e. the node set to the ground potential VSS). The gate of the transistor N135 is supplied with the signal SAE.

In addition, the source of the transistor P135 is connected to the power supply terminal. The drain of the transistor P135 is connected to the gate of the transistor N133. The transistor N136 is connected between the application terminal of the input signal INN (negative) and the gate of the transistor N133. The gates of the transistors P135 and N136 are supplied with a signal W1Ny.

In addition, the source of the transistor P136 is connected to the power supply terminal. The drain of the transistor P136 is connected to the gate of the transistor N134. The transistor N137 is connected between the application terminal of the input signal INP (positive) and the gate of the transistor N134. The gates of the transistors P136 and N137 are supplied with a signal W0Ny.

First input terminals of the NAND arithmetic units NAND131 and NAND132 are supplied with the clock signal CP. Note that when the latch function of the sense amplifier 1310 is enabled (LEN_DN=H), the inverter loop 1311 operates as a high-through and low-hold type latch corresponding to the clock signal CP (details will be described later). A second input terminal of the NAND arithmetic unit NAND131 is supplied with the data signal D. A second input terminal of the NAND arithmetic unit NAND132 is supplied with an inverted data signal DN (a logically inverted signal of the data signal D). Note that the output signal of the NAND arithmetic unit NAND131 corresponds to the signal W1Nx. On the other hand, the output signal of the NAND arithmetic unit NAND132 corresponds to the signal W0Nx.

First input terminals of the NAND arithmetic units NAND133 and NAND134 are supplied with the signal LEN_DN. Note that the signal LEN_DN becomes high level when the latch function of the sense amplifier 1310 is enabled, while it becomes low level when the sensing function of the same is enabled (details will be described later). A second input terminal of the NAND arithmetic unit NAND133 is supplied with the signal W1Nx. A second input terminal of the NAND arithmetic unit NAND134 is supplied with the signal W0Nx. Note that the output signal of the NAND arithmetic unit NAND133 corresponds to the signal W1Ny. On the other hand, the output signal of the NAND arithmetic unit NAND134 corresponds to the signal W0Ny.

In the sense amplifier 1310 having the structure described above, the transistors P131 and N131 constitute a CMOS inverter 1311a, while the transistors P132 and N132 constitute a CMOS inverter 1311b.

Note that the output node of the CMOS inverter 1311a (i.e. the drains of the transistors P131 and N131) is connected to the input node of the CMOS inverter 1311b (i.e. the gates of the transistors P132 and N132). In addition, the output node of the CMOS inverter 1311b (i.e. the drains of the transistors P132 and N132) is connected to the input node of the CMOS inverter 1311a (i.e. the gates of the transistors P131 and N131).

In other words, the four transistors (P131, P132, N131, and N132) described above function as the inverter loop 1311 including the two CMOS inverters 1311a and 1311b connected in a loop. Note that not only inverters in a narrow sense but also inverters in a broad sense (NAND and NOR) may be used as logic gates constituting the inverter loop 1311.

In addition, in the sense amplifier 1310 having the structure described above, the transistors N133 and N134 function as a differential pair circuit 1312 connected to the ground nodes of the CMOS inverters 13111a and 1311b (i.e. the sources of the transistors N131 and N132).

Note that the drain (or the source) of the transistor N136 corresponds to the negative input terminal of the sense amplifier 1310. Therefore when the analog switch 1353 is turned on, the ferroelectric capacitors 1321 and 1322 are connected to the drain (or the source) of the transistor N136.

In the same manner, the drain (or the source) of the transistor N137 corresponds to the positive input terminal of the sense amplifier 1310. Therefore when the analog switch 1354 is turned on, the ferroelectric capacitors 1323 and 1324 are connected to the drain (or the source) of the transistor N137.

Note that the ferroelectric capacitors 1321 to 1324 are an example of the nonvolatile device, and any nonvolatile device may be used as long as it has the same function. For example, one of the ferroelectric capacitors 1321 and 1322 may be eliminated, or one of them may be replaced with a normal capacitor. The same is true for the ferroelectric capacitors 323 and 324.

In other words, as a data reading method, it is possible to use capacitive coupling between a ferroelectric element in an non-inverted state and a ferroelectric element in an inverted state, or to use capacitive coupling between a ferroelectric element and other capacitive element.

In addition, for example, it is possible to eliminate the ferroelectric capacitors 1321 and 1322 (or the ferroelectric capacitors 1323 and 1324) and to fix the input signal INP (or INN) to a predetermined reference potential when the sense amplifier 1310 performs the sensing operation.

The transistors P133 and P134, and the transistors P137 and P138 function as a first potential setter 1313 (so-called charge-up circuit), which sets the output nodes of the CMOS inverters 13111a and 1311b to the first potential (i.e. the power supply potential VDD or a high potential equivalent to the same).

The transistors P135 and P136, and the transistors N136 and N137 function as a differential pair control unit 1314, which performs gate control of the differential pair circuit 1312, so as to set the ground nodes of the CMOS inverters 1311a and 1311b to the second potential (i.e. the ground potential VSS or a low potential equivalent to the same).

Note that among a plurality of transistors included in the differential pair control unit 1314, the transistors P135 and P136 correspond to first transistors, which set the gates of the differential pair circuit 1312 to the on-potential (e.g. the power supply potential VDD), while the transistors N136 and N137 correspond to second transistors, which connect and disconnect input signal paths to the gates of the differential pair circuit 1312.

In addition, in this embodiment, unlike the fourth embodiment (FIG. 23) described above, the third transistors (the transistors N118 and N119 in FIG. 23), which set the gates of the differential pair circuit 1312 to the off-potential (e.g. the ground potential VSS), are eliminated. In other words, the function of setting the off-potential is transferred to the NOR arithmetic units 1343 and 1344, which mainly generate the input signals INN and INP.

In this way, the sense amplifier 1310 of this structural example has a structure based on a general sense amplifier, to which the differential pair control unit 1314 is added so as to realize a latch function using the inverter loop 1311. Operations of the nonvolatile latch 1300 and the sense amplifier 1310 used for the same are described in detail below.

<Description of Operation>

Figure 33:
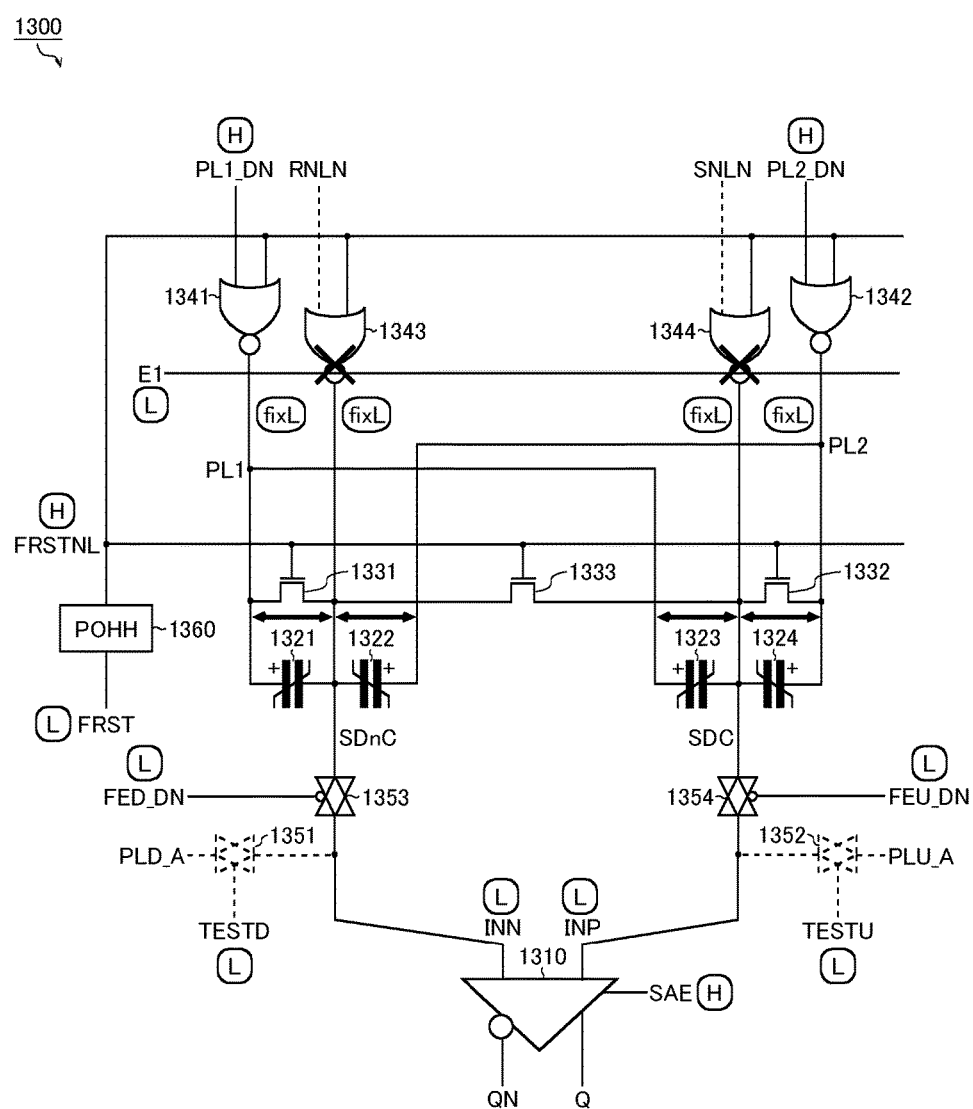
FIG. 33 is a circuit diagram showing a state of the nonvolatile latch when holding data.
Figure 34:
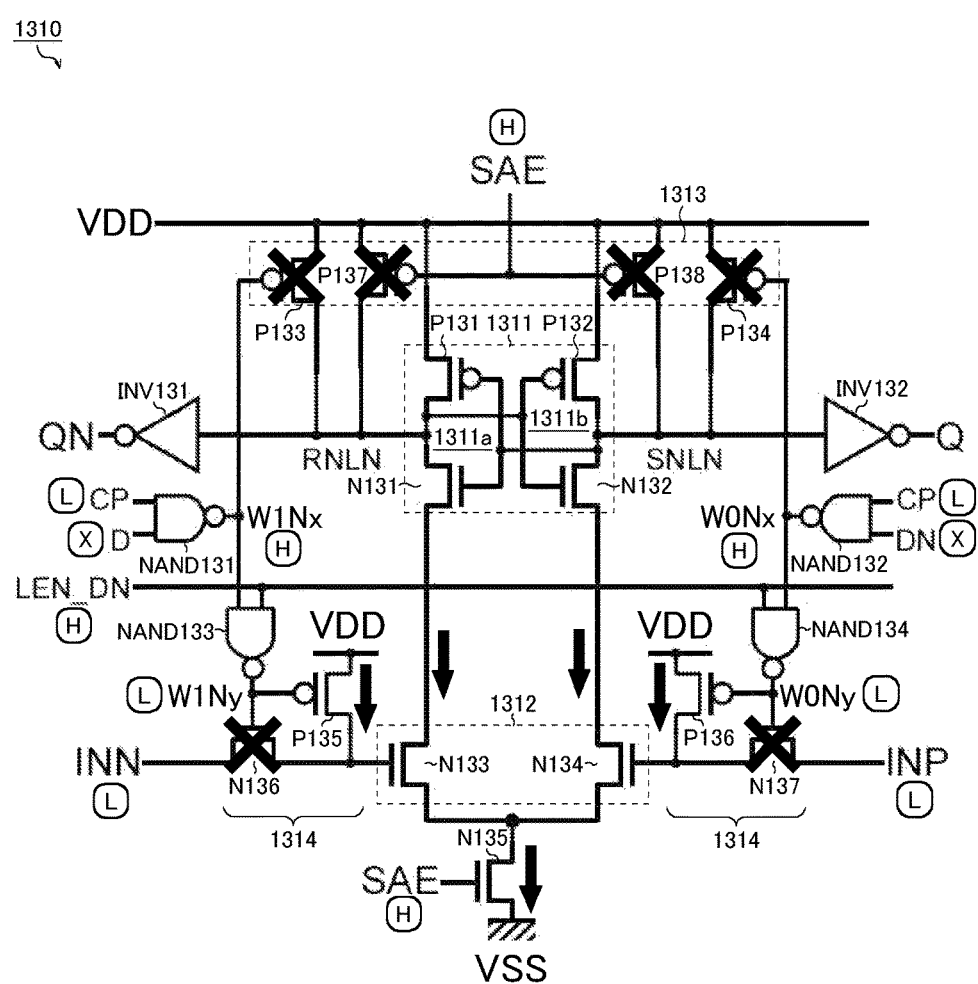
FIG. 34 is a circuit diagram showing a state of the sense amplifier when holding data.

First, operation states when holding data are described with reference to FIGS. 33 and 34. FIGS. 33 and 34 are respectively circuit diagrams showing operation states of the nonvolatile latch 1300 and the sense amplifier 1310 when holding data.

When holding data using the inverter loop 1311 of the sense amplifier 1310, as shown in FIG. 34, the clock signal CP becomes low level, and the signal LEN_DN becomes high level. Therefore, both the signals W1Nx and W0Nx become high level, while both the signals W1Ny and W0Ny become low level. In addition, when holding data, the signal SAE becomes high level.

With the control described above, the transistors N136 and N137, the transistors P133 and P134, and the transistors P137 and P138 are all turned off, while the transistors N133 to N135, and the transistors P135 and P136 are all turned on. In other words, the first potential setter 1313 is disabled, and the differential pair circuit 1312 sets the ground nodes of the CMOS inverters 1311*a* and 1311*b* to the second potential (e.g. the ground potential VSS) based on the gate control by the differential pair control unit 1314.

Therefore the sense amplifier 1310 becomes equivalent to the inverter loop 1311 as a single unit, and hence the data written to the inverter loop 1311 is held. For example, when data "0" is written to the inverter loop 1311, the output signal Q is held at low level, while the inverted output signal QN is held at high level. On the contrary, when data "1" is written to the inverter loop 1311, the output signal Q is held at high level, while the inverted output signal QN is held at low level. In this way, the operation state of FIG. 34 is substantially the same as the operation state of FIG. 25 described above.

On the other hand, as for the entire nonvolatile latch 1300, when holding data, as shown in FIG. 33, the signal E1 becomes low level, and hence both the NOR arithmetic units 1343 and 1344 become the output high impedance state (i.e. the state in which potential of each output terminal is floating). In addition, when holding data, the signal FRSTNL becomes high level. Therefore both terminals of each of the ferroelectric capacitors 1321 to 1324 are short-circuited and fixed to low level (i.e. the ground potential VSS) (PL1=PL2=L, PL1_DN=PL2_DN=H). In this way, it is possible to avoid unintentional voltage application to the ferroelectric capacitors 1321 to 1324, and hence data corruption can be prevented.

In addition, when holding data, as shown in FIG. 33, both the signals FED_DN and FEU_DN become low level. Therefore the analog switches 1353 and 1354 are both turned on, and hence the ferroelectric capacitors 1321 to 1324 are electrically connected to the sense amplifier 1310. As a result, the input signals INN and INP of the sense amplifier 1310 are fixed to low level.

In addition, the signals TESTD and TESTU become high level when characteristic test of the sense amplifier 1310 is performed, while they become low level in other normal operations (when holding data, when writing data, when saving data, and when restoring data). Note that when the signals TESTD and TESTU become high level, the analog switches 1351 and 1352 are turned on, and hence the signals PLD_A and PLU_A for the characteristic test can be input to the sense amplifier 1310.

Figure 35:
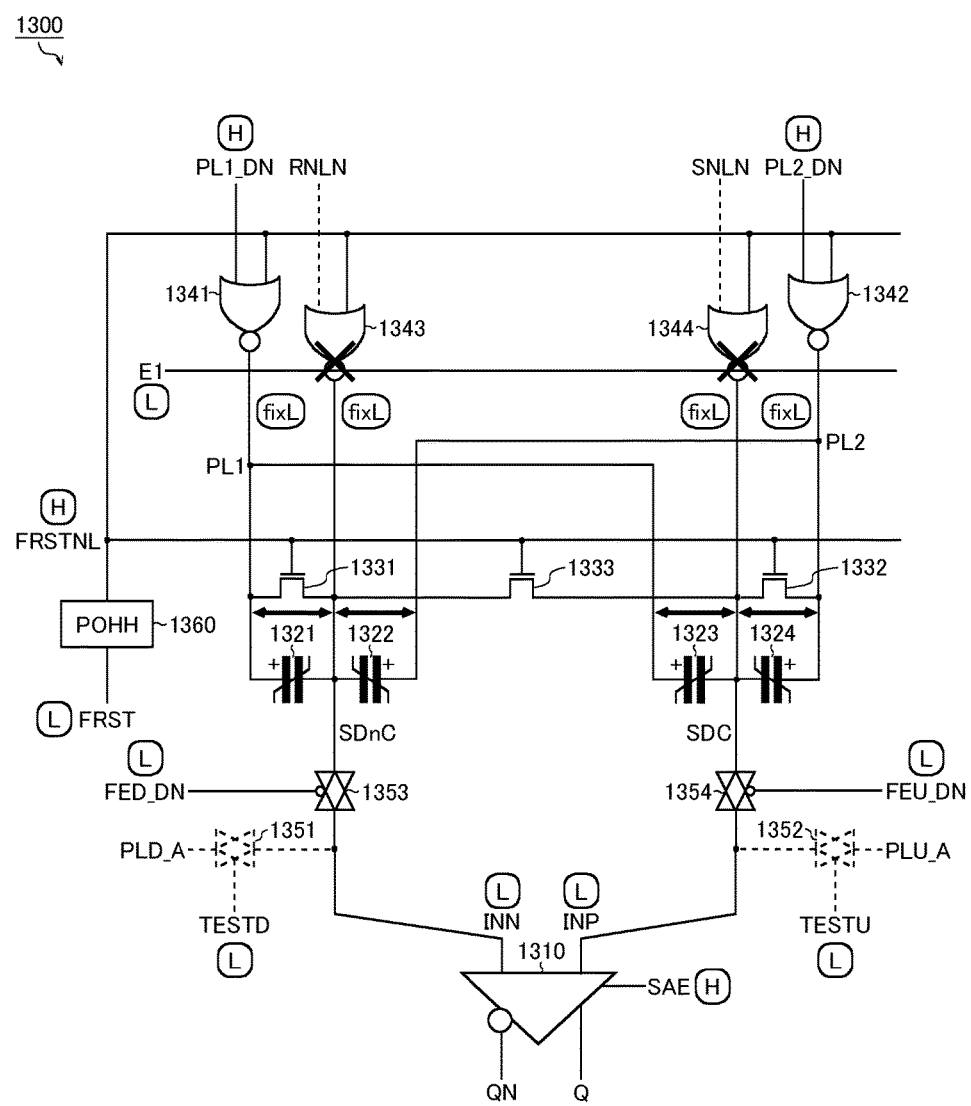
FIG. 35 is a circuit diagram showing a state of the nonvolatile latch when writing "0".
Figure 36:
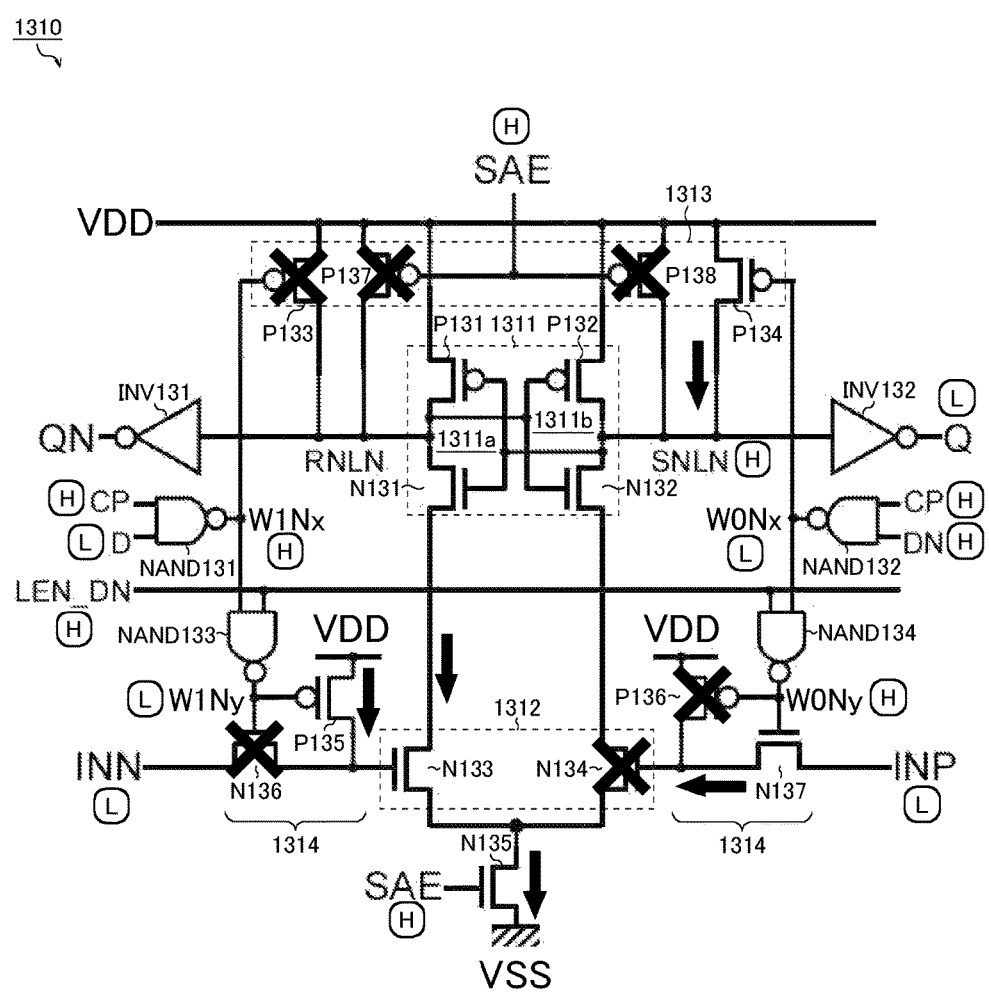
FIG. 36 is a circuit diagram showing a state of the sense amplifier when writing "0".

Next, operation states when writing "0" is described with reference to FIGS. 35 and 36. FIGS. 35 and 36 are circuit diagrams showing operation states of the nonvolatile latch 1300 and the sense amplifier 1310, respectively, when writing "0".

When data "0" is written to the inverter loop 1311 of the sense amplifier 1310, as shown in FIG. 36, both the signal LEN_DN and the clock signal CP become high level. In addition, the data signal D becomes low level, while the inverted data signal DN becomes high level. Therefore the signals W1Nx and W0Ny become high level, and the signals W1Ny and W0Nx become low level. In addition, when writing "0", the signal SAE becomes high level.

With the control described above, the transistors N134 and N136, and the transistors P133 and P136 to P138 are all turned off, while the transistors N133, N135 and N137, and the transistors P134 and P135 are all turned on. In other words, the first potential setter 1313 sets the output node of the CMOS inverter 1311*b* to the first potential (e.g. the power supply potential VDD), and the differential pair circuit 1312 sets the ground node of the CMOS inverter 1311*a* to the second potential (e.g. the ground potential VSS) based on the gate control by the differential pair control unit 1314.

Therefore the output node of the CMOS inverter 1311*b* (i.e. SNLN) is forced to increase to high level, and hence the output signal Q is decreased to low level, while the inverted output signal QN is increased to high level. This state corresponds to a state where the data signal D written to the inverter loop 1311 (i.e. data "0") is output without processing. In this way, the operation state of FIG. 36 is substantially the same as the operation state of FIG. 26 described above.

Note that the operation state of the sense amplifier 1310 when writing "1" is basically the same as that when writing "0", and is a state where the data signal D written to the inverter loop 1311 (i.e. data "1") is output without processing. Specifically, when writing "1", among the signals shown in FIG. 36, the data signal D becomes high level, while the inverted data signal DN becomes low level, and hence ON/OFF states of the transistors N136 and N137, ON/OFF states of the transistors P133 and P134, and ON/OFF states of the transistors P135 and P136 are opposite to those described above. Therefore the output node of the CMOS inverter 1311*a* (i.e. RNLN) is forced to increase to high level and hence the inverted output signal QN is decreased to low level, while the output signal Q is increased to high level. This operation state is substantially the same as the operation state of FIG. 27 described above.

On the other hand, as for the entire nonvolatile latch 1300, when writing "0", as shown in FIG. 35, the signal E1 becomes low level, and hence both the NOR arithmetic units 1343 and 1344 become the output high impedance state (i.e. a state in which potential of each output terminal is floating). In addition, when holding data, the signal FRSTNL becomes high level. Therefore both terminals of each of the ferroelectric capacitors 1321 to 1324 are short-circuited and fixed to low level (i.e. the ground potential VSS) (PL1=PL2=L, PL1_DN=PL2_DN=H). In this way, it is possible to avoid unintentional voltage application to the ferroelectric capacitors 1321 to 1324, and hence data corruption can be prevented.

In addition, when writing "0", as shown in FIG. 35, both the signals FED_DN and FEU_DN become low level. Therefore the analog switches 1353 and 1354 are both turned on, and hence the ferroelectric capacitors 1321 to 1324 are electrically connected to the sense amplifier 1310. As a result, the input signals INN and INP of the sense amplifier 1310 are fixed to low level.

In this way, the operation state of FIG. 35 is completely the same as operation state of FIG. 33 described above. Note that an operation state of the entire nonvolatile latch 1300 when writing "1" is also completely the same as that when writing "0", and hence overlapping description is omitted.

Figure 37:
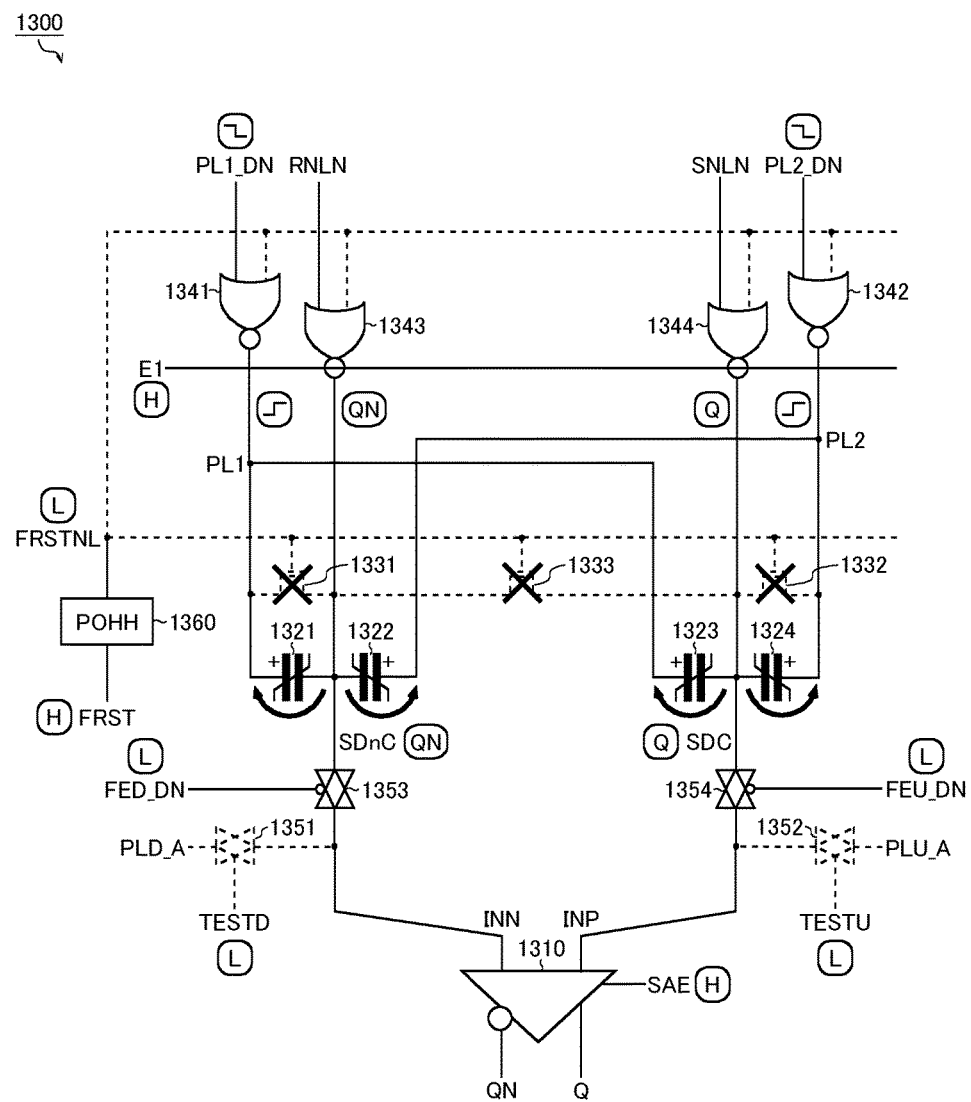
FIG. 37 is a circuit diagram showing a state of the nonvolatile latch when saving data.
Figure 38:
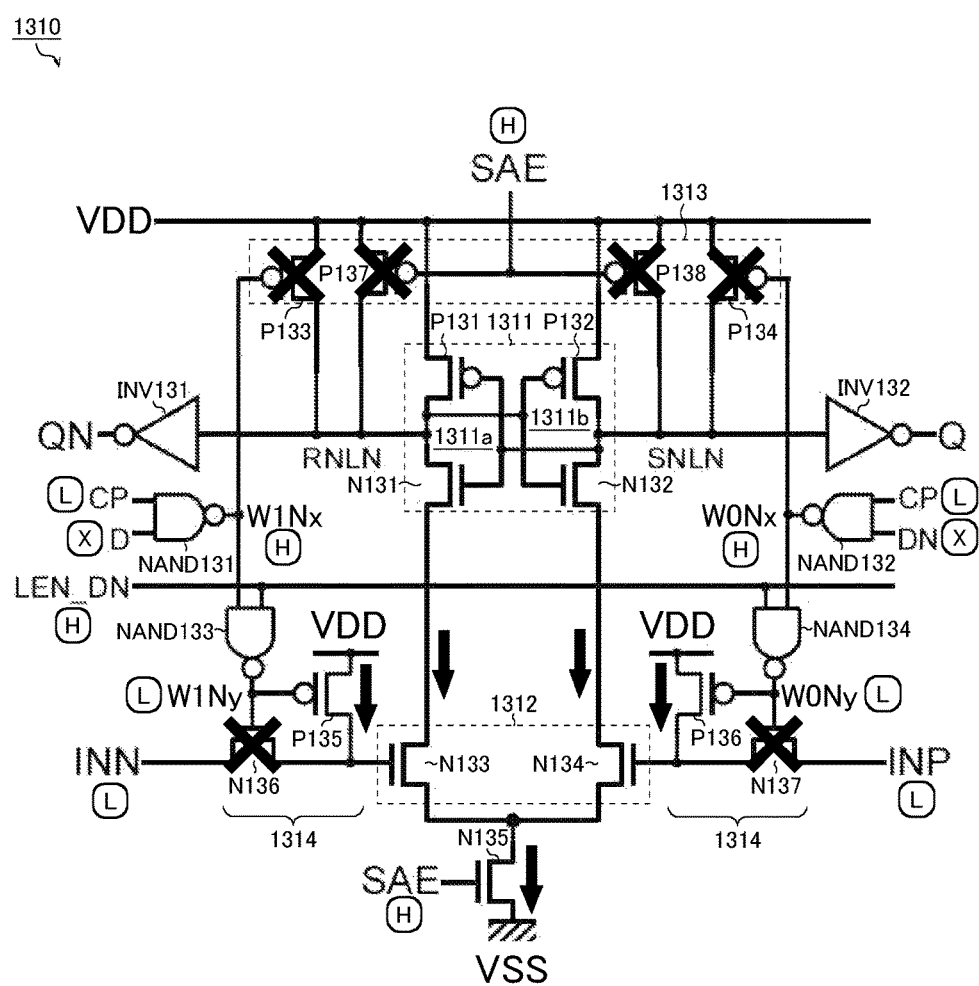
FIG. 38 is a circuit diagram showing a state of the sense amplifier when saving data.

Next, an operation state when saving data is described with reference to FIGS. 37 and 38. FIGS. 37 and 38 are circuit diagrams showing operation states of the nonvolatile latch 1300 and the sense amplifier 1310, respectively, when saving data.

When saving data from the inverter loop 1311 of the sense amplifier 1310, as shown in FIG. 38, the clock signal CP becomes low level, while the signal LEN_DN becomes high level, and hence both the signals W1Nx and W0Nx become high level, while both the signals W1Ny and W0Ny become low level. Note that a process of stopping the clock signal CP should be performed by using a not-shown controller. In addition, when saving data, the signal SAE becomes high level.

With the control described above, the transistors N136 and N137, the transistors P133 and P134, and the transistors P137 and P138 are all turned off, while the transistors N133 to N135, and the transistors P135 and P136 are all turned on. In other words, the first potential setter 1313 is disabled, and the differential pair circuit 1312 sets the ground nodes of the CMOS inverters 1311a and 1311b to the second potential (e.g. the ground potential VSS) based on the gate control by the differential pair control unit 1314.

Therefore the sense amplifier 1310 becomes equivalent to the inverter loop 1311 as a single unit, and hence data written to the inverter loop 1311 is held. For example, when data "0" is written to the inverter loop 1311, the output signal Q is held at low level, while the inverted output signal QN is held at high level. On the contrary, when data "1" is written to the inverter loop 1311, the output signal Q is held at high level, while the inverted output signal QN is held at low level. In this way, the operation state of FIG. 38 is completely the same as the operation state of FIG. 25 or FIG. 34 described above.

On the other hand, as for the entire nonvolatile latch 1300, when saving data, as shown in FIG. 37, the signal FRSTNL becomes low level. Therefore the transistors 1331 to 1333 are all turned off, and both terminals of each of the ferroelectric capacitors 1321 to 1324 all opened (are not short-circuited), and hence the data writing voltage can be applied to each of the ferroelectric capacitors 1321 to 1324.

Note that when saving data, the signal E1 becomes high level, and hence the NOR arithmetic units 1343 and 1344 can respectively output logically inverted signals of the signals RNLN and SNLN (i.e. corresponding to the inverted output signal QN and the output signal Q).

In addition, when saving data, each of the signals PL1_DN and PL2_DN is pulse-driven. As a result, the positive terminals of the ferroelectric capacitors 1321 to 1324 are applied with pulse-like (high level to low level, or low level to high level) signals PL1 and PL2, and hence each of remanent polarization states of the ferroelectric capacitors 1321 to 1324 is set to either an inverted or non-inverted state. This state corresponds to a state where data corresponding to the output signal Q and the inverted output signal QN are written to the ferroelectric capacitors 1321 to 1324.

Figure 39:
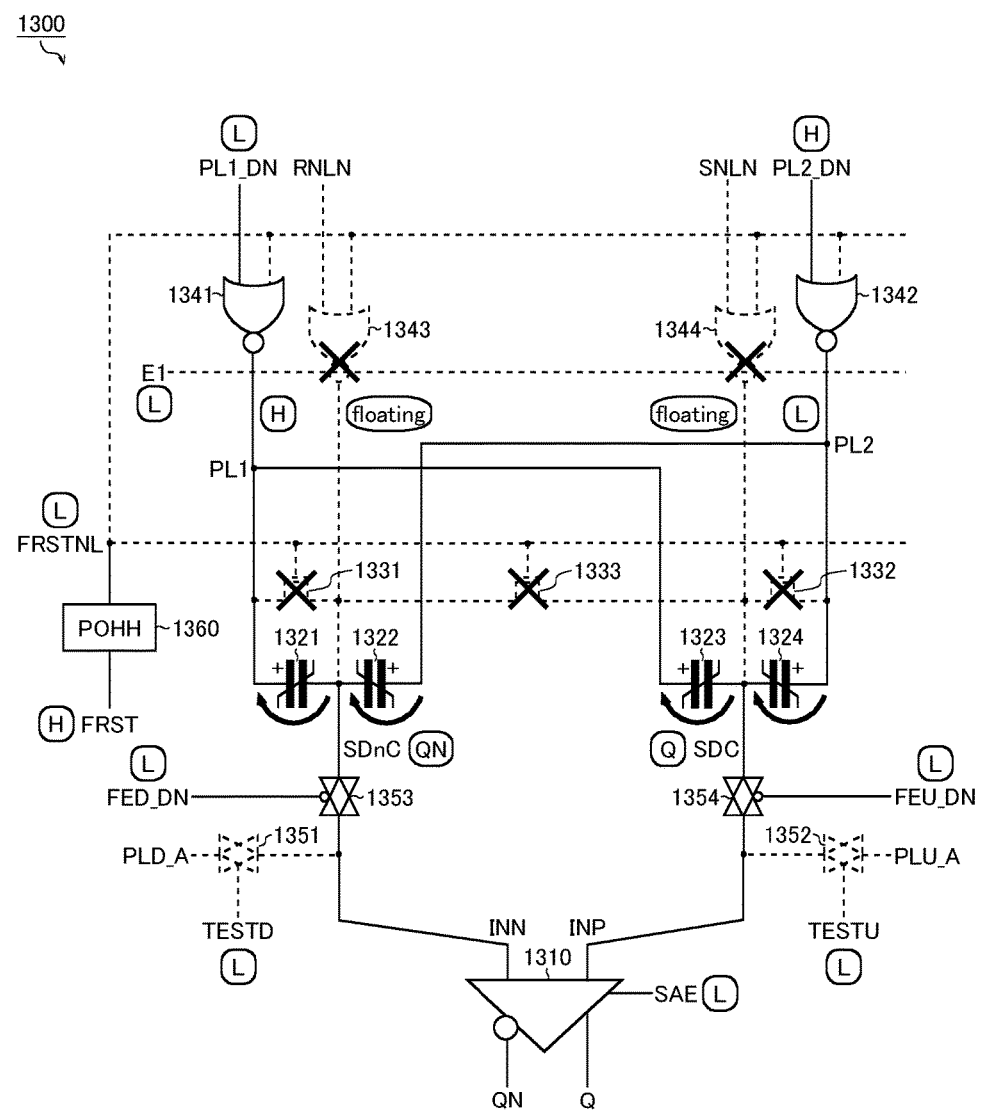
FIG. 39 is a circuit diagram showing a state of the nonvolatile latch when restoring data (precharging).
Figure 40:
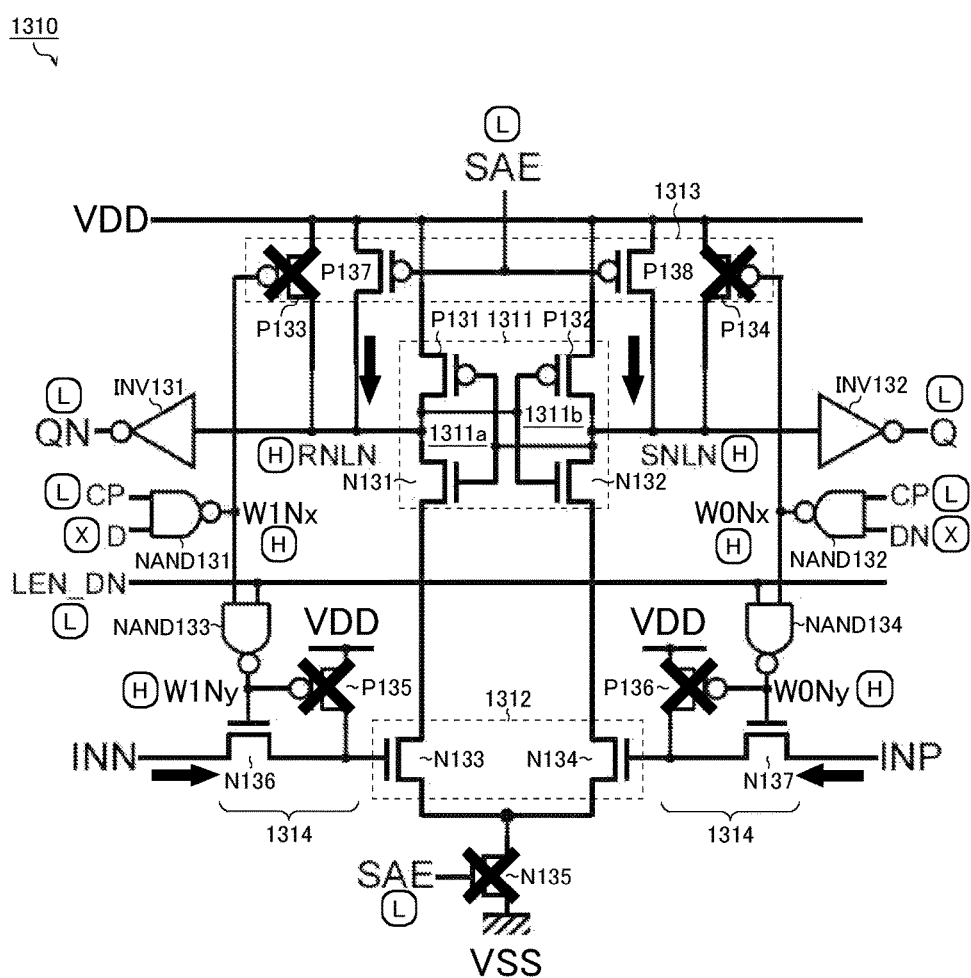
FIG. 40 is a circuit diagram showing a state of the sense amplifier when restoring data (precharging).

Next, an operation state when restoring data (precharging) is described with reference to FIGS. 39 and 40. FIGS. 39 and 40 are circuit diagrams showing operation states of the nonvolatile latch 1300 and the sense amplifier 1310, respectively, when restoring data (precharging).

Prior to the sensing operation of the input signals INN and INP (i.e. corresponding to the signals SDnC and SDC read from the ferroelectric capacitors 1321 to 1324) by the sense amplifier 1310, when precharging the parasitic capacitances accompanying the output nodes of the CMOS inverters 13111a and 1311b, as shown in FIG. 40, both the signal LEN_DN and the clock signal CP become low level. Therefore all the signals W1Nx and W0Nx, and the signals W1Ny and W0Ny become high level. In addition, when precharging, the signal SAE becomes low level.

With the control described above, the transistor N135 and the transistors P133 to P136 are all turned off, while the transistors N133 and N134, transistors N136 and N137, and the transistors P137 and P138 are all turned on. In other words, both the differential pair circuit 1312 and the differential pair control unit 1314 become disabled, and the first potential setter 1313 sets the output nodes of the CMOS inverters 1311a and 1311b to the first potential (e.g. the power supply potential VDD).

Therefore the output nodes of the CMOS inverters 1311a and 1311b (i.e. RNLN and SNLN) are forced to increase to high level, and hence parasitic capacitances accompanying them are precharged. In this case, both the output signal Q and the inverted output signal QN become low level. This operation state is substantially the same as the operation state of FIG. 28.

On the other hand, as for the entire nonvolatile latch 1300, when restoring data (precharging), as shown in FIG. 39, the signal FRSTNL becomes low level. Therefore the transistors 1331 to 1333 are all turned off, and both terminals of each of the ferroelectric capacitors 1321 to 1324 are opened (are not short-circuited), and hence the data reading voltage can be applied to each of the ferroelectric capacitors 1321 to 1324.

Note that when restoring data (precharging), the signal E1 becomes low level, and hence both the NOR arithmetic units 1343 and 1344 become the output high impedance state (i.e. a state in which potential of each output terminal is floating).

In addition, when restoring data (precharging), the signal PL1_DN becomes low level, and the signal PL2_DN becomes high level. As a result, the signal PL1 applied to the positive terminals of the ferroelectric capacitors 1321 and 1323 become high level, and the signal PL2 applied to the positive terminals of the ferroelectric capacitors 1322 and 1324 become low level. With this application of the data reading voltage, the signals SDnC and SDC corresponding to the remanent polarization states of the ferroelectric capacitors 1321 to 1324 appear.

In addition, when restoring data (precharging), both the signals FED_DN and FEU_DN become low level. Therefore the analog switches 1353 and 1354 are both turned on, and hence the input signals INN and INP to be sensed (i.e. the signals SDnC and SDC read from the ferroelectric capacitors 1321 to 1324) are input to the differential pair circuit 1312 of the sense amplifier 1310 when the precharging operation is started.

Figure 41:
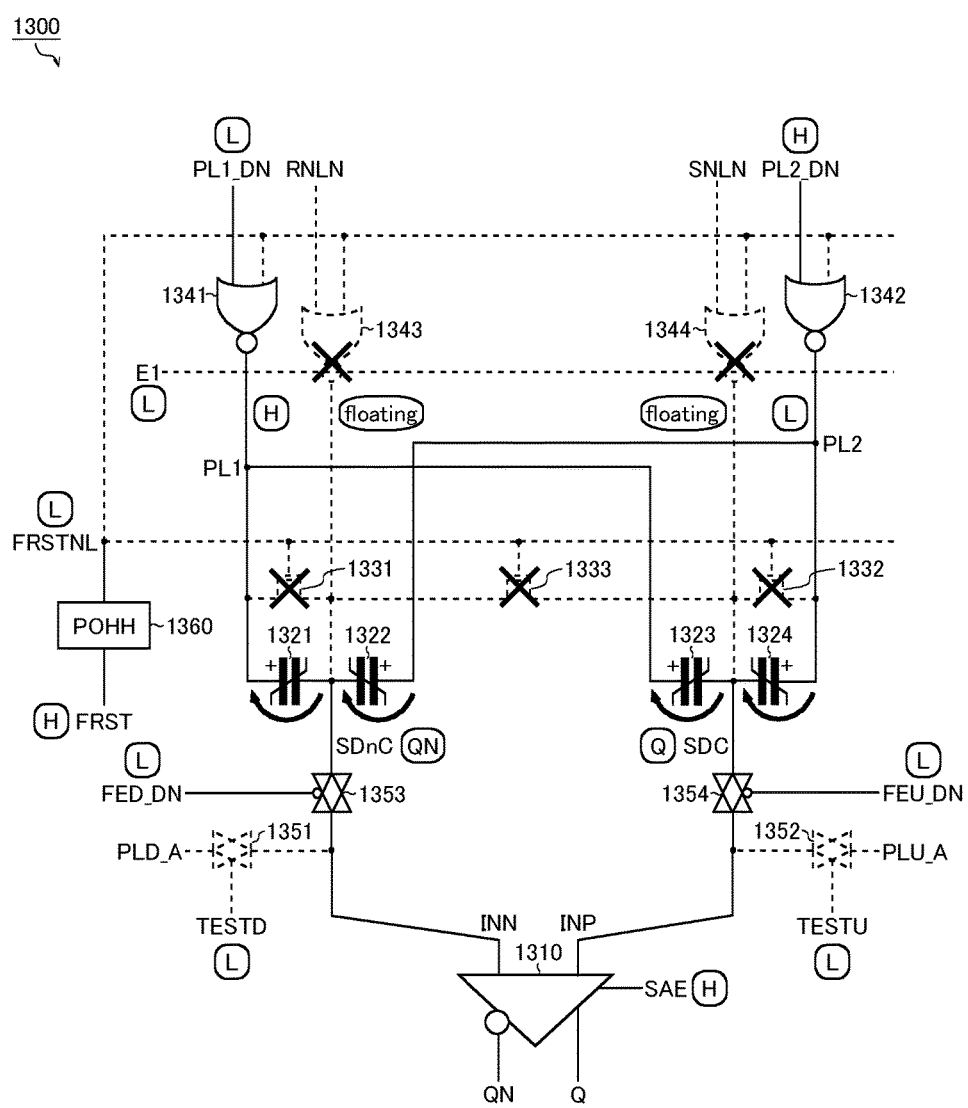
FIG. 41 is a circuit diagram showing a state of the nonvolatile latch when restoring data (sensing).
Figure 42:
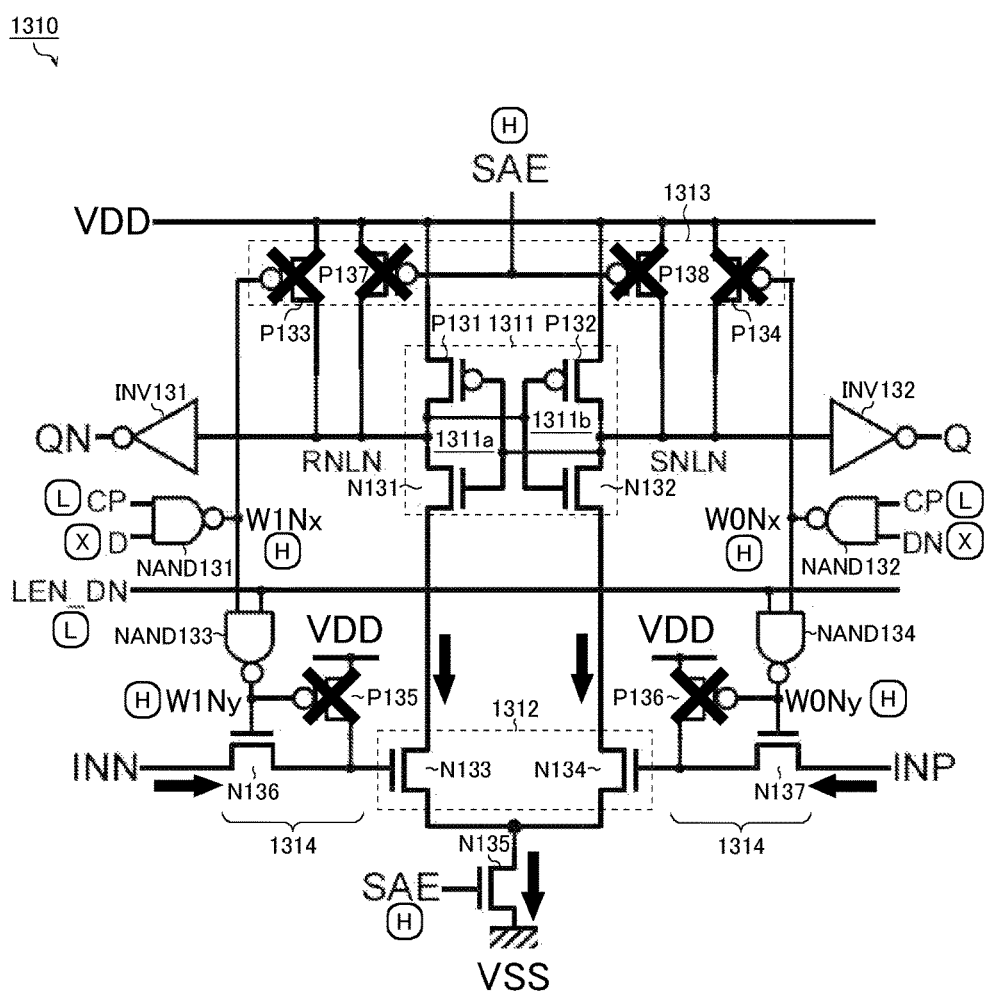
FIG. 42 is a circuit diagram showing a state of the sense amplifier when restoring data (sensing).

Next, an operation state when restoring data (sensing) is described with reference to FIGS. 41 and 42. FIGS. 41 and 42 are circuit diagrams showing operation states of the nonvolatile latch 1300 and the sense amplifier 1310, respectively, when restoring data (sensing).

When sensing the input signals INN and INP using the sense amplifier 1310, as shown in FIG. 42, both the signal LEN_DN and the clock signal CP become low level, and hence all the signals W1Nx and W0Nx, and the signals W1Ny and W0Ny become level. In addition, when sensing, the signal SAE becomes high level.

With the control described above, the transistors P133 to P138 are all turned off, while the transistors N133 to N137 are all turned on. In other words, the differential pair circuit 1312 is enabled, while the first potential setter 1313 and the differential pair control unit 1314 are both disabled.

Therefore current corresponding to the input signals INN and INP flow in the transistors N133 and N134, respectively, and hence a potential difference is generated between the output nodes of each of the CMOS inverters 1311a and 1311b. The inverter loop 1311 amplifies this potential difference so as to determine logic levels of the output signal Q and the inverted output signal QN.

For example, when INP<INN is satisfied, current flowing in the transistor N134 is larger than current flowing in the transistor N133, and hence the output node of the CMOS inverter 1311b has a lower potential than the output node of the CMOS inverter 1311a. When this potential difference is generated, due to the amplifying action of the inverter loop 1311, the output node of the CMOS inverter 1311a having a relatively high potential is increased to high level, while the output node of the CMOS inverter 1311*b* having a relatively low potential is decreased to low level. As a result, the output signal Q becomes high level, while the inverted output signal QN becomes low level. This operation state means that data "1" saved in the ferroelectric capacitors 1321 to 1324 is restored to the inverter loop 1311.

On the contrary, when INP>INN is satisfied, current flowing in the transistor N134 becomes smaller than current flowing in the transistor N133, and hence the output node of the CMOS inverter 1311*b* has a higher potential than the output node of the CMOS inverter 1311*a*. Therefore due to the amplifying action of the inverter loop 1311, the output node of the CMOS inverter 1311*a* having a relatively low potential is decreased to low level, while the output node of the CMOS inverter 1311*b* having a relatively high potential is increased to high level. As a result, the output signal Q becomes low level, and the inverted output signal QN becomes high level. This operation state means that data "0" saved in the ferroelectric capacitors 1321 to 1324 is restored to the inverter loop 1311.

On the other hand, as for the entire nonvolatile latch 1300, when restoring data (sensing), as shown in FIG. 41, the signal FRSTNL becomes low level. Therefore the transistors 1331 to 1333 are all turned off, and both terminals of each of the ferroelectric capacitors 1321 to 1324 are opened (are not short-circuited), and hence the data reading voltage can be applied to each of the ferroelectric capacitors 1321 to 1324.

Note that when restoring data (sensing), the signal E1 becomes low level, and hence both the NOR arithmetic units 1343 and 1344 become the output high impedance state (i.e. a state in which potential of each output terminal is floating).

In addition, when restoring data (sensing), the signal PL1_DN becomes low level, and the signal PL2_DN becomes high level. As a result, the signal PL1 applied to the positive terminals of the ferroelectric capacitors 1321 and 1323 becomes high level, and the signal PL2 applied to the positive terminals of the ferroelectric capacitors 1322 and 1324 becomes low level. With this application of the data reading voltage, the signals SDnC and SDC corresponding to the remanent polarization states of the ferroelectric capacitors 1321 to 1324 appear.

In addition, when restoring data (sensing), both the signals FED_DN and FEU_DN become low level. Therefore the analog switches 1353 and 1354 are both turned on, and hence the differential pair circuit 1312 of the sense amplifier 1310 is supplied with the input signals INN and INP to be sensed (i.e. the signals SDnC and SDC read from the ferroelectric capacitors 1321 to 1324), continuously from start of the precharging operation. In this way, the operation state of FIG. 41 is completely the same as the operation state of FIG. 39 described above.

<Variations>

Note that the nonvolatile latch 1300 described above may be a slave, and an inverter loop to be a master may be disposed at the pre-stage thereof (i.e. on the upstream side of the data input terminals of NAND arithmetic units NAND131 and NAND132), so as to realize a nonvolatile flip-flop.

<Nonvolatile Latch (Third Structural Example)>

Figure 43:
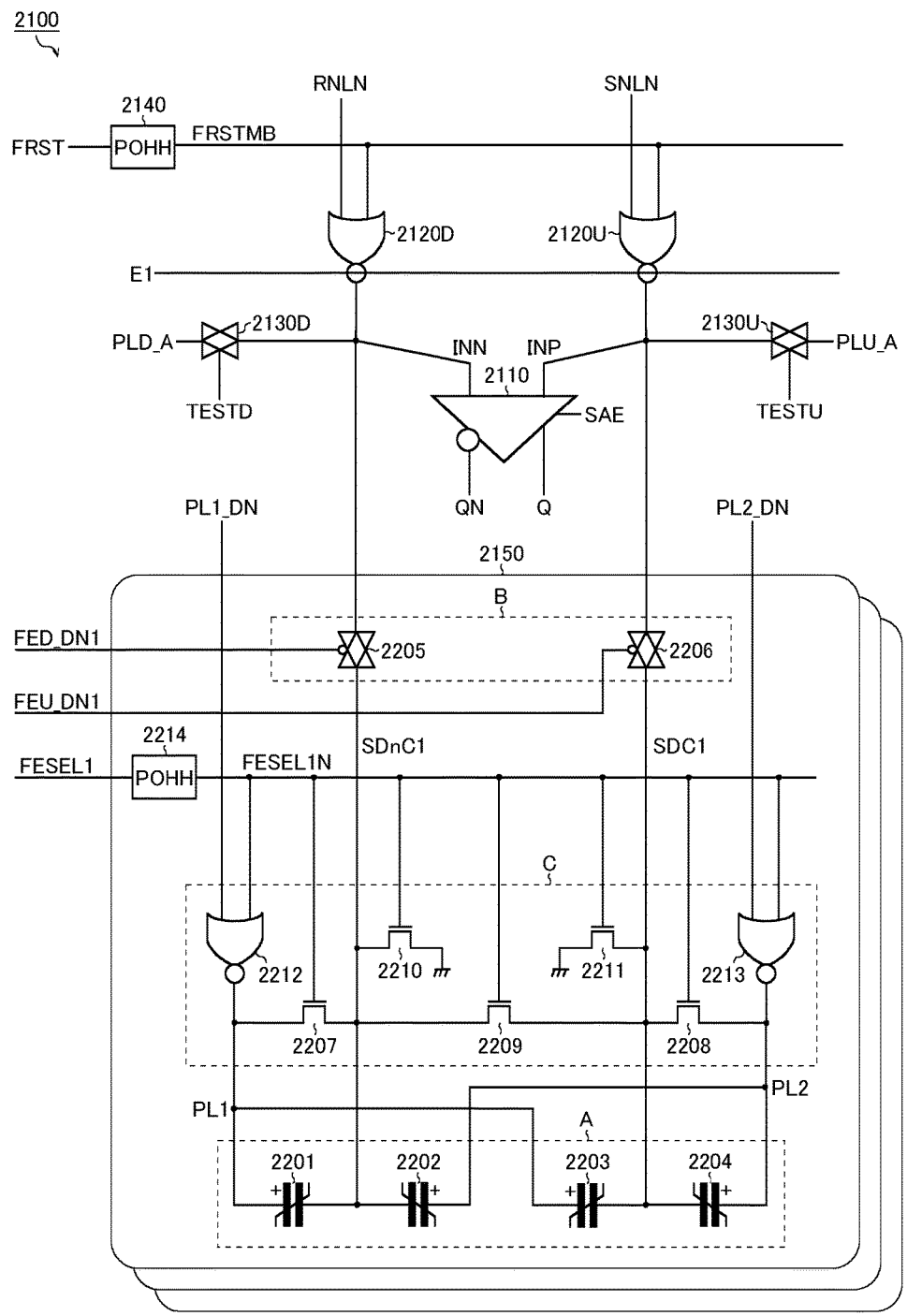
FIG. 43 is a circuit diagram showing an overall structure (a third structural example) of the nonvolatile latch.

FIG. 43 is a circuit diagram showing an overall structure of a nonvolatile latch. A nonvolatile latch 2300 of this structural example is an example of a nonvolatile data holding device, which includes a sense amplifier 2110, NOR arithmetic units 2120D and 2120U, analog switches 2130D and 2130U, a power-on high hold circuit 2140 (hereinafter referred to as a POHH circuit 2140), and a storage area 2150.

The sense amplifier 2110 has a structure of having not only a sensing function of receiving a differential input of the input signals INP and INN so as to generate the output signal Q, but also a latch function of receiving input of the data signal D so as to hold the same (details will be described later).

A first input terminal of the NOR arithmetic unit 2120D is supplied with the signal RNLN. A first input terminal of the NOR arithmetic unit 2120U is supplied with the signal SNLN. Each of second input terminals of the NOR arithmetic units 2120D and 2120U is supplied with a signal FRSTMB. Note that the output terminal of the NOR arithmetic unit 2120D is connected to the negative input terminal of the sense amplifier 2110 (i.e. corresponding to the input terminal of the input signal INN). On the other hand, the output terminal of the NOR arithmetic unit 2120U is connected to the positive input terminal of the sense amplifier 2110 (i.e. corresponding to the input terminal of the input signal INP). In addition, each of the NOR arithmetic units 2120D and 2120U is a 3-state output type (H/L/output HiZ), and the control terminal thereof is supplied with the signal E1.

The analog switch 2130D is connected between the application terminal of the signal PLD_A and the negative input terminal of the sense amplifier 2110, and it is turned on and off according to the signal TESTD input to the control terminal thereof. The analog switch 2130U is connected between the application terminal of the signal PLU_A and the positive input terminal of the sense amplifier 2110, and it is turned on and off according to the signal TESTU input to the control terminal thereof.

The POHH circuit 2140 holds the signal FRSTMB at high level until the power supply potential VDD reaches at least a voltage that enables the CMOS circuit to operate, even if the signal FRST becomes high level (VDD) when the power supply is turned on. Note that the POHH circuit 2140 operates as a normal inverter after the power supply is turned on.

The storage area 2150 is means for storing data signal D held in the inverter loop of the sense amplifier 2110 (i.e. corresponding to a loop structure, details will be described later) in a nonvolatile manner, and it includes ferroelectric capacitors 2201 to 2204, the analog switches 2205 and 2206, N-channel metal oxide semiconductor (MOS) field-effect transistors 2207 to 2211, NOR arithmetic units 2212 and 2213, and the power-on high hold circuit 2214 (hereinafter referred to as a POHH circuit 2214).

A first input terminal of the NOR arithmetic unit 2212 is supplied with the signal PL1_DN. A first input terminal of the NOR arithmetic unit 2213 is supplied with the signal PL2_DN. Each of second input terminals of the NOR arithmetic units 2212 and 2213 is supplied with the signal FESEL1N.

The POHH circuit 2214 holds the signal FESEL1N at high level until the power supply potential VDD reaches at least a voltage that enables the CMOS circuit to operate, even if the signal FESEL1 becomes high level (VDD) when the power supply is turned on, in the same manner as the POHH circuit 2140 described above. After the power supply is turned on, the POHH circuit 2214 operates as a normal inverter.

The output terminal of the NOR arithmetic unit 2212 (i.e. corresponding to the application terminal of the signal PL1) is connected to each of the positive terminals of the ferroelectric capacitors 2201 and 2203. The output terminal of the NOR arithmetic unit 2213 (i.e. corresponding to the output terminal of the signal PL2) is connected to the positive terminals of the ferroelectric capacitors 2202 and 2204.

The analog switch 2205 is connected between the output terminal of the NOR arithmetic unit 2120D or the negative input terminal of the sense amplifier 2110 and the negative terminals of the ferroelectric capacitors 2201 and 2202 (i.e. corresponding to the application terminal of a signal SDnC1), and it is turned on and off according to a signal FED_DN1 inversely input to the control terminal. The analog switch 2206 is connected between the output terminal of the NOR arithmetic unit 2120U or the positive input terminal of the sense amplifier 2110 and the negative terminals of the ferroelectric capacitors 2203 and 2204 (i.e. corresponding to the application terminal of a signal SDC1), and it is turned on and off according to a signal FEU_DN1 inversely input to the control terminal.

The transistor 2207 is connected between the positive terminal and the negative terminal of the ferroelectric capacitor 2201. The transistor 2208 is connected between the positive terminal and the negative terminal of the ferroelectric capacitor 2204. The transistor 2209 is connected between the negative terminals of the ferroelectric capacitors 2201 and 2202 and the negative terminals of the ferroelectric capacitors 2203 and 2204. The transistor 2210 is connected between the ground terminal and the negative terminals of the ferroelectric capacitors 2201 and 2202. The transistor 2211 is connected between the ground terminal and the negative terminals of the ferroelectric capacitors 2203 and 2204. Note that each of the gates of the transistors 2207 to 2211 is supplied with the signal FESEL1N.

In the storage area 2150 having the structure described above, the ferroelectric capacitors 2201 to 2204 work as a nonvolatile storing portion A, which stores the data signal D held in the inverter loop (not shown) of the sense amplifier 2110 in a nonvolatile manner by using hysteresis characteristics thereof.

In addition, the analog switches 2205 and 2206 work as a circuit separating portion B, which electrically separates the inverter loop (not shown) of the sense amplifier 2110 from the nonvolatile storing portion A.

In addition, the transistors 2207 to 2211, and the NOR arithmetic units 2212 and 2213 work as a circuit grounding portion C, which short-circuits both terminals of each of the ferroelectric elements 2201 to 2204 and grounds the positive terminals and the negative terminals of the ferroelectric elements 2201 to 2204.

Note that, although details will be described later, when the analog switches 2205 and 2206 are both turned off so that the sense amplifier 2110 and the nonvolatile storing portion A are electrically separated, the signal FESEL1N is set to high level, and all the transistors 2207 to 2211 are turned on. In addition, in this case, the signals PL1_DN and PL2_DN are both set to high level, and the signals PL1 and PL2 are both set to low level.

On the other hand, when both the analog switches 2205 and 2206 are turned on so that the sense amplifier 2110 and the nonvolatile storing portion A are electrically connected to each other, the signal FESEL1N is set to low level, and all the transistors 2207 to 2211 are turned off. In addition, in this case, the signals PL1_DN and PL2_DN are pulse-driven, so that the writing voltage or the reading voltage is applied as the signals PL1 and PL2.

By disposing this circuit grounding portion C, it is possible not only to short-circuit both terminals of each of the ferroelectric capacitors 2201 to 2204 but also to ground the positive terminals and the negative terminals of the ferroelectric capacitors 2201 to 2204, and hence the data signal D stored in a nonvolatile manner can be more securely protected. For example, when the power supply is turned on, even if an unexpected voltage is applied to the application terminal of the signal PL1 or PL2, no voltage is applied between both ends of each of the ferroelectric capacitors 2201 to 2204, and hence unintentional data breakage (data corruption) can be prevented.

In addition, when holding an m-bit (m≥2) data signal D, m-bit storage areas 2150(*) (*=1, 2, . . . m) are prepared in parallel, and the single sense amplifier 2110 is shared by them. In other words, the nonvolatile storing portion A, the circuit separating portion B, and the circuit grounding portion C are disposed for each m-bit storage areas 2150(*). Note that the signals PL1_DN and PL2_DN are commonly input to all bits of storage areas 2150(*). On the other hand, a signal FED_DN*, a signal FEU_DN*, and a signal FESEL* are input to each bit of the storage areas 2150(*).

In this way, with the structure in which the m-bit storage areas 2150(*) share the single sense amplifier, a circuit area of a nonvolatile latch 2100 can be reduced.

Note that this structure can also be understood as a structure in which a bit line connected to the sense amplifier 2110 (i.e. corresponding to an input line of the signals PL1 and PL2) is connected to a plurality of memory cells (i.e. corresponding to the nonvolatile storing portion A).

When seeing the nonvolatile storing portion A as a memory cell, there is a merit that the ferroelectric capacitors 2201 to 2204 can be driven by a low voltage because they are driven in a complementary manner, and hence the power supply circuit and power consumption can be reduced. In particular, it is very important that the nonvolatile latch 2100 can operate by the same low voltage (approximately 1.5 V) as logic circuits because it is mixedly disposed in logic circuits as a precondition.

<Sense Amplifier>

Figure 44:
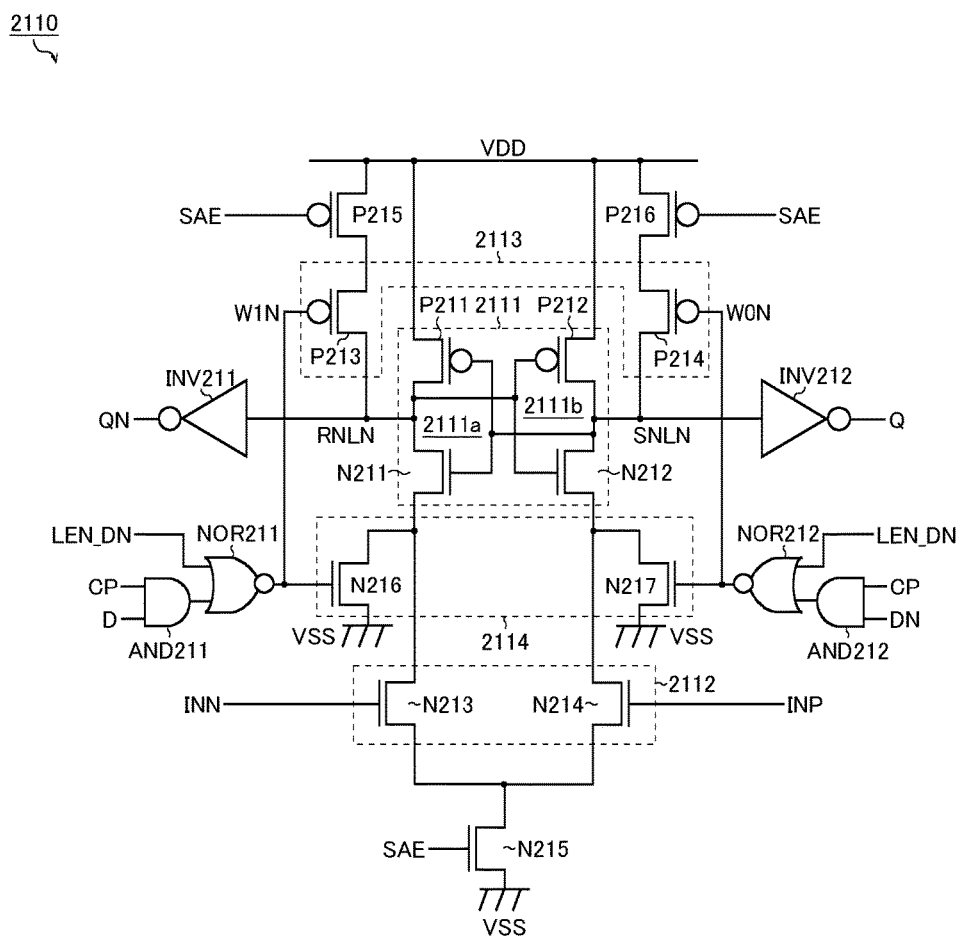
FIG. 44 is a circuit diagram showing a structural example of the sense amplifier.

FIG. 44 is a circuit diagram showing a structural example of the sense amplifier 2110. The sense amplifier 2110 of this structural example includes N-channel MOS field-effect transistors N211 to N217, P-channel MOS field-effect transistors P211 to P216, inverters INV211 and INV212, AND arithmetic units AND211 and AND212, and NOR arithmetic units NOR211 and NOR212.

The sources of the transistors P211 and P212 are connected to the power supply terminal (i.e. the node set to the power supply potential VDD). The drains of the transistors P211, P213, and N211, and the gates of the transistors P212 and N212 are connected to the input terminal of the inverter INV211 (i.e. the application terminal of the signal RNLN). The drains of the transistors P212, P214, and N212, and the gates of the transistors P211 and N211 are connected to the input terminal of the inverter INV212 (i.e. the application terminal of the signal SNLN). The sources of the transistors P213 and P214 are connected to the drains of the transistors P215 and P216. The sources of the transistors P215 and P216 are connected to the power supply terminal. The gate of the transistor P213 is supplied with the signal W1N. The gate of the transistor P214 is supplied with the signal W0N. The gates of the transistors P215 and P216 are supplied with the signal SAE. The output terminal of the inverter INV211 is connected to the output terminal of the inverted output signal QN. The output terminal of the inverter INV212 is connected to the output terminal of the output signal Q.

The source of the transistor N211 is connected to the drains of the transistors N213 and N216. The source of the transistor N212 is connected to the drains of the transistors N214 and N217. The sources of the transistors N213 and N214 are connected to the drain of the transistor N215. The sources of the transistors N215 to N217 are connected to the ground terminal (i.e. the node set to the ground potential VSS). The gate of the transistor N213 is supplied with the input signal INN (negative). The gate of the transistor N214 is supplied with the input signal INP (positive). The gate of the transistor N215 is supplied with the signal SAE. The gate of the transistor N216 is supplied with the control signal W1N. The gate of the transistor N217 is supplied with the signal W0N.

First input terminals of the AND arithmetic units AND211 and AND212 are supplied with the clock signal CP. Note that when the latch function of the sense amplifier 2110 is enabled (LEN_DN=L), an inverter loop 2111 operates as a high-through and low-hold type latch responding to the clock signal CP (details will be described later). A second input terminal of the AND arithmetic unit AND211 is supplied with the data signal D. A second input terminal of the AND arithmetic unit AND212 is supplied with the inverted data signal DN (i.e. the logically inverted signal of the data signal D).

First input terminals of the NOR arithmetic units NOR211 and NOR212 are supplied with the signal LEN_DN. The signal LEN_DN becomes low level when the latch function of the sense amplifier 2110 is enabled, while it becomes high level when the sensing function of the same is enabled (details will be described later). A second input terminal of the NOR arithmetic unit NOR211 is supplied with the output signal of the AND arithmetic unit AND211. A second input terminal of the NOR arithmetic unit NOR212 is supplied with the output signal of the AND arithmetic unit AND212. Note that the output signal of the NOR arithmetic unit NOR211 corresponds to the signal W1N. On the other hand, the output signal of the NOR arithmetic unit NOR212 corresponds to the signal W0N.

In the sense amplifier 2110 having the structure described above, the transistors P211 and N211 constitute a CMOS inverter 2111a, while the transistors P212 and N212 constitute a CMOS inverter 2111b.

Note that the output node of the CMOS inverter 2111a (i.e. the drains of the transistors P211 and N211) is connected to the input node of the CMOS inverter 2111b (i.e. the gates of the transistors P212 and N212). In addition, the output node of the CMOS inverter 2111b (i.e. the drains of the transistors P212 and N212) is connected to the input node of the CMOS inverter 2111a (i.e. the gates of the transistors P211 and N211).

In other words, the four transistors (P211, P212, N211, and N212) described above function as the inverter loop 2111 including the two CMOS inverters 2111a and 2111b connected in a loop. Note that not only inverters in a narrow sense but also inverters in a broad sense (NAND and NOR) may be used as the logic gates constituting the inverter loop 2111.

In addition, in the sense amplifier 2110 having the structure described above, the transistors N213 and N214 function as a differential pair circuit 2112 connected to the ground nodes of the CMOS inverters 2111a and 2111b (i.e. the sources of the transistors N211 and N212).

The gate of the transistor N213 corresponds to the negative input terminal of the sense amplifier 2110. Therefore when the analog switch 2205 is turned on, the ferroelectric capacitors 2201 and 2202 are connected to the gate of the transistor N213.

In the same manner, the gate of the transistor N214 corresponds to the positive input terminal of the sense amplifier 2110. Therefore when the analog switch 2206 is turned on, the ferroelectric capacitors 2203 and 2204 are connected to the gate of the transistor N214.

Note that the ferroelectric capacitors 2201 to 2204 are an example of the nonvolatile device, and any nonvolatile device can be used as long as it has the same function. For example, one of the ferroelectric capacitors 2201 and 2202 may be eliminated, or one of them may be replaced with a normal capacitor. The same is true for the ferroelectric capacitors 2203 and 2204.

In other words, as a data reading method, it is possible to use capacitive coupling between a ferroelectric element in an non-inverted state and a ferroelectric element in an inverted state, or to use capacitive coupling between a ferroelectric element and other capacitive element.

In addition, for example, the ferroelectric capacitors 2201 and 2202 (or the ferroelectric capacitors 2203 and 2204) may be eliminated, and the input signal INP (or INN) may be fixed to a predetermined reference potential when the sense amplifier 2110 performs the sensing operation.

The transistors P213 and P214 function as a first potential setter 2113 (so-called charge-up circuit), which sets the output nodes of the CMOS inverters 2111a and 2111b to the first potential (i.e. the power supply potential VDD or a high potential equivalent to the same).

The transistors N216 and N217 function as a second potential setter 2114, which sets the ground nodes of the CMOS inverters 2111a and 2111b to the second potential (i.e. the ground potential VSS or a low potential equivalent to the same).

In this way, the sense amplifier 2110 of this structural example has a structure based on a general sense amplifier, to which the second potential setter 2114 is added so as to realize a latch function using the inverter loop 2111.

Note that in the sense amplifier 2110 of this structural example, the NMOS differential pair type is exemplified as a circuit type of the differential pair circuit 2112, but this can be changed to the PMOS differential pair type. In this case, the differential pair circuit constituted of the P-channel MOS field-effect transistors is connected to the power supply node of the inverter loop 2111, and polarity inversion of the entire circuit (NMOS to PMOS, VDD to VSS, and logical inversion of various control signals) is performed.

Operations of the nonvolatile latch 2100 and the sense amplifier 2110 used for the same are described below in detail.

<Description of Operation>

Figure 45:
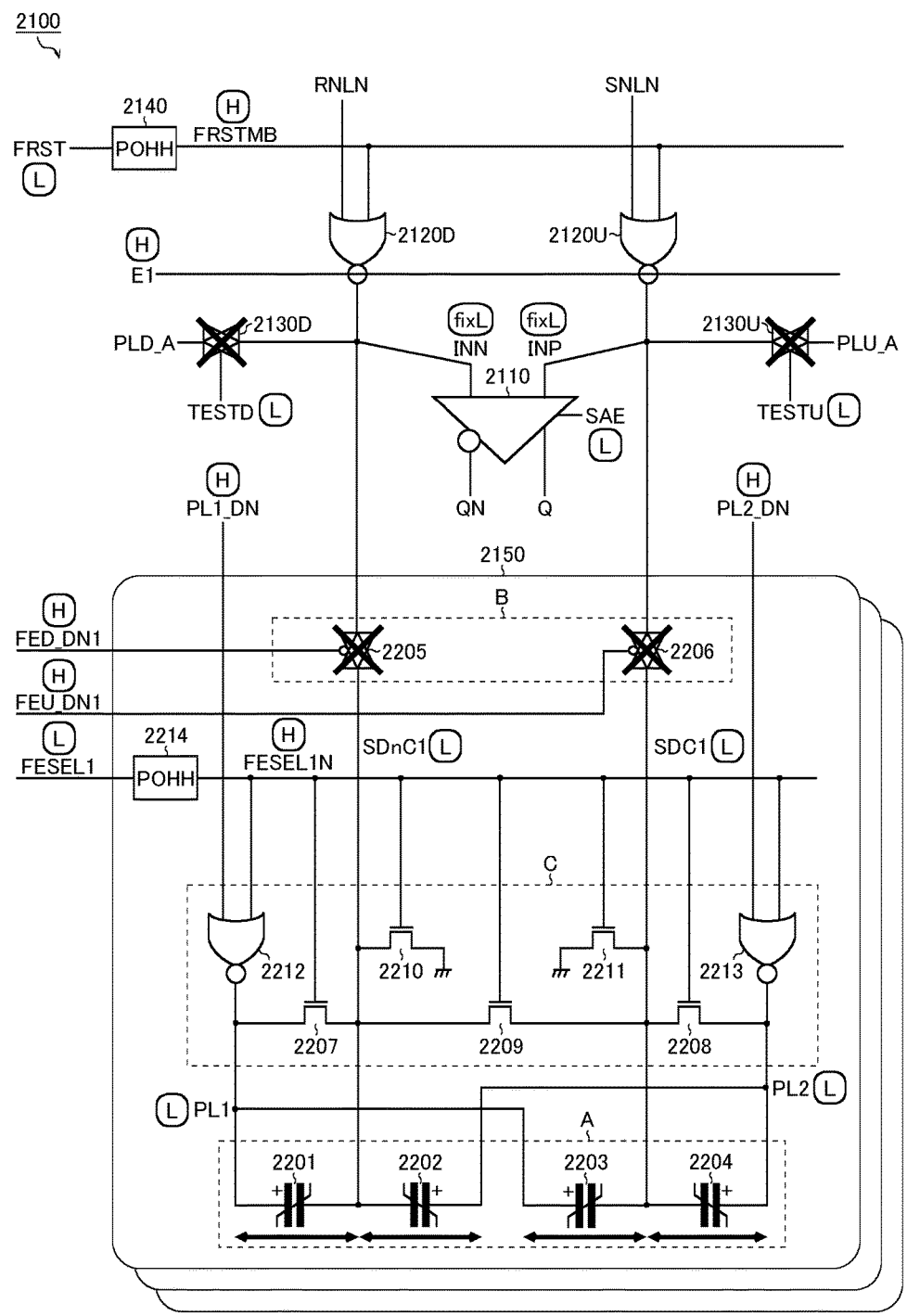
FIG. 45 is a circuit diagram showing a state of the nonvolatile latch when holding data.
Figure 46:
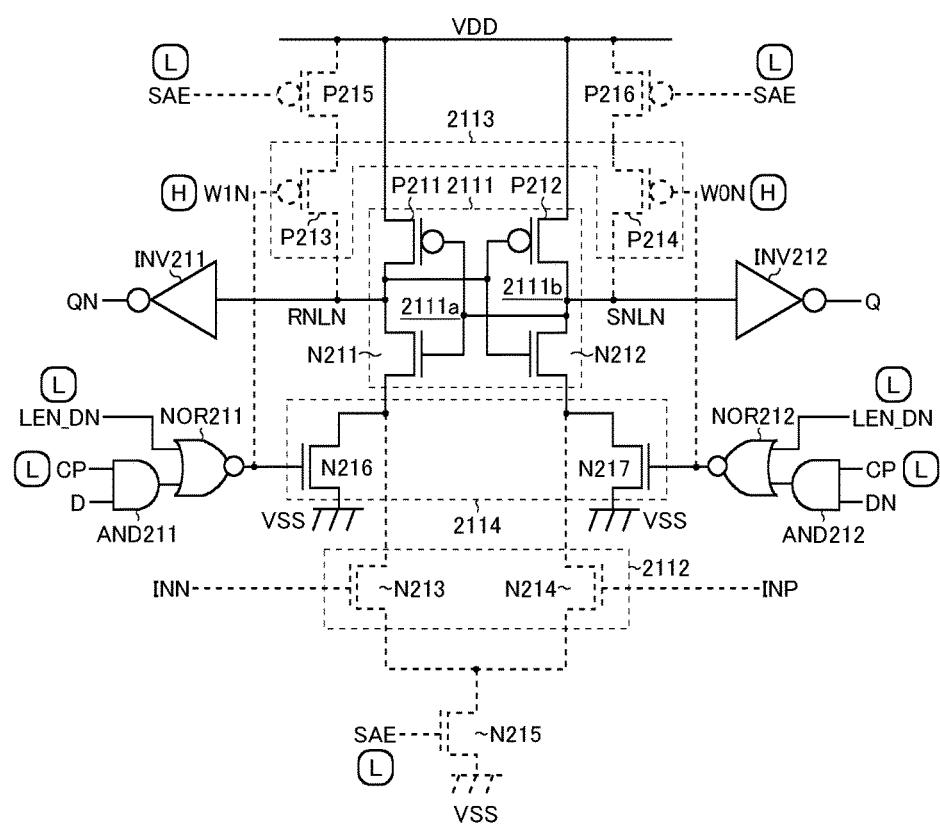
FIG. 46 is a circuit diagram showing a state of the sense amplifier when holding data.

First, an operation state when holding data is described with reference to FIGS. 45 and 46. FIGS. 45 and 46 are circuit diagrams showing operation states of the nonvolatile latch 2100 and the sense amplifier 2110, respectively, when holding data.

When holding data using the inverter loop 2111 of the sense amplifier 2110, as shown in FIG. 46, both the signal LEN_DN and the clock signal CP become low level, and hence both the signals W1N and W0N become high level. In addition, when holding data, the signal SAE becomes low level.

With the control described above, the transistor N215, and the transistors P213 and P214 are all turned off, while the transistors N216 and N217, and the transistors P215 and P216 are all turned on. In other words, both the differential pair circuit 2112 and the first potential setter 2113 are disabled, and the second potential setter 2114 sets the ground nodes of the CMOS inverters 2111a and 2111b to the second potential (e.g. the ground potential VSS).

Therefore the sense amplifier 2110 becomes equivalent to the inverter loop 2111 as a single unit, and hence data written to the inverter loop 2111 is held. For example, when data "0" is written to the inverter loop 2111, the output signal Q is held at low level, while the inverted output signal QN is held at high level. On the contrary, when data "1" is written to the inverter loop 2111, the output signal Q is held at high level, while the inverted output signal QN is held at low level.

On the other hand, as for the entire nonvolatile latch 2100, when holding data, as shown in FIG. 45, both the signals FRSTMB and E1 become high level. Therefore both the input signals INN and INP of the sense amplifier 2110 are fixed to low level (i.e. the ground potential VSS) (INN=INP=L).

In addition, when holding data, both the signals FED_DN1 and FEU_DN1 become high level. Therefore the analog switches 2205 and 2206 are turned off, and the ferroelectric capacitors 2201 to 2204 are electrically separated from the sense amplifier 2110.

In addition, when holding data, all the signals PL1_DN and PL2_DN, and the signal FESEL1N become high level. Therefore all the transistors 2207 to 2211 are turned on, and both the signals PL1 and PL2 become low level. Therefore both terminals of each of the ferroelectric capacitors 2201 to 2204 are short-circuited, and the positive terminals and the negative terminal are all fixed to low level (i.e. the ground potential VSS) (PL1=PL2=L, SDnC1=SDC1=L).

In particular, the signals SDnC1 and SDC can be fixed to the ground potential by turning on the transistors 2210 and 2211, and hence unintentional voltage application to the ferroelectric capacitors 2201 to 2204 can be avoided so that data breakage (data corruption) can be more securely prevented.

However, considering that the NOR arithmetic units 2212 and 2213 set the signals PL1 and PL2 to low level so that the positive terminals of the ferroelectric capacitors 2201 to 2204 are fixed to the ground potential, the transistors 2210 and 2211 are not essential for the circuit grounding portion C.

In addition, the signals TESTD and TESTU become high level when characteristic test of the sense amplifier 2110 is performed, while they become low level in other normal operations (when holding data, when writing data, when saving data, and when restoring data). Note that when the signals TESTD and TESTU become high level, the analog switches 2130D and 2130U are turned on, and hence the signals PLD_A and PLU_A for the characteristic test can be input to the sense amplifier 2110.

Figure 47:
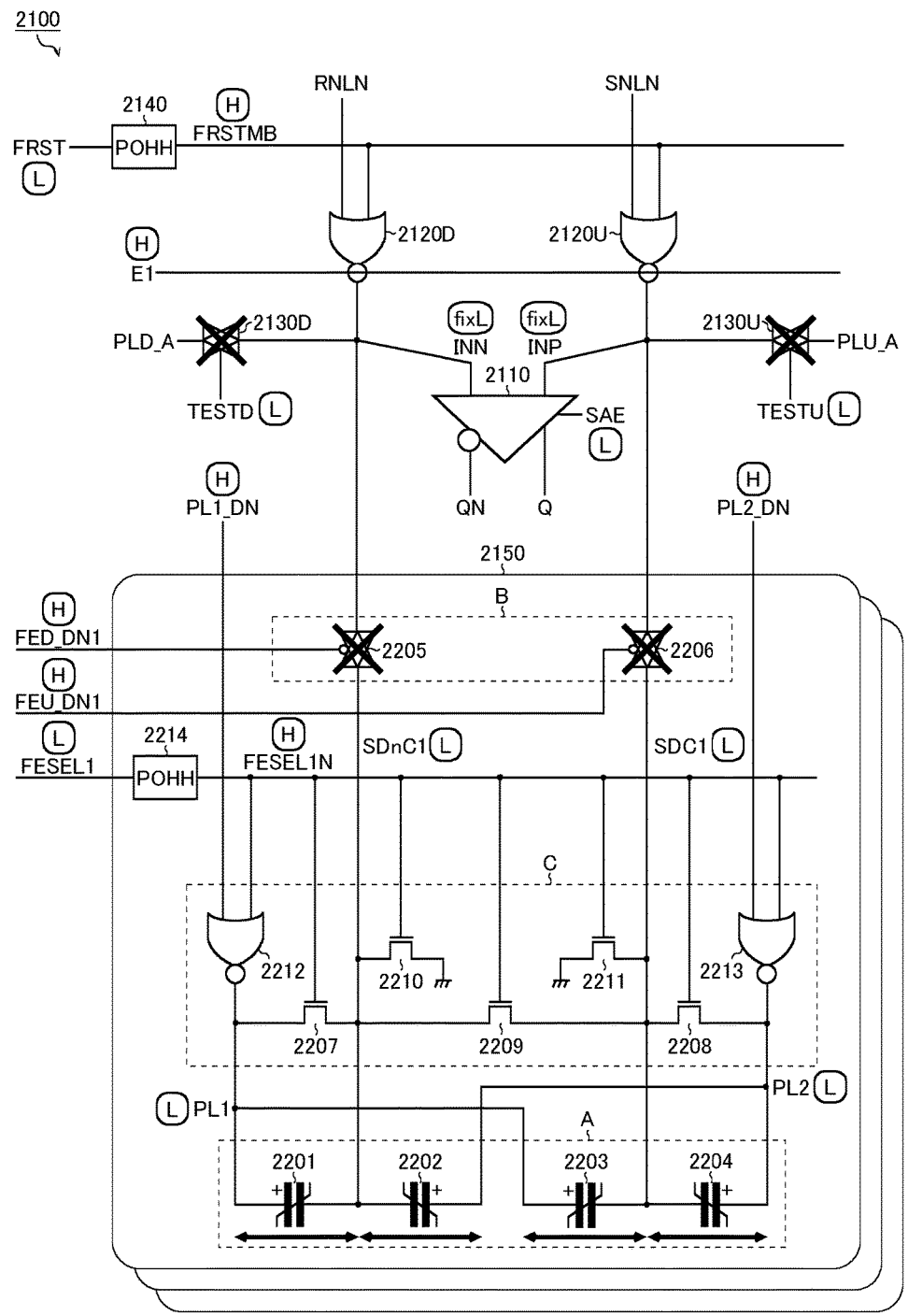
FIG. 47 is a circuit diagram showing a state of the nonvolatile latch when writing "0".
Figure 48:
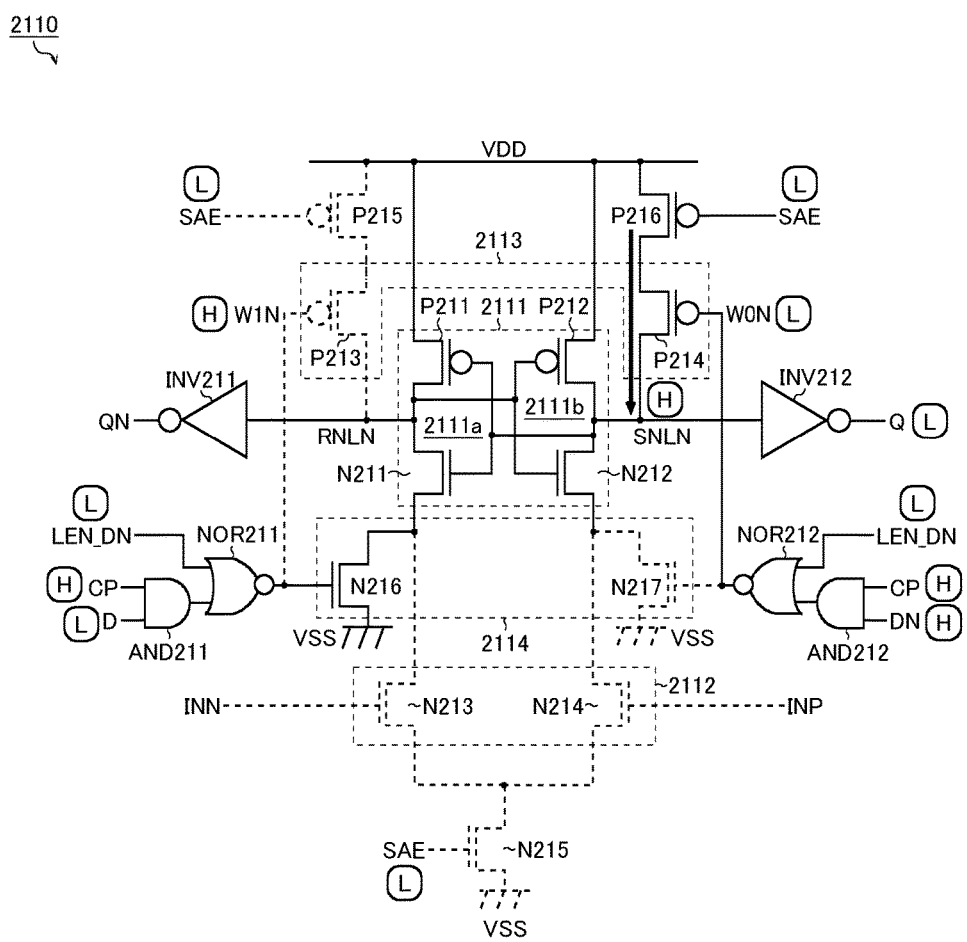
FIG. 48 is a circuit diagram showing a state of the sense amplifier when writing "0".

Next, an operation state when writing "0" is described with reference to FIGS. 47 and 48. FIGS. 47 and 48 are circuit diagrams showing operation states of the nonvolatile latch 2100 and the sense amplifier 2110, respectively, when writing "0".

When data "0" is written to the inverter loop 2111 of the sense amplifier 2110, as shown in FIG. 48, both the signal LEN_DN and the data signal D become low level, while the clock signal CP and the inverted data signal DN become high level. Therefore the signal W1N becomes high level, and the signal W0N becomes low level. In addition, when writing "0", the signal SAE becomes low level.

With the control described above, the transistors N215 and N217, and the transistor P213 are all turned off, while the transistors P214 to P216 and the transistor N216 are all turned on. In other words, the differential pair circuit 2112 is disabled, and the first potential setter 2113 sets the output node of the CMOS inverter 2111b (i.e. SNLN) to the first potential (e.g. the power supply potential VDD), while the second potential setter 2114 sets the ground node of the CMOS inverter 2111a to the second potential (e.g. the ground potential VSS).

Therefore the output node of the CMOS inverter 2111b (i.e. SNLN) is forced to increase to high level, and hence the output signal Q is decreased to low level, while the inverted output signal QN is increased to high level. This state corresponds to a state where the data signal D written to the inverter loop 2111 (i.e. data "0") is output without processing.

Note that an operation state of the sense amplifier 2110 when writing "1" is basically the same as that when writing "0", and is a state where the data signal D written to the inverter loop 2111 (i.e. data "1") is output without processing. Specifically, when writing "1", among the signals shown in FIG. 48, the data signal D becomes high level, while the inverted data signal DN becomes low level, and hence ON/OFF states of the transistors N216 and N217, and ON/OFF states of the transistors P213 and P214 are opposite to those described above. Therefore the output node of the CMOS inverter 2111a (i.e. RNLN) is forced to increase to high level, and hence the inverted output signal QN is decreased to low level, while the output signal Q is increased to high level.

On the other hand, as for the entire nonvolatile latch 2100, when writing "0", as shown in FIG. 47, both the signals FRSTMB and E1 become high level. Therefore both the input signals INN and INP of the sense amplifier 2110 are fixed to low level (i.e. the ground potential VSS) (INN=INP=L).

In addition, when writing "0", both the signals FED_DN1 and FEU_DN1 become high level. Therefore the analog switches 2205 and 2206 are turned off, and hence the ferroelectric capacitors 2201 to 2204 are electrically separated from the sense amplifier 2110.

In addition, when writing "0", all the signals PL1_DN and PL2_DN, and the signal FESEL1N become high level. Therefore all the transistors 2207 to 2211 are turned on, and both the signals PL1 and PL2 become low level. Therefore both terminals of each of the ferroelectric capacitors 2201 to 2204 are short-circuited, and the positive terminals and the negative terminals of them are all fixed to low level (i.e. the ground potential VSS) (PL1=PL2=L, SDnC1=SDC1=L).

In particular, the signals SDnC1 and SDC1 can be fixed to the ground potential by turning on the transistors 2210 and 2211, and hence unintentional voltage application to the ferroelectric capacitors 2201 to 2204 can be avoided so that data breakage (data corruption) can be more securely prevented.

However, as described above, considering that the NOR arithmetic units 2212 and 2213 set the signals PL1 and PL2 to low level so that the positive terminals of the ferroelectric capacitors 2201 to 2204 are fixed to the ground potential, the transistors 2210 and 2211 are not essential for the circuit grounding portion C.

In this way, the operation state of FIG. 47 is completely the same as the operation state of FIG. 45 described above. Note that an operation state of the entire nonvolatile latch 2100 when writing "1" is also completely the same as that when writing "0", and hence overlapping description is omitted.

Figure 49:
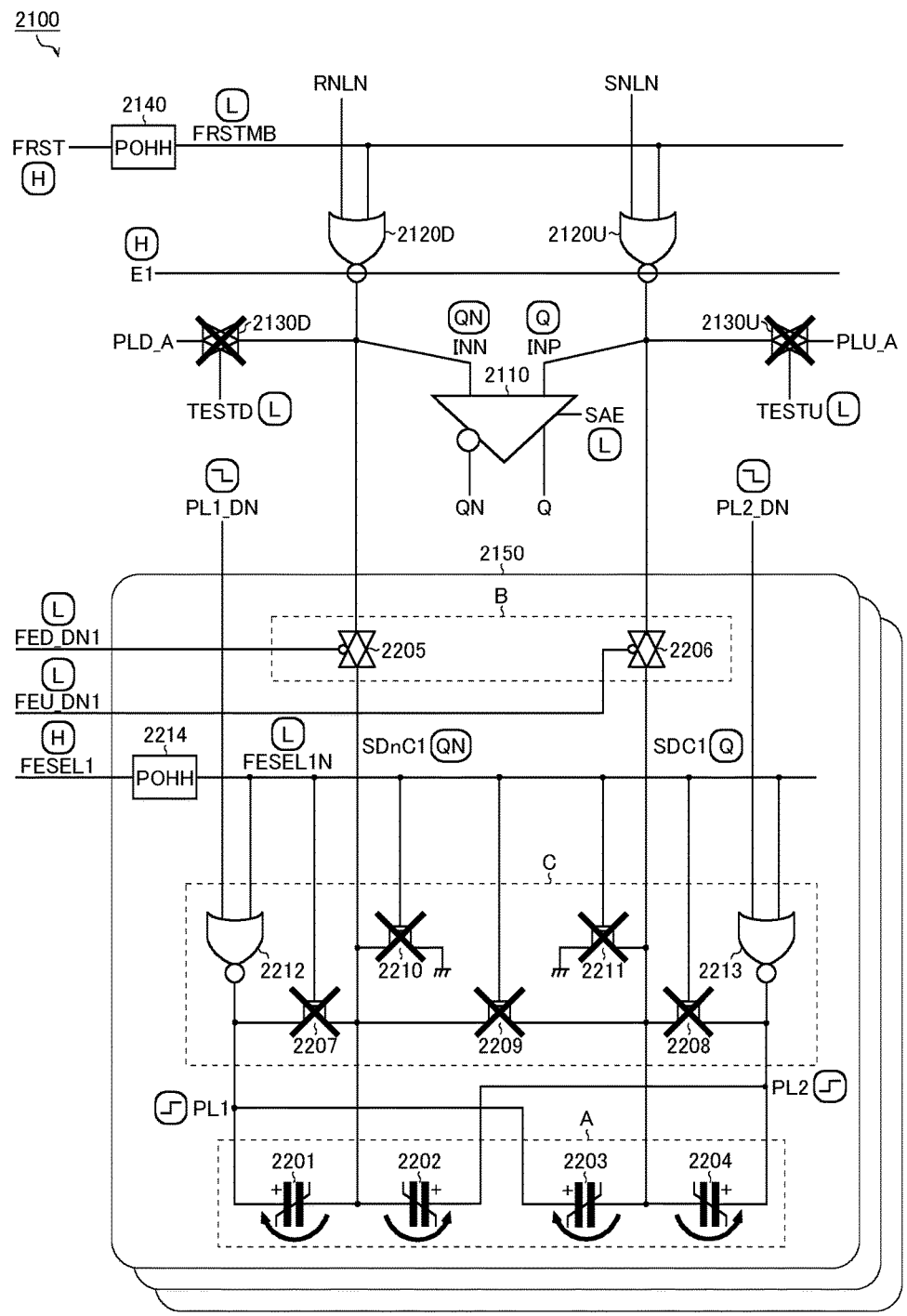
FIG. 49 is a circuit diagram showing a state of the nonvolatile latch when saving data.
Figure 50:
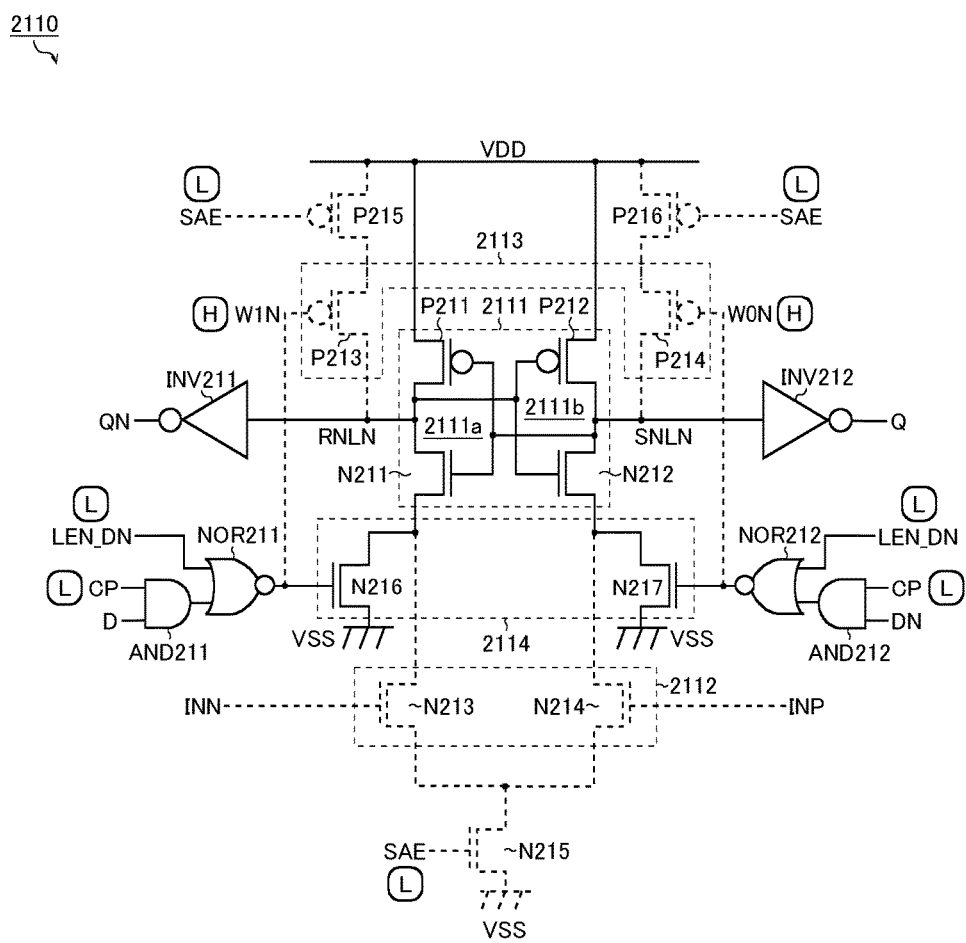
FIG. 50 is a circuit diagram showing a state of the sense amplifier when saving data.

Next, an operation state when saving data is described with reference to FIGS. 49 and 50. FIGS. 49 and 50 are circuit diagrams showing operation states of the nonvolatile latch 2100 and the sense amplifier 2110, respectively, when saving data.

When saving data from the inverter loop 2111 of the sense amplifier 2110 to the storage area 2150 (which can be understood to be a first bit of storage area 2150(1)), as shown in FIG. 50, both the signal LEN_DN and the clock signal CP become low level, and hence both the signals W1N and W0N become high level. Note that a process of stopping the clock signal CP should be performed by using a not-shown controller. In addition, when saving data, the signal SAE becomes low level.

With the control described above, the transistor N215 and the transistors P213 and P214 are all turned off, while the transistors N216 and N217, and the transistors P215 and P216 are all turned on. In other words, both the differential pair circuit 2112 and the first potential setter 2113 are disabled, and the second potential setter 2114 sets the ground nodes of the CMOS inverters 2111a and 2111b to the second potential (e.g. the ground potential VSS).

Therefore the sense amplifier 2110 becomes equivalent to the inverter loop 2111 as a single unit, and hence data written to the inverter loop 2111 is held. For example, when data "0" is written to the inverter loop 2111, the output signal Q is held at low level, while the inverted output signal QN is held at high level. On the contrary, when data "1" is written to the inverter loop 2111, the output signal Q is held at high level, while the inverted output signal QN is held at low level. In this way, the operation state of FIG. 50 is completely the same as the operation state of FIG. 46 described above.

On the other hand, as for the entire nonvolatile latch 2100, when saving data, as shown in FIG. 49, the signal FRSTMB becomes low level, and the signal E1 becomes high level. Therefore the NOR arithmetic units 2120D and 2120U can output the logically inverted signals of the signals RNLN and SNLN (i.e. corresponding to the inverted output signal QN and the output signal Q).

In addition, when saving data, both the signals FED_DN1 and FEU_DN1 become low level. Therefore the analog switches 2205 and 2206 are both turned on, and hence the ferroelectric capacitors 2201 to 2204 are electrically connected to the sense amplifier 2110 (SDnC1=QN, SDC1=Q).

In addition, when saving data, the signal FESEL1N becomes low level. Therefore the transistors 2207 to 2211 are all turned off, and both terminals of each of the ferroelectric capacitors 2201 to 2204 are opened (are not short-circuited), and hence the data writing voltage can be applied to each of the ferroelectric capacitors 2201 to 2204.

In addition, when saving data, the signals PL1_DN and PL2_DN are pulse-driven. As a result, pulse-like (high level to low level, or low level to high level) signals PL1 and PL2 are applied to the positive terminals of each of the ferroelectric capacitors 2201 to 2204, and hence the remanent polarization states of the ferroelectric capacitors 2201 to 2204 are set to either the inverted state or the non-inverted state. This state corresponds to a state where data corresponding to the output signal Q and the inverted output signal QN are written to the ferroelectric capacitors 2201 to 2204.

Figure 51:
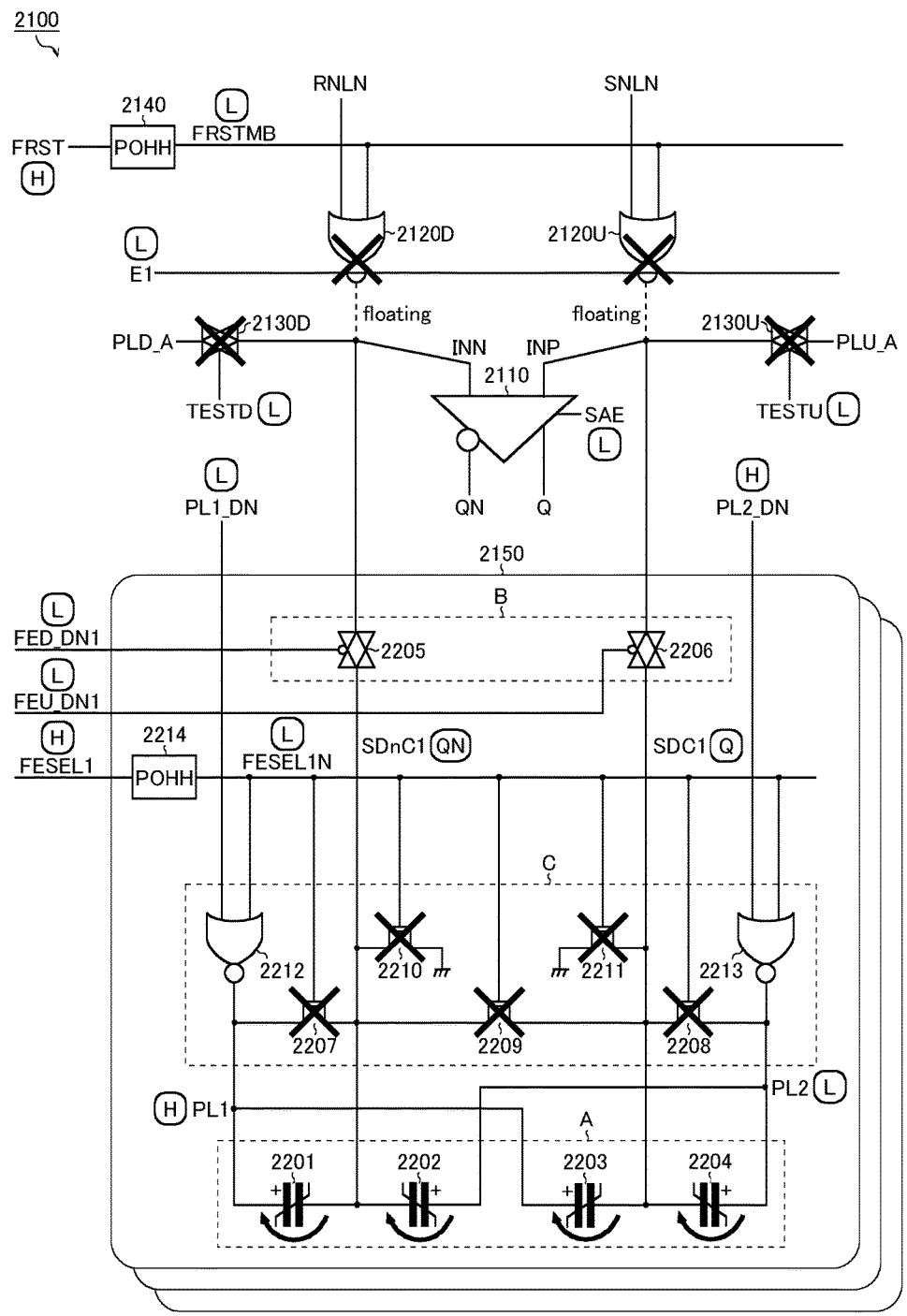
FIG. 51 is a circuit diagram showing a state of the nonvolatile latch when restoring data (precharging).
Figure 52:
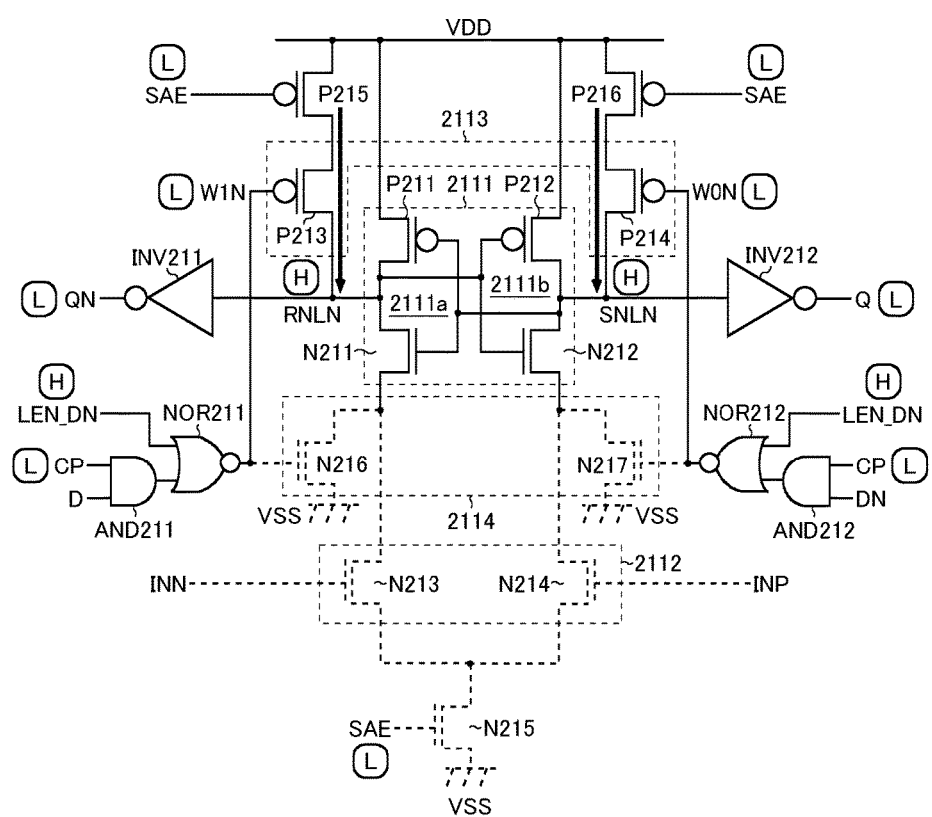
FIG. 52 is a circuit diagram showing a state of the sense amplifier when restoring data (precharging).

Next, an operation state when restoring data (precharging) is described with reference to FIGS. 51 and 52. FIGS. 51 and 52 are circuit diagrams showing operation states of the nonvolatile latch 2100 and the sense amplifier 2110, respectively, when restoring data (precharging).

Prior to the sensing operation of the input signals INN and INP (i.e. corresponding to the signals SDnC1 and SDC1 read from the ferroelectric capacitors 2201 to 2204) by the sense amplifier 2110, when precharging the parasitic capacitances accompanying the output nodes of the CMOS inverters 2111a and 2111b, as shown in FIG. 52, the signal LEN_DN becomes high level, and the clock signal CP becomes low level. Therefore both the signals W1N and W0N become low level. In addition, when precharging, the signal SAE becomes low level.

With the control described above, the transistors N215 to N217 are all turned off, while the transistors P213 to P216 are all turned on. In other words, the differential pair circuit 2112 and the second potential setter 2114 are disabled, and the first potential setter 2113 sets the output nodes of the CMOS inverters 2111a and 2111b to the first potential (e.g. the power supply potential VDD).

Therefore the output nodes of the CMOS inverters 2111a and 2111b (i.e. RNLN and SNLN) are forced to increase to high level, and hence parasitic capacitances accompanying them are precharged. In this case, both the output signal Q and the inverted output signal QN become low level.

On the other hand, as for the entire nonvolatile latch 2100, when restoring data (precharging), as shown in FIG. 51, the signal E1 becomes low level, and hence both the NOR arithmetic units 2120D and 2120U become the output high impedance state (i.e. a state in which potential of each output terminal is floating).

In addition, when restoring data (precharging), the signal FESEL1N becomes low level. Therefore the transistors 2207 to 2211 are all turned off, and both terminals of each of the ferroelectric capacitors 2201 to 2204 are opened (are not short-circuited), and hence the data reading voltage can be applied to the ferroelectric capacitors 2201 to 2204.

In addition, when restoring data (precharging), the signal PL1_DN becomes low level, and the signal PL2_DN becomes high level. As a result, the signal PL1 applied to the positive terminals of the ferroelectric capacitors 2201 and 2203 becomes high level, and the signal PL2 applied to the positive terminals of the ferroelectric capacitors 2202 and 2204 becomes low level. With this application of the data reading voltage, the signals SDnC and SDC1 corresponding to the remanent polarization states of the ferroelectric capacitors 2201 to 2204 appear.

In addition, when restoring data (precharging), both the signals FED_DN1 and FEU_DN1 become low level. Therefore the analog switches 2205 and 2206 are both turned on, and hence the ferroelectric capacitors 2201 to 2204 are electrically connected to the sense amplifier 2110. As a result, the differential pair circuit 2112 of the sense amplifier 2110 is supplied with the input signals INN and INP to be sensed (i.e. the signals SDnC1 and SDC1 read from the ferroelectric capacitors 2201 to 2204) when the precharging operation is started.

Figure 53:
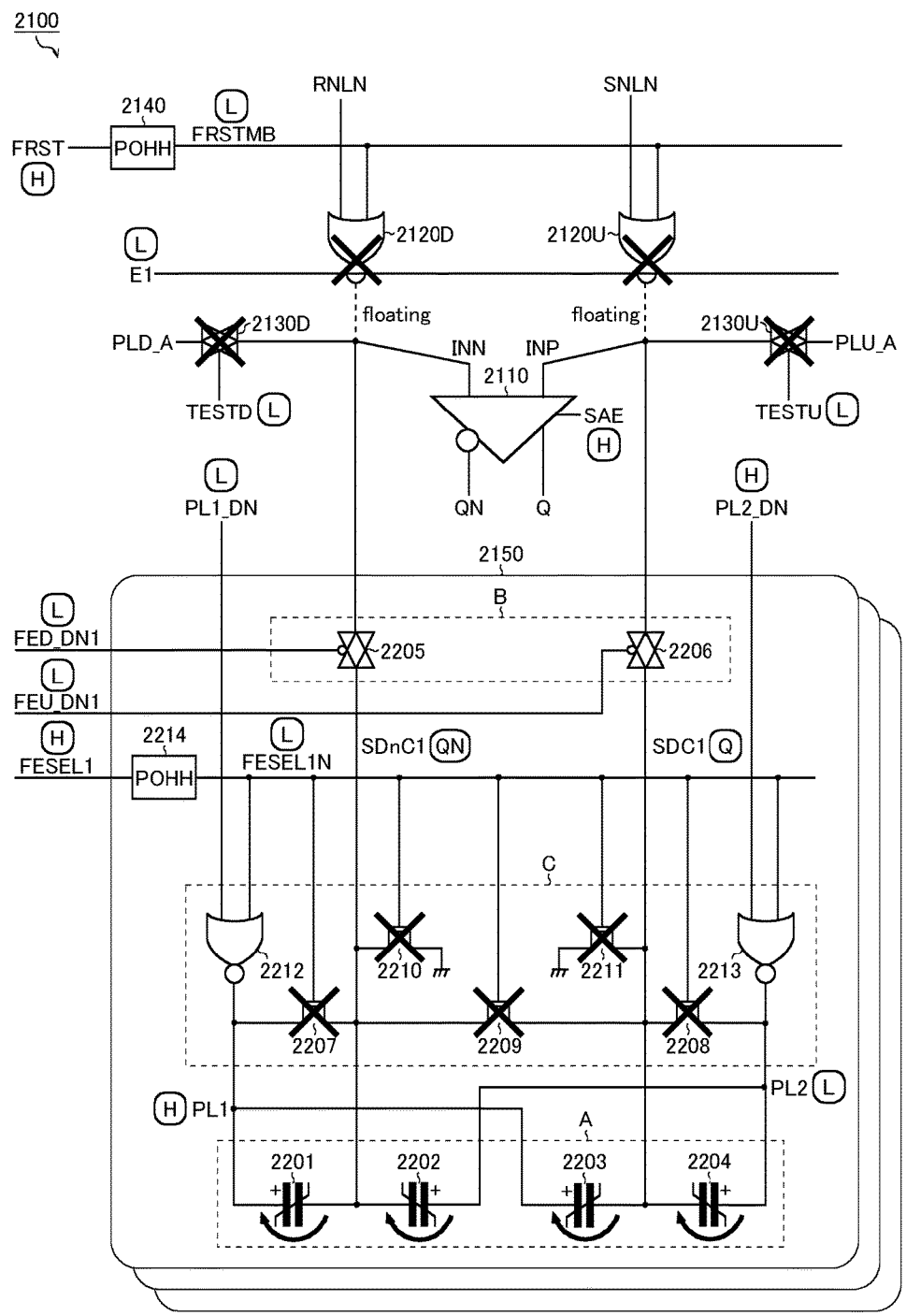
FIG. 53 is a circuit diagram showing a state of the nonvolatile latch when restoring data (sensing).
Figure 54:
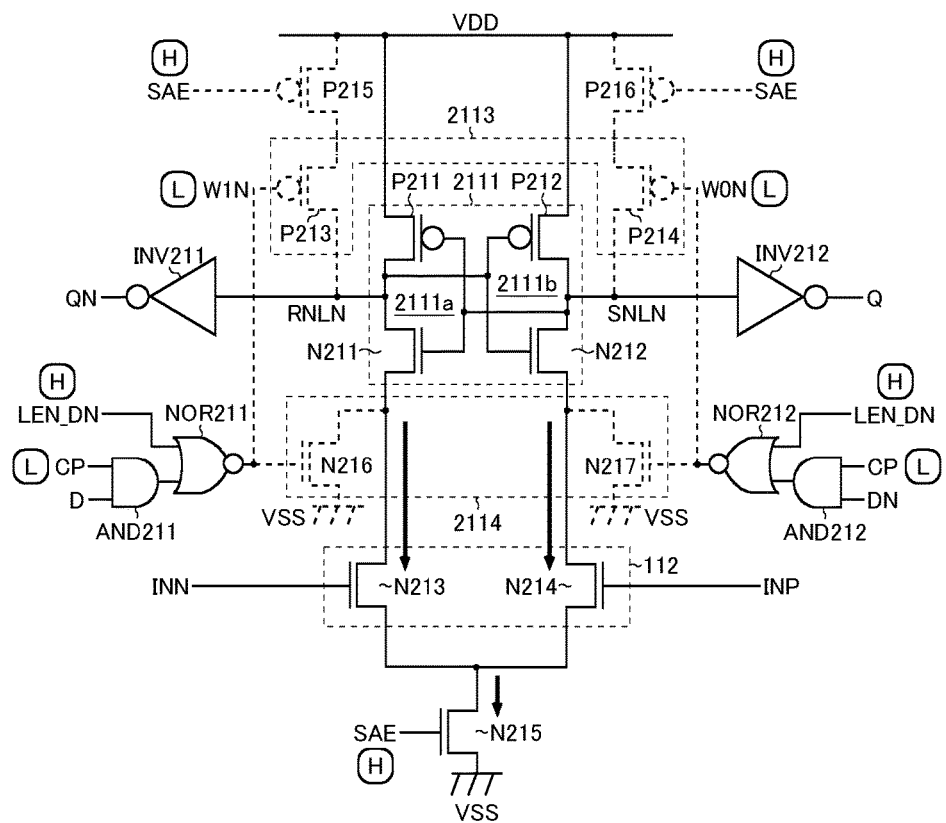
FIG. 54 is a circuit diagram showing a state of the sense amplifier when restoring data (sensing).
Figure 55:
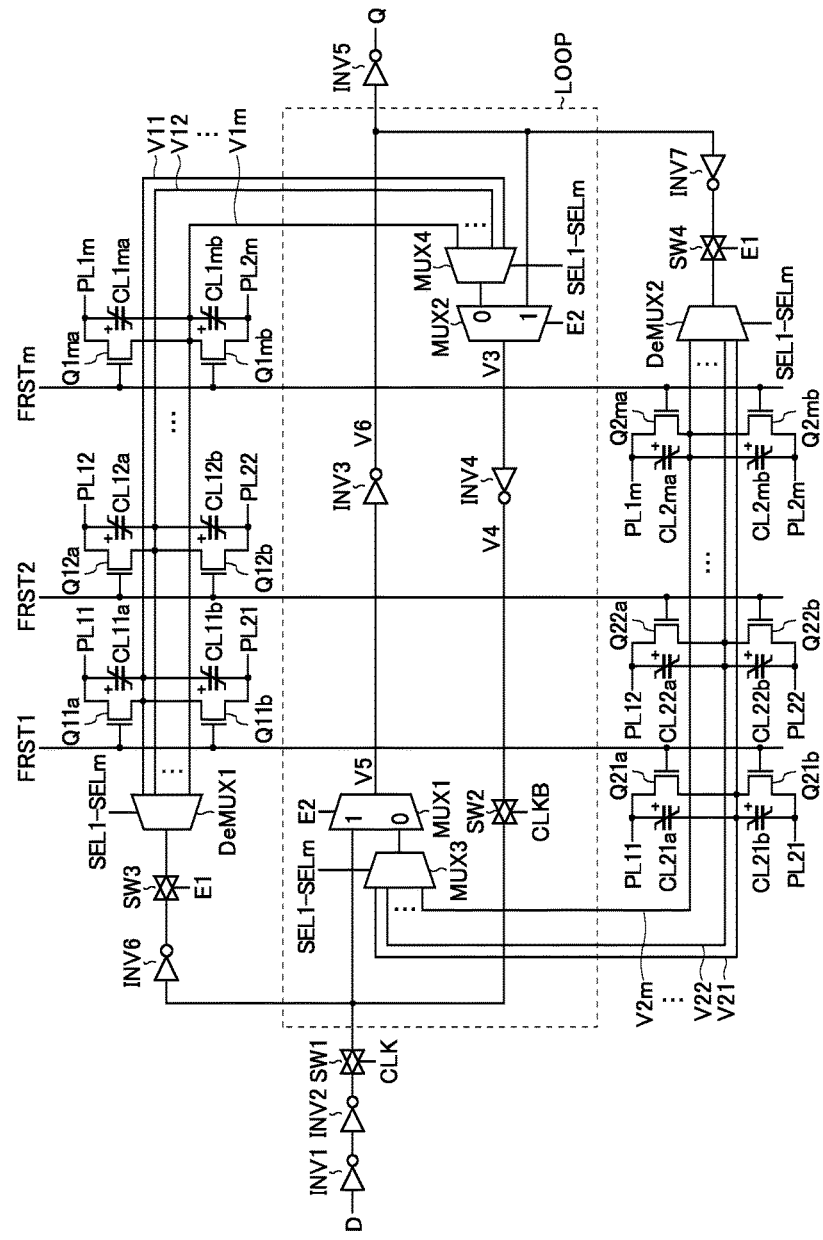
FIG. 55 is a circuit diagram showing a conventional example of the data holding device.

Next, an operation state when restoring data (sensing) is described with reference to FIGS. 53 and 54. FIGS. 53 and 54 are circuit diagrams showing operation states of the nonvolatile latch 2100 and the sense amplifier 2110, respectively, when restoring data (sensing).

When sensing the input signals INN and INP using the sense amplifier 2110, as shown in FIG. 54, the signal LEN_DN becomes high level, while the clock signal CP becomes low level, and hence both the signals W1N and W0N become low level. In addition, the signal SAE becomes high level when sensing.

With the control described above, the transistors N216 and N217, and the transistors P215 and P216 are all turned off, while the transistors N213 to N215, and the transistors P213 and P214 are all turned on. In other words, the differential pair circuit 2112 is enabled, while the first potential setter 2113 and the second potential setter 2114 are disabled.

Therefore current corresponding to the input signals INN and INP flow in the transistors N213 and N214, respectively, and hence a potential difference is generated between the output nodes of the CMOS inverters 2111a and 2111b. The inverter loop 2111 amplifies this potential difference so as to determine logic levels of the output signal Q and the inverted output signal QN.

For example, when INP<INN is satisfied, the current flowing in the transistor N214 becomes larger than the current flowing in the transistor N213, the output node of the CMOS inverter 2111b has a lower potential than the output node of the CMOS inverter 2111a. When this potential difference is generated, due to the amplifying action of the inverter loop 2111, the output node of the CMOS inverter 2111a having a relatively high potential is increased to high level, while the output node of the CMOS inverter 2111b having a relatively low potential is decreased to low level. As a result, the output signal Q becomes high level, and the inverted output signal QN becomes low level. The operation state means that data "1" saved in the ferroelectric capacitors 2201 to 2204 is restored to the inverter loop 111.

On the contrary, when INP>INN is satisfied, the current flowing in the transistor N214 is smaller than the current flowing in the transistor N213, and hence the output node of the CMOS inverter 2111b has a higher potential than the output node of the CMOS inverter 2111a. Therefore, due to the amplifying action of the inverter loop 2111, the output node of the CMOS inverter 2111a having a relatively low potential is decreased to low level, while the output node of the CMOS inverter 2111b having a relatively high potential is increased to high level. As a result, the output signal Q becomes low level, while the inverted output signal QN becomes high level. This operation state means that data "0" saved in the ferroelectric capacitors 2201 to 2204 is restored to the inverter loop 111.

On the other hand, as for the entire nonvolatile latch 2100, when restoring data (sensing), as shown in FIG. 53, the signal E1 becomes low level, and hence both the NOR arithmetic units 2120D and 2120U become the output high impedance state (i.e. a state in which potential of each output terminal is floating).

In addition, when restoring data (sensing), signal FESEL1N becomes low level. Therefore the transistors 2207 to 2211 are all turned off, and both terminals of each of the ferroelectric capacitors 2201 to 2204 are opened (are not short-circuited), and hence the data reading voltage can be applied to the ferroelectric capacitors 2201 to 2204.

In addition, when restoring data (sensing), the signal PL1_DN becomes low level, and the signal PL2_DN becomes high level. As a result, the signal PL1 applied to the positive terminals of the ferroelectric capacitors 2201 and 2203 becomes high level, while the signal PL2 applied to the positive terminals of the ferroelectric capacitors 2202 and 2204 becomes low level. With this application of the data reading voltage, the signals SDnC1 and SDC corresponding to the remanent polarization states of the ferroelectric capacitors 2201 to 2204 appear.

In addition, when restoring data (sensing), both the signals FED_DN1 and FEU_DN1 become low level. Therefore the analog switches 2205 and 2206 are both turned on, and hence the ferroelectric capacitors 2201 to 2204 are electrically connected the sense amplifier 2110. As a result, the differential pair circuit 2112 of the amplifier 2110 is supplied with the input signals INN and INP to be sensed (i.e. the signals SDnC1 and SDC1 read from the ferroelectric capacitors 2201 to 2204) when the precharging operation is started.

In this way, the operation state of FIG. 53 is completely the same as the operation state of FIG. 51 described above.

<Variations>

Note that the nonvolatile latch 2100 described above may be a slave, and an inverter loop to be a master may be disposed at the pre-stage thereof (i.e. on the upstream side of the data input terminals of the AND arithmetic units AND211 and AND212), so as to realize a nonvolatile flip-flop.

<Nonvolatile Data Holding Device>

Figure 56:
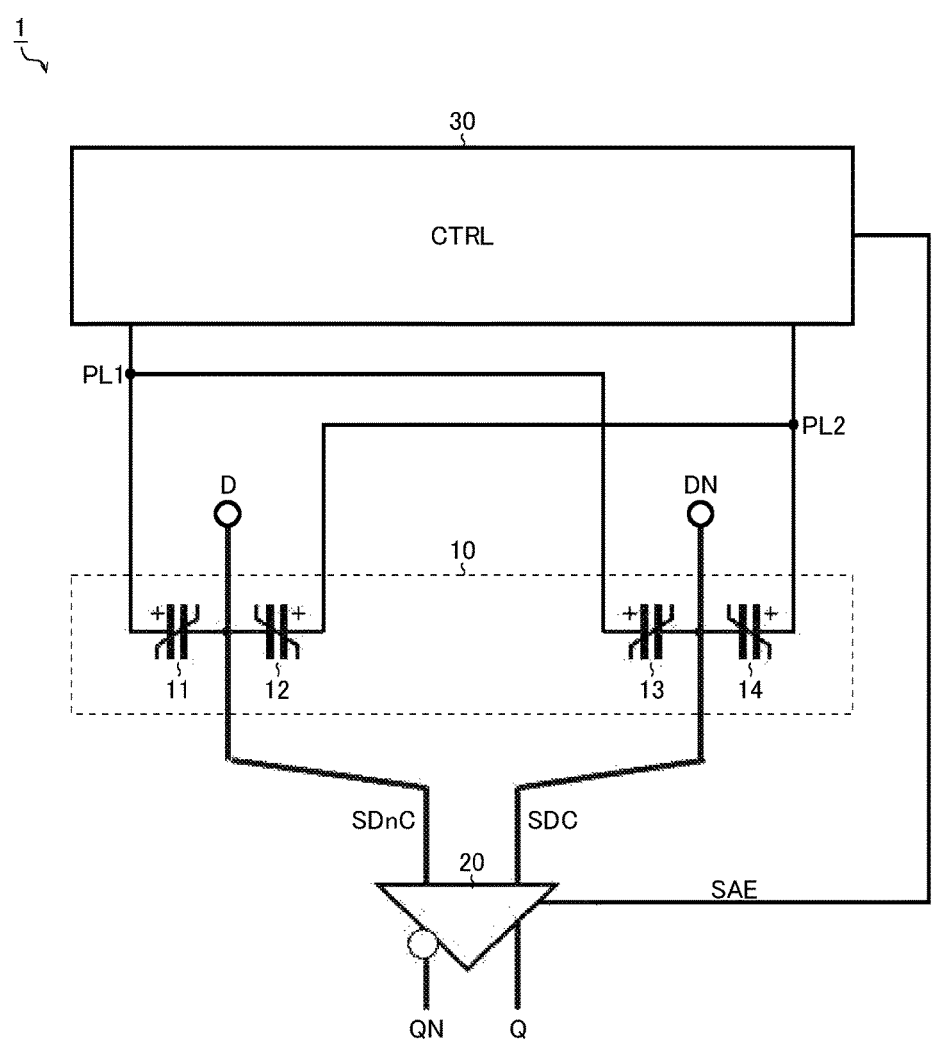
FIG. 56 is a circuit diagram showing a structural example of a nonvolatile data holding device.

FIG. 56 is a circuit diagram showing a structural example of the nonvolatile data holding device. A nonvolatile data holding device 1 of this structural example includes a nonvolatile storing portion 10, a sense amplifier 20, and a control unit 30.

The nonvolatile storing portion 10 includes ferroelectric elements 11 to 14 (ferroelectric capacitors), so as to store data in a nonvolatile manner by using hysteresis characteristics thereof. A connection relationship of the elements is described below. Positive terminals of the ferroelectric elements 11 and 13 are connected to the application terminal of the signal PL1. Positive terminals of the ferroelectric elements 12 and 14 are connected to the application terminal of the signal PL2. Negative terminals of the ferroelectric elements 11 and 12 are connected to a first input terminal of the sense amplifier 20 (i.e. the input terminal of the first input signal SDnC). Negative terminals of the ferroelectric elements 13 and 14 are connected to a second input terminal of the sense amplifier 20 (i.e. the input terminal of the second input signal SDC).

In other words, the ferroelectric elements 11 and 12 correspond to a first ferroelectric element pair connected in series between the application terminal of the signal PL1 and the application terminal of the signal PL2, while the ferroelectric elements 13 and 14 correspond to a second ferroelectric element pair connected in series between the application terminal of the signal PL1 and the application terminal of the signal PL2 in the same manner.

When writing data in the nonvolatile storing portion 10, the data signal D is applied to the negative terminals of the ferroelectric elements 11 and 12, while the inverted data signal DN (i.e. the logically inverted signal of the data signal D) is applied to the negative terminals of the ferroelectric elements 13 and 14. On the other hand, when reading data from the nonvolatile storing portion 10, the input of data signal D and the inverted data signal DN to the negative terminals of the ferroelectric elements 11 to 14 is stopped, and the first input signal SDnC and the second input signal SDC are output to the sense amplifier 20. Note that the data writing operation and the data reading operation of the nonvolatile storing portion 10 will be described later in detail.

The sense amplifier 20 receives the differential input between the first input signal SDnC and the second input signal SDC so as to generate the output signal Q and the inverted output signal QN. Note that operation of the sense amplifier 20 is allowed or inhibited (enabled or disabled) according to the signal SAE input from the control unit 30. In addition, this structural example adopts the structure in which the sense amplifier 20 receives the differential input between the first input signal SDnC and the second input signal SDC, but for example, it is possible to eliminate the ferroelectric elements 13 and 14 and to fix the second input terminal of the sense amplifier 20 to a predetermined reference potential (SDC=Vref).

The control unit 30 generates the signals PL1 and PL2 and the signal SAE, so as to control the nonvolatile storing portion 10 and the sense amplifier 20 (details will be described later).

Figure 64:
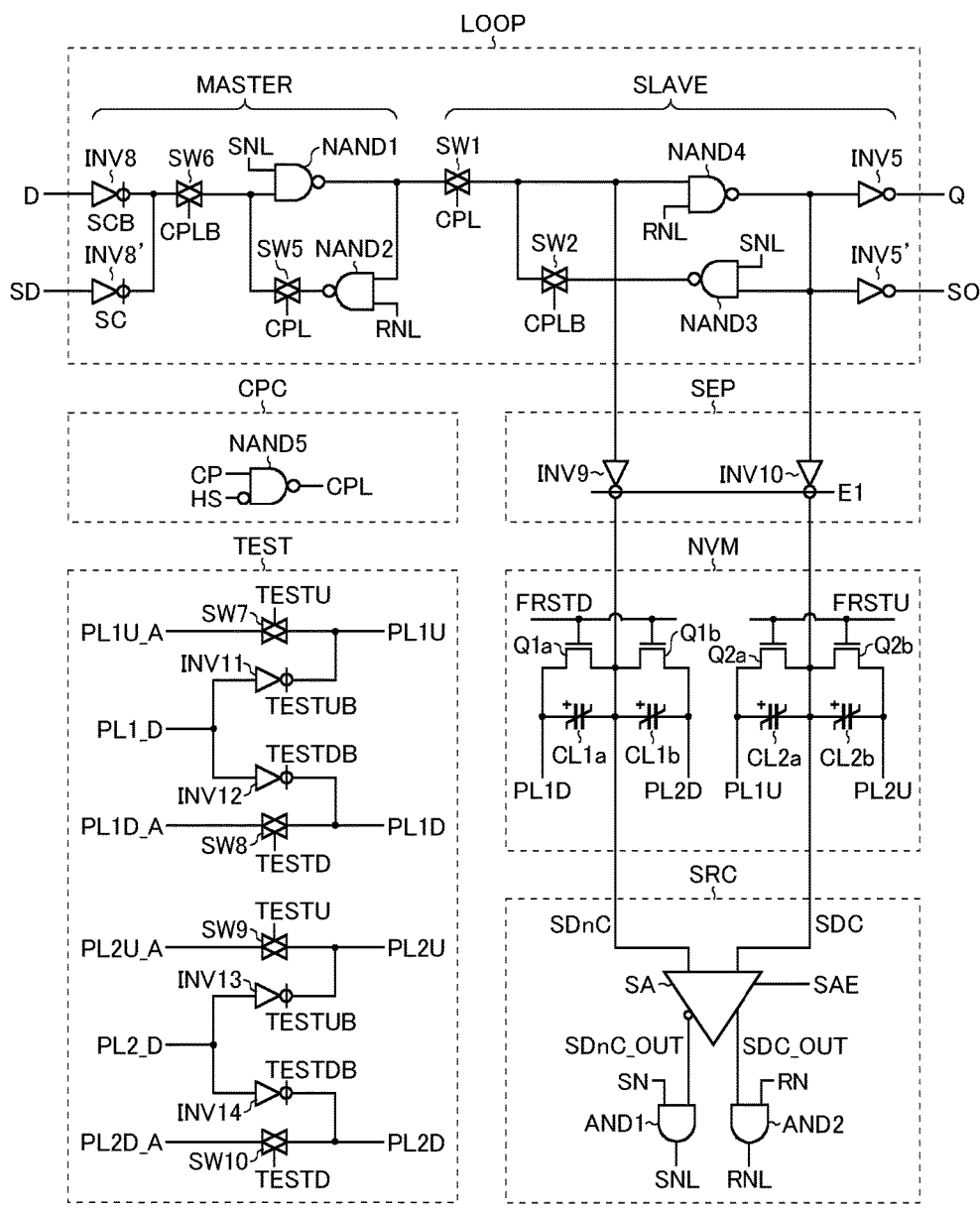
FIG. 64 is a circuit diagram showing a conventional example of the data holding device.

Note that when using the nonvolatile data holding device 1 as a nonvolatile flip-flop (or a nonvolatile latch), similar to FIG. 64 described above, a loop structure (LOOP) that holds data using a plurality of logic gates connected in a loop, and a circuit separating portion (SEP) that electrically separates between the loop structure and the nonvolatile storing portion 10 are further disposed.

<Data Writing Operation>

Figure 57:
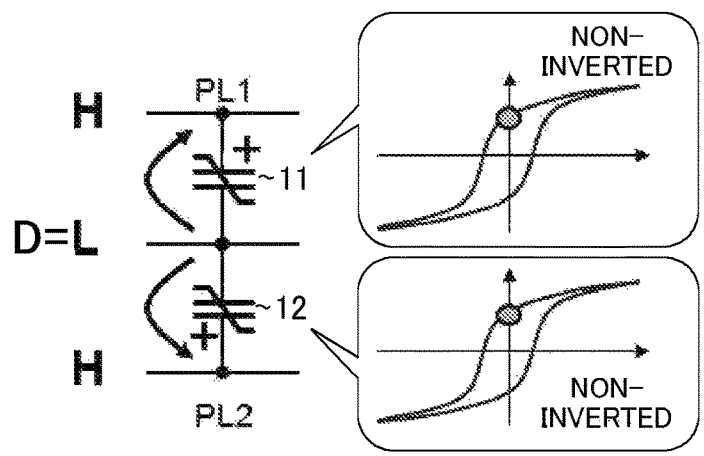
FIG. 57 is a schematic diagram showing an operation state of a ferroelectric element pair when writing "0".
Figure 58:
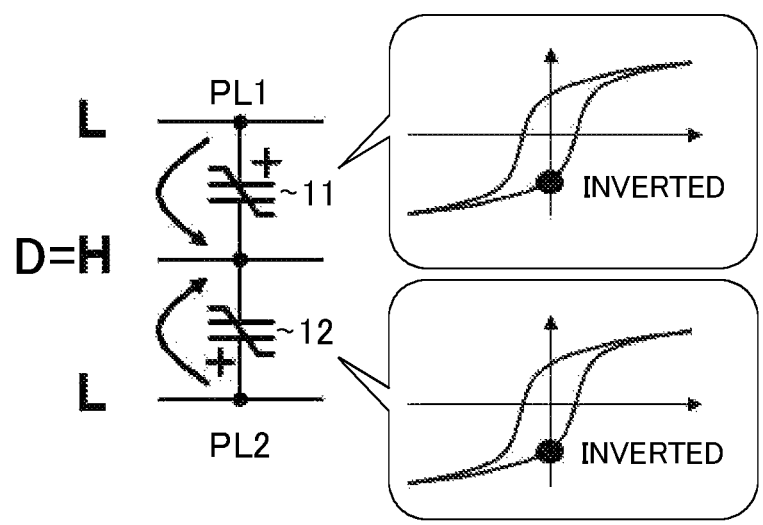
FIG. 58 is a schematic diagram showing an operation state of the ferroelectric element pair when writing "1".

Next, the data writing operation of the nonvolatile storing portion 10 is described. FIGS. 57 and 58 are schematic diagrams showing operation states of the first ferroelectric element pair (ferroelectric elements 11 and 12) when writing "0" (D=L) and when writing "1" (D=H), respectively. Note that the left side of each diagram shows voltage application states of the ferroelectric elements 11 and 12. In addition, the right side of each diagram (balloon) shows hysteresis characteristics of the ferroelectric elements 11 and 12.

As shown in FIG. 57, in a state where the low level data signal D is applied to the negative terminals of the ferroelectric elements 11 and 12, when both the signals PL1 and PL2 are set to high level, the remanent polarization states of the ferroelectric elements 11 and 12 are set to the non-inverted state. This state corresponds to a state where data "0" is written in the nonvolatile storing portion 10.

On the other hand, as shown in FIG. 58, in a state where the high level data signal D is applied to the negative terminals of the ferroelectric elements 11 and 12, when both the signals PL1 and PL2 are set to low level, the remanent polarization states of the ferroelectric elements 11 and 12 are set to the inverted state. This state corresponds to a state where data "1" is written in the nonvolatile storing portion 10.

Therefore when the control unit 30 writes data in the nonvolatile storing portion 10, a state where the data signal D is applied to the negative terminals of the ferroelectric elements 11 and 12, it drives the signals PL1 and PL2 in a pulse-like manner (high level to low level, or low level to high level). As a result, the remanent polarization states of the ferroelectric elements 11 and 12 are set to either the inverted state or the non-inverted state.

Note that the inverted data signal DN is input to the second ferroelectric element pair (ferroelectric elements 13 and 14), and hence the remanent polarization states of the ferroelectric elements 13 and 14 are opposite to those of the ferroelectric elements 11 and 12.

<Data Reading Operation>

Figure 59:
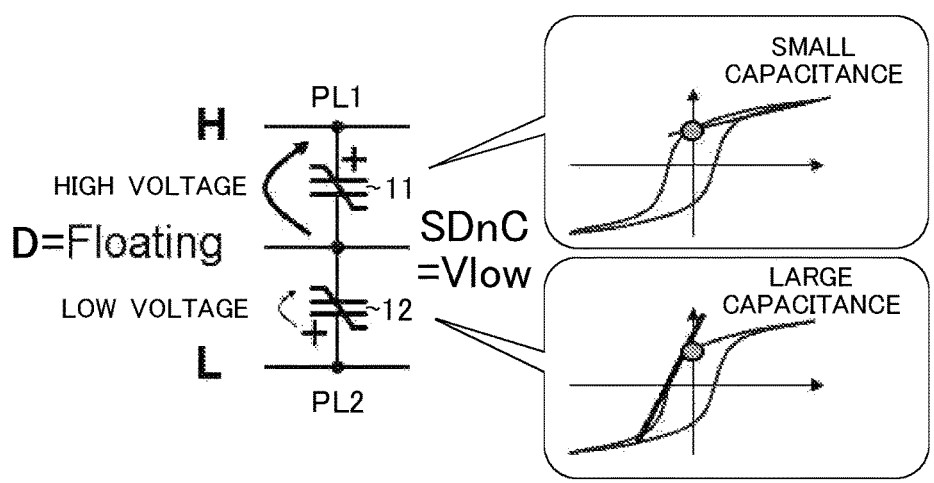
FIG. 59 is a schematic diagram showing an operation state of the ferroelectric element pair when reading "0".
Figure 60:
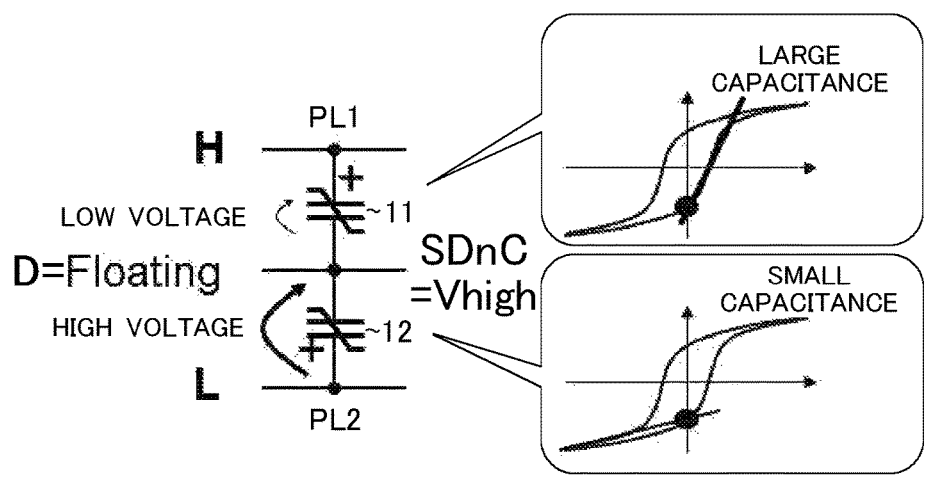
FIG. 60 is a schematic diagram showing an operation state of the ferroelectric element pair when reading "1".

Next, the data reading operation of the nonvolatile storing portion 10 is described. FIGS. 59 and 60 are schematic diagrams showing operation states of the first ferroelectric element pair (ferroelectric elements 11 and 12) when reading "0" (SDnC=Vlow) and when reading "1" (SDnC=Vhigh), respectively. Note that the left side of each diagram shows voltage application states of the ferroelectric elements 11 and 12. In addition, the right side of each diagram (balloon) shows hysteresis characteristics and capacitance characteristics of the ferroelectric elements 11 and 12.

As shown in each diagram, in a state where the application terminal of the data signal D is potentially floating, the signal PL1 is set to high level (power supply potential VDD), while the signal PL2 is set to low level (ground potential GND). Then, a voltage having a positive polarity is applied between both terminals of the ferroelectric element 11, and a voltage having a negative polarity is applied between both terminals of the ferroelectric element 12. In this case, the capacitance characteristics of the ferroelectric elements 11 and 12 alter according to the respective remanent polarization states.

For example, when data "0" is written in the nonvolatile storing portion 10 as shown in FIG. 59, the remanent polarization states of the ferroelectric elements 11 and 12 are set to the non-inverted state, and hence capacitance of the ferroelectric element 11 applied with a voltage having a positive polarity becomes relatively small, while capacitance of the ferroelectric element 12 applied with a voltage having a negative polarity becomes relatively large. Therefore the voltage between both terminals of the ferroelectric element 11 becomes relatively high, while the voltage between both terminals of the ferroelectric element 12 becomes relatively low, and hence the first input signal SDnC of the sense amplifier 20 becomes the lower side voltage Vlow.

On the contrary, as shown in FIG. 60, in case where data "1" is written in the nonvolatile storing portion 10, the remanent polarization states of the ferroelectric elements 11 and 12 are set to the inverted state. Therefore capacitance of the ferroelectric element 11 applied with a voltage having a positive polarity becomes relatively large, while capacitance of the ferroelectric element 12 applied with a voltage having a negative polarity becomes relatively small. Thus, the voltage between both terminals of the ferroelectric element 11 becomes relatively low, while the voltage between both terminals of the ferroelectric element 12 becomes relatively high, and hence the first input signal SDnC of the sense amplifier 20 becomes the upper side voltage Vhigh.

Note that, although not illustrated, opposite to the above description, the second input signal SDC of the sense amplifier 20 becomes the upper side voltage Vhigh when reading data "0", while it becomes the lower side voltage Vlow when reading data "1".

Therefore, by comparing the signal values at an appropriate data reading timing using the sense amplifier 20 that receives the differential input between the first input signal SDnC and the second input signal SDC, the logic level of the data read from the nonvolatile storing portion 10 can be determined. As for the example described above, it is data "0" when SDnC<SDC is satisfied, while it is data "1" when SDnC>SDC is satisfied.

<Data Reading Timing>

Figure 61:
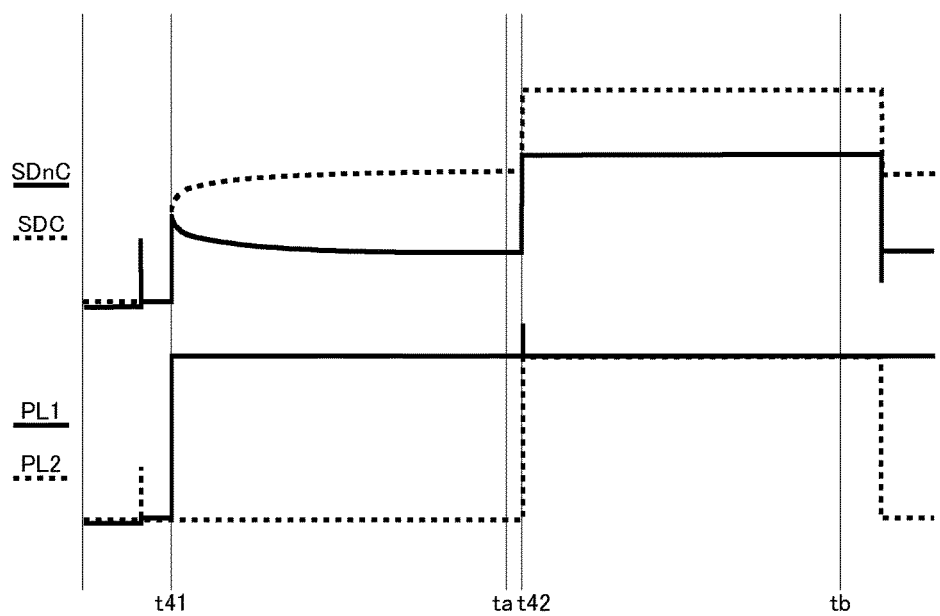
FIG. 61 is a timing chart showing an example of a data reading operation.

Next, data reading timing of the sense amplifier 20 is described. FIG. 61 is a timing chart showing an example of the data reading operation. Note that the upper side of this diagram shows the first input signal SDnC (solid line) and the second input signal SDC (broken line), which are overlaid, and the lower side of this diagram shows the signals PL1 (solid line) and PL2 (broken line), which are overlaid.

When the control unit 30 reads data from the nonvolatile storing portion 10, in a state where the sense amplifier 20 (SAE=L) is stopped at time t41, the control unit 30 sets the signal PL1 to high level (power supply potential VDD) while it sets the signal PL2 to low level (ground potential GND).

With this signal control, the first input signal SDnC and the second input signal SDC become a voltage value corresponding to a logic level of data stored in the nonvolatile storing portion 10 (the upper side voltage Vhigh or the lower side voltage Vlow). In this diagram, assuming that data "0" is written in the nonvolatile storing portion 10, the first input signal SDnC is at the lower side voltage Vlow that is a relatively low, and the second input signal SDC is at the upper side voltage Vhigh that is relatively high.

Here, in the conventional data reading operation (hereinafter referred to as normal reading), at time ta, the sense amplifier 20 is operated (SAE=H) while maintaining the signals PL1 and PL2 at the logic levels described above (different potentials), so as to compare between the first input signal SDnC and the second input signal SDC.

On the other hand, in the data reading operation newly proposed in this specification (hereinafter referred to as after reading), at time t42, the signals PL1 and PL2 are set to the same potential (e.g. the power supply potential VDD), and then at time tb, the sense amplifier 20 is operated (SAE=H), so that the first input signal SDnC and the second input signal SDC are compared with each other.

Note that in this diagram, on the precondition that the input transistor constituting the differential input stage of the sense amplifier 20 is an N-channel type metal oxide semiconductor field effect transistor (NMOSFET), both the signals PL1 and PL2 are set to the power supply potential VDD at time t42, but it is possible to set both the signals PL1 and PL2 to the ground potential GND if the input transistor is a P-channel type MOSFET (PMOSFET).

In addition, if it is possible to set both the signals PL1 and PL2 to an operating point potential of the sense amplifier 20 (e.g. VDD/2) at time t42, the dynamic range of the sense amplifier 20 can be fully utilized.

Hereinafter, technical meaning of changing the data reading operation from the normal reading to the after reading is described.

Figure 62:
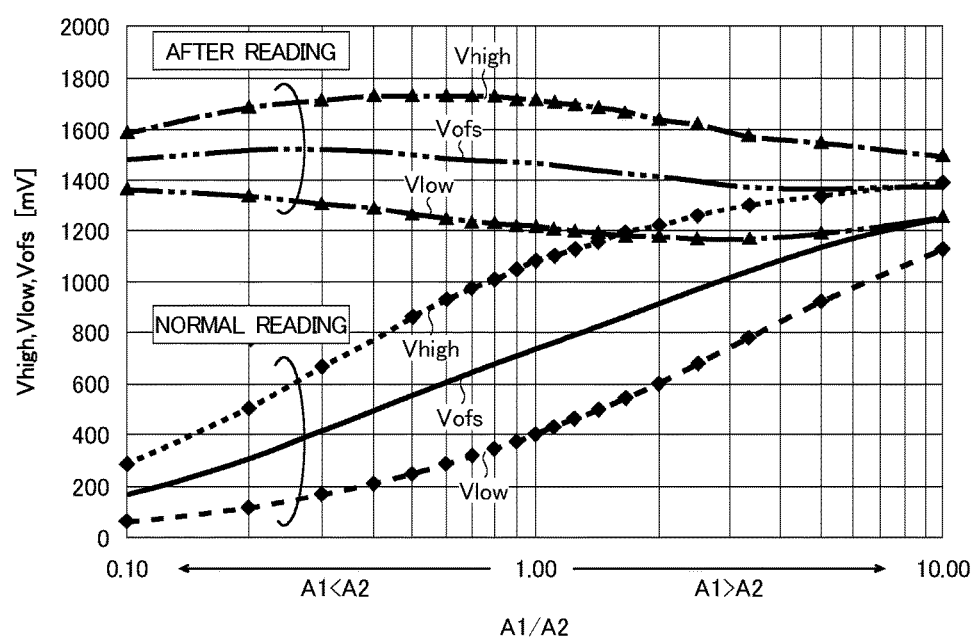
FIG. 62 is a correlation diagram between an area ratio of the ferroelectric element pair and offset fluctuation.

FIG. 62 is a correlation diagram between an area ratio of the ferroelectric element pair and offset fluctuation. The horizontal axis of this diagram represents an area ratio A1/A2 of the ferroelectric element pair in a logarithmic scale. Note that A1 represents an effective area of the ferroelectric element (11, 13) on the PL1 side, and A2 represents an effective area of the ferroelectric element (12, 14) on the PL2 side. Therefore, as the area ratio A1/A2 is smaller, the ferroelectric element (12, 14) on the PL2 side is relatively larger, while as the area ratio A1/A2 is larger, the ferroelectric element (11, 13) on the PL1 side is relatively larger.

On the other hand, the vertical axis of this diagram represents simulation values of the upper side voltage Vhigh of the first input signal SDnC or the second input signal SDC, the lower side voltage Vlow, and an offset voltage Vofs (=(Vhigh+Vlow)/2) (under conditions of VDD=1.5 V at room temperature). Note that, in the diagram, the thin broken line, the thick broken line, and the solid line indicate the upper side voltage Vhigh, the lower side voltage Vlow, and the offset voltage Vofs, respectively, in normal reading. In the diagram, the dot-dashed line, the double-dot dashed line, and the triple-dot dashed line indicate the upper side voltage Vhigh, the lower side voltage Vlow, and the offset voltage Vofs, respectively, in after reading.

As shown in this diagram, in normal reading, offset fluctuation of the first input signal SDnC or the second input signal SDC (i.e. gradient of the offset voltage Vofs) with respect to effective area variation of the ferroelectric elements 11 to 14 (i.e. fluctuation of the area ratio A1/A2) is large, and hence an operation margin when reading data may not be sufficiently secured.

For example, if the area ratio of the ferroelectric elements 11 and 12 is smaller than one while the area ratio of the ferroelectric elements 13 and 14 is larger than one, the first input signal SDnC is offset to the low potential side, while the second input signal SDC is offset to the high potential side. Therefore, when reading data "1" (SDnC=Vhigh, SDC=Vlow), the operation margin (Vmargin=Vhigh-Vlow) becomes small, and in the worst case, there may occur a stuck state (i.e. a state where the logic level of read data is fixed regardless of a logic level of data written in the nonvolatile storing portion 10).

In addition, opposite to the above description, if the area ratio of the ferroelectric elements 11 and 12 is larger than one while the area ratio of the ferroelectric elements 13 and 14 is smaller than one, the first input signal SDnC is offset to the high potential side, while the second input signal SDC is offset to the low potential side, and hence the operation margin when reading data "0" (SDnC=Vlow, SDC=Vhigh) becomes small.

In addition, even if both the area ratio of the first ferroelectric element pair (11, 12) and the area ratio of the second ferroelectric element pair (13, 14) are smaller than one (or larger than one), as long as there is a difference between the area ratios, the normal reading having a large offset fluctuation may fail to secure the operation margin.

Figure 63:
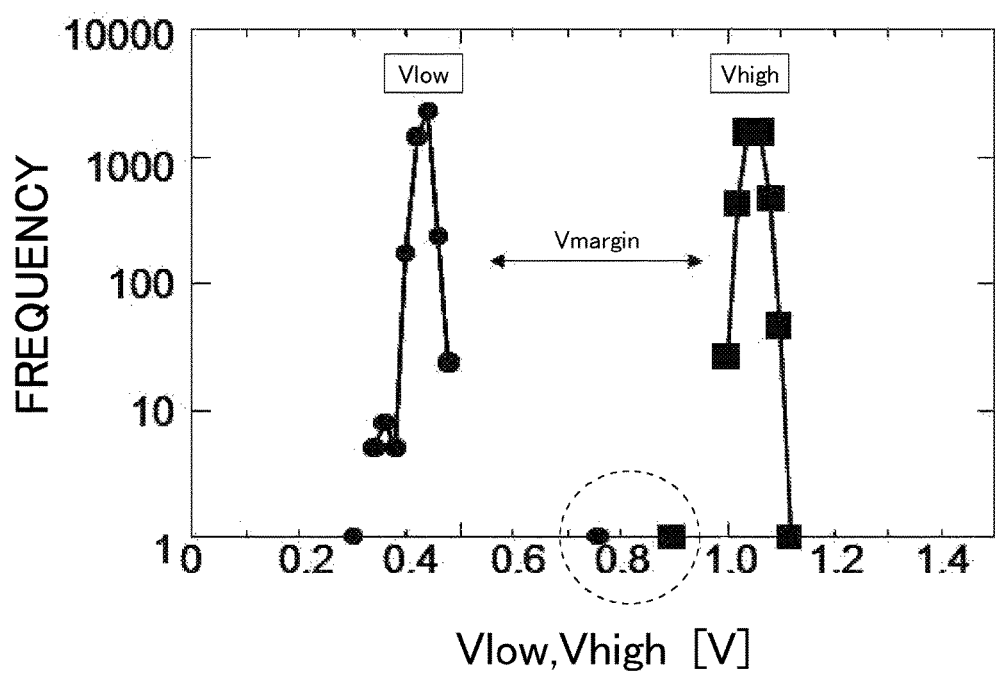
FIG. 63 is a histogram showing data reading characteristics in normal reading.

FIG. 63 is a histogram showing data reading characteristics in normal reading (the number of samples n=4096). Note that black circles indicate distribution of the lower side voltage Vlow, and black squares indicate distribution of the upper side voltage Vhigh. As shown in the broken line area in this diagram, if the lower side voltage Vlow is largely offset to the high potential side while the upper side voltage Vhigh is largely offset to the low potential side, the operation margin when reading data becomes very small.

On the other hand, in the after reading newly proposed in this specification, the first input signal SDnC and the second input signal SDC are compared with each other in the state where the signal PL1 and the signal PL2 are at the same potential. Therefore the offset fluctuation of the first input signal SDnC or the second input signal SDC with respect to the effective area variation of the ferroelectric elements 11 to 14 can be suppressed to be small, and hence the operation margin when reading data can be improved. Thus, yield and reliability of product can be improved. In view of this, the after reading when reading data can be said to be very important and useful technique for mass-production of the nonvolatile data holding device 1.

Note that the embodiments described above exemplify the structure in which the sense amplifier 20 receives the differential input between the first input signal SDnC and the second input signal SDC, but one of the first input signal SDnC and the second input signal SDC may be fixed to a predetermined reference potential Vref, and in this case too, the effect of improving the operation margin by the after reading can be obtained, as a matter of course.

<Summary>

Hereinafter, the various embodiments disclosed in this specification are summarized.

The data holding device disclosed in this specification has a structure, which includes an inverter loop including two inverters connected in a loop, a differential pair circuit connected to ground nodes or power supply nodes of the inverters, a first potential setter arranged to set output nodes of the inverters to a first potential, and a second potential setter arranged to set the ground nodes or the power supply nodes of the inverters to a second potential (first structure).

Note that, it is preferred that the data holding device having the first structure should have a structure, in which the differential pair circuit is connected to the ground nodes of the inverters, the first potential is a power supply potential or a high potential equivalent to the same, and the second potential is a ground potential or a low potential equivalent to the same (second structure).

In addition, the data holding device having the first structure may have a structure, in which the differential pair circuit is connected to the power supply nodes of the inverters, the first potential is a ground potential or a low potential equivalent to the same, and the second potential is a power supply potential or a high potential equivalent to the same (third structure).

In addition, it is preferred that the data holding device having one of the first to third structures should have a structure, in which when holding data using the inverter loop, both the differential pair circuit and the first potential setter are disabled, and the second potential setter sets the ground nodes or the power supply nodes of the inverters to the second potential (fourth structure).

In addition, it is preferred that the data holding device having one of the first to fourth structures should have a structure, in which when writing data to the inverter loop, the differential pair circuit is disabled, and the first potential setter sets the output node of one of the inverters to the first potential, while the second potential setter sets the ground node of or the power supply node of the other inverter to the second potential (fifth structure).

In addition, it is preferred that the data holding device having one of the first to fifth structures should have a structure, in which when precharging parasitic capacitances accompanying the output nodes of the inverters, both the differential pair circuit and the second potential setter are disabled, and the first potential setter sets the output nodes of the inverters to the first potential (sixth structure).

In addition, it is preferred that the data holding device having one of the first to sixth structures should have a structure, in which when sensing an input signal to the differential pair circuit, the differential pair circuit is enabled, and both the first potential setter and the second potential setter are disabled (seventh structure).

In addition, it is preferred that the data holding device having one of the first to seventh structures should have a structure, in which a nonvolatile storage device is connected to the gate of at least one of the pair of transistors constituting the differential pair circuit (eighth structure).

In addition, it is preferred that the data holding device having the eighth structure should have a structure, in which the nonvolatile storage device includes a ferroelectric capacitor (ninth structure).

In addition, it is preferred that the data holding device having the ninth structure should have a structure, in which the pair of transistors are arranged in a symmetric manner viewed from the ferroelectric capacitor (tenth structure).

In addition, it is preferred that the data holding device having the ninth or tenth structure should have a structure, in which the pair of transistors are arranged so as to have the same area of overlapping region between the active area thereof and a forming area of the ferroelectric capacitor (eleventh structure).

In addition, the data holding device disclosed in this specification has a structure, which includes an inverter loop including two inverters connected in a loop, a differential pair circuit connected to ground nodes or power supply nodes of the inverters, a first potential setter arranged to set the output nodes of the inverters to a first potential, and a differential pair control unit arranged to perform gate control of the differential pair circuit so as to set the ground nodes or the power supply nodes of the inverters to a second potential (twelfth structure).

Note that it is preferred that the data holding device having the twelfth structure should have a structure, in which the differential pair control unit includes a first transistor arranged to set the gate of the differential pair circuit to on-potential, and a second transistor arranged to connect and disconnect an input signal path to the gate of the differential pair circuit (thirteenth structure).

In addition, it is preferred that the data holding device having the thirteenth structure should have a structure, in which the differential pair control unit further includes a third transistor arranged to set the gate of the differential pair circuit to off-potential (fourteenth structure).

In addition, it is preferred that the data holding device having one of the twelfth to fourteenth structures should have a structure, in which the differential pair circuit is connected to the ground nodes of the inverters, the first potential is a power supply potential or a high potential equivalent to the same, and the second potential is a ground potential or a low potential equivalent to the same (fifteenth structure).

In addition, the data holding device having one of the twelfth to fourteenth structures may have a structure, in which the differential pair circuit is connected to the power supply nodes of the inverters, the first potential is a ground potential or a low potential equivalent to the same, and the second potential is a power supply potential or a high potential equivalent to the same (sixteenth structure).

In addition, it is preferred that the data holding device having one of the twelfth to sixteenth structures should have a structure, in which when holding data using the inverter loop, the first potential setter is disabled, and the differential pair circuit sets the ground nodes or the power supply nodes of the inverters to the second potential based on the gate control by the differential pair control unit (seventeenth structure).

In addition, it is preferred that the data holding device having one of the twelfth to seventeenth structures should have a structure, in which when writing data to the inverter loop, the first potential setter sets the output node of one of the inverters to the first potential, and the differential pair circuit sets the ground node of or the power supply node of the other inverter to the second potential based on the gate control by the differential pair control unit (eighteenth structure).

In addition, it is preferred that the data holding device having one of the twelfth to eighteenth structures should have a structure, in which when precharging parasitic capacitances accompanying the output nodes of the inverters, both the differential pair circuit and the differential pair control unit are disabled, and the first potential setter sets the output nodes of the inverters to the first potential (nineteenth structure).

In addition, it is preferred that the data holding device having one of the twelfth to nineteenth structures should have a structure, in which when sensing an input signal to the differential pair circuit, the differential pair circuit is enabled, and both the first potential setter and the differential pair control unit are disabled (twentieth structure).

In addition, it is preferred that the data holding device having one of the twelfth to twentieth structures should have a structure, in which the gate of at least one of the pair of transistors constituting the differential pair circuit is connected to a nonvolatile storage device (twenty-first structure).

In addition, it is preferred that the data holding device having the twenty-first structure should have a structure, in which the nonvolatile storage device includes a ferroelectric capacitor (twenty-second structure).

In addition, the nonvolatile data holding device disclosed in this specification has a structure, which includes a loop structure arranged to hold data using a plurality of logic gates connected in a loop, a nonvolatile storing portion arranged to store in a nonvolatile manner data held in the loop structure using hysteresis characteristics of a ferroelectric element, a circuit separating portion arranged to electrically separate the loop structure from the nonvolatile storing portion, and a circuit grounding portion arranged to ground the ferroelectric element (twenty-third structure).

Note that it is preferred that the nonvolatile data holding device having the twenty-third structure should have a structure, in which the circuit grounding portion short-circuits both terminals of the ferroelectric element and grounds both terminals or one terminal of the ferroelectric element (twenty-fourth structure).

In addition, it is preferred that the nonvolatile data holding device having the twenty-third or twenty-fourth structure should have a structure, in which when reading data from the ferroelectric element, capacitive coupling between a ferroelectric element in a non-inverted state and a ferroelectric element in an inverted state is used (twenty-fifth structure).

In addition, the nonvolatile data holding device having the twenty-third or twenty-fourth structure may have a structure, in which when reading data from the ferroelectric element, capacitive coupling between the ferroelectric element and other capacitive element is used (twenty-sixth structure).

It is preferred that the nonvolatile data holding device having one of the twenty-third to twenty-sixth structures should have a structure, in which the nonvolatile storing portion, the circuit separating portion, and the circuit grounding portion are disposed for each plurality of storage areas sharing the single loop structure (twenty-seventh structure).

In addition, it is preferred that the nonvolatile data holding device having one of the twenty-third to twenty-seventh structures should have a structure, in which the nonvolatile storing portion includes a first ferroelectric element having a positive terminal connected to an application terminal of a first signal and a negative terminal connected to a first terminal of the circuit separating portion, a second ferroelectric element having a positive terminal connected to an application terminal of a second signal and a negative terminal connected to the first terminal of the circuit separating portion, a third ferroelectric element having a positive terminal connected to the application terminal of the first signal and a negative terminal connected to a second terminal of the circuit separating portion, and a fourth ferroelectric element having a positive terminal connected to the application terminal of the second signal and a negative terminal connected to the second terminal of the circuit separating portion (twenty-eighth structure).

In addition, it is preferred that the nonvolatile data holding device having the twenty-eighth structure should have a structure, in which the circuit grounding portion includes a first transistor connected between the positive terminal and the negative terminal of the first ferroelectric element, a second transistor connected between the positive terminal and the negative terminal of the fourth ferroelectric element, a third transistor connected between each of the negative terminals of the first and second ferroelectric elements and each of the negative terminals of the third and fourth ferroelectric elements, a first logic gate connected to each of the positive terminals of the first and third ferroelectric elements, and a second logic gate connected to each of the positive terminals of the second and fourth ferroelectric elements (twenty-ninth structure).

In addition, it is preferred that the nonvolatile data holding device having the twenty-ninth structure should have a structure, in which the circuit grounding portion further includes a fourth transistor connected between each of the negative terminals of the first and second ferroelectric elements and a ground terminal, and a fifth transistor connected between each of the negative terminals of the third and fourth ferroelectric elements and the ground terminal (thirtieth structure).

In addition, it is preferred that the nonvolatile data holding device having the thirtieth structure should have a structure, in which the circuit grounding portion sets outputs of the first and second logic gates to low level and turns on all the first to fifth transistors when the loop structure is electrically separated from the nonvolatile storing portion (thirty-first structure).

In addition, it is preferred that the nonvolatile data holding device having one of the twenty-third to thirty-first structures should have a structure, in which an inverter loop of a sense amplifier arranged to read data from the nonvolatile storing portion is also used for the loop structure (thirty-second structure).

In addition, it is preferred that the nonvolatile data holding device having the thirty-second structure should have a structure, in which the sense amplifier includes an inverter loop including two inverters connected in a loop, a differential pair circuit connected to ground nodes or power supply nodes of the inverters, a first potential setter arranged to set output nodes of the inverters to a first potential, and a second potential setter arranged to set the ground nodes or the power supply nodes of the inverters to a second potential (thirty-third structure).

In addition, the nonvolatile data holding device disclosed in this specification includes a nonvolatile storing portion arranged to store data in a nonvolatile manner, a sense amplifier arranged to read data from the nonvolatile storing portion, and a control unit arranged to control the nonvolatile storing portion and the sense amplifier. The nonvolatile storing portion includes a first ferroelectric element connected between an application terminal of a first signal and a first input terminal of the sense amplifier, and a second ferroelectric element connected between an application terminal of a second signal and the first input terminal of the sense amplifier, in which when reading data from the nonvolatile storing portion, the control unit sets the first signal and the second signal to different first and second potentials in a state where the sense amplifier is stopped, and then operates the sense amplifier in a state where the first signal and the second signal are set to the same third potential (thirty-fourth structure).

Note that it is preferred that the nonvolatile data holding device having the thirty-fourth structure should have a structure, in which the third potential is a power supply potential, a ground potential, or an operating point potential of the sense amplifier (thirty-fifth structure).

In addition, it is preferred that the nonvolatile data holding device having the thirty-fourth or thirty-fifth structure should have a structure, in which when writing data in the nonvolatile storing portion, the control unit pulse-drives both the first signal and the second signal in a state where negative terminals of the first ferroelectric element and the second ferroelectric element are applied with a data signal (thirty-sixth structure).

In addition, it is preferred that the nonvolatile data holding device having one of the thirty-fourth to thirty-sixth structures should have a structure, in which the nonvolatile storing portion further includes a third ferroelectric element connected between an application terminal of the first signal and a second input terminal of the sense amplifier, and a fourth ferroelectric element connected between an application terminal of the second signal and the second input terminal of the sense amplifier (thirty-seventh structure).

In addition, it is preferred that the nonvolatile data holding device having the thirty-seventh structure should have a structure, in which when writing data in the nonvolatile storing portion, negative terminals of the third ferroelectric element and the fourth ferroelectric element are applied with inverted data signal of the data signal (thirty-eighth structure).

In addition, the nonvolatile data holding device having one of the thirty-fourth to thirty-sixth structures may have a structure in which a second input terminal of the sense amplifier is fixed to a predetermined reference potential (thirty-ninth structure).

In addition, it is preferred that the nonvolatile data holding device having one of the thirty-fourth to thirty-ninth structures should have a structure, which further includes a loop structure arranged to hold data using a plurality of logic gates connected in a loop, and a circuit separating portion arranged to electrically separate the loop structure from the nonvolatile storing portion (fortieth structure).

In addition, the data reading method disclosed in this specification, which is a method for reading data from a ferroelectric element pair connected in series between an application terminal of a first signal and an application terminal of a second signal, includes the steps of setting the first signal and the second signal to different first and second potentials in a state where a sense amplifier connected to the ferroelectric element pair is stopped, and operating the sense amplifier in a state where the first signal and the second signal are set to the same third potential (forty-first structure).

It is preferred that in the data reading method having the forty-first structure, the third potential is a power supply potential, a ground potential, or an operating point potential of the sense amplifier (forty-second structure).

<Other Variations>

In addition, other than the embodiments described above, the various technical features disclosed in this specification can be variously modified within the scope of the technical invention without deviating from the spirit thereof. In other words, the embodiments described above are merely examples in every aspect and should not be interpreted as limitations. The technical scope of the present invention is defined not by the above description of the embodiments but by the claims, and should be understood to include all modifications within meanings and ranges equivalent to the claims.

INDUSTRIAL APPLICABILITY

The invention disclosed in this specification can be used for a nonvolatile latch, a nonvolatile flip-flop, an FeRAM, an SRAM, a DRAM, and the like.

What is claimed is:

1. A data holding device comprising:
   an inverter loop including two inverters connected in a loop;
   a differential pair circuit connected to ground nodes or power supply nodes of the inverters;
   a first potential setter arranged to set output nodes of the inverters to a first potential; and
   a second potential setter arranged to set the ground nodes or the power supply nodes of the inverters to a second potential, wherein when holding data using the inverter loop, both the differential pair circuit and the first potential setter are disabled, and the second potential setter sets the ground nodes or the power supply nodes of the inverters to the second potential.

2. The data holding device according to claim 1, wherein
   the differential pair circuit is connected to the ground nodes of the inverters,
   the first potential is a power supply potential or a high potential equivalent to the same, and
   the second potential is a ground potential or a low potential equivalent to the same.

3. The data holding device according to claim 1, wherein
   the differential pair circuit is connected to the power supply nodes of the inverters,
   the first potential is a ground potential or a low potential equivalent to the same, and
   the second potential is a power supply potential or a high potential equivalent to the same.

4. The data holding device according to claim 1, wherein when precharging parasitic capacitances accompanying the output nodes of the inverters, both the differential pair circuit and the second potential setter are disabled, and the first potential setter sets the output nodes of the inverters to the first potential.

5. A data holding device comprising:
   an inverter loop including two inverters connected in a loop;
   a differential pair circuit connected to ground nodes or power supply nodes of the inverters;
   a first potential setter arranged to set output nodes of the inverters to a first potential; and
   a second potential setter arranged to set the ground nodes or the power supply nodes of the inverters to a second potential, wherein when writing data to the inverter loop, the differential pair circuit is disabled, and the first potential setter sets the output node of one of the inverters to the first potential, while the second potential setter sets the ground node of or the power supply node of the other inverter to the second potential.

6. The data holding device according to claim 5, wherein
   the differential pair circuit is connected to the ground nodes of the inverters,
   the first potential is a power supply potential or a high potential equivalent to the same, and
   the second potential is a ground potential or a low potential equivalent to the same.

7. The data holding device according to claim 5, wherein
   the differential pair circuit is connected to the power supply nodes of the inverters,
   the first potential is a ground potential or a low potential equivalent to the same, and
   the second potential is a power supply potential or a high potential equivalent to the same.

8. The data holding device according to claim 5, wherein when precharging parasitic capacitances accompanying the output nodes of the inverters, both the differential pair circuit and the second potential setter are disabled, and the first potential setter sets the output nodes of the inverters to the first potential.

9. A data holding device comprising:
   an inverter loop including two inverters connected in a loop;

a differential pair circuit connected to ground nodes or power supply nodes of the inverters;

a first potential setter arranged to set output nodes of the inverters to a first potential; and a second potential setter arranged to set the ground nodes or the power supply nodes of the inverters to a second potential, wherein when sensing an input signal to the differential pair circuit, the differential pair circuit is enabled, and both the first potential setter and the second potential setter are disabled.

10. The data holding device according to claim 9, wherein the differential pair circuit is connected to the ground nodes of the inverters, the first potential is a power supply potential or a high potential equivalent to the same, and the second potential is a ground potential or a low potential equivalent to the same.

11. The data holding device according to claim 9, wherein the differential pair circuit is connected to the power supply nodes of the inverters, the first potential is a ground potential or a low potential equivalent to the same, and the second potential is a power supply potential or a high potential equivalent to the same.

12. The data holding device according to claim 9, wherein when precharging parasitic capacitances accompanying the output nodes of the inverters, both the differential pair circuit and the second potential setter are disabled, and the first potential setter sets the output nodes of the inverters to the first potential.

13. A data holding device comprising:

an inverter loop including two inverters connected in a loop;

a differential pair circuit connected to ground nodes or power supply nodes of the inverters;

a first potential setter arranged to set output nodes of the inverters to a first potential; and a second potential setter arranged to set the ground nodes or the power supply nodes of the inverters to a second potential, wherein a nonvolatile storage device is connected to the gate of at least one of the pair of transistors constituting the differential pair circuit.

14. The data holding device according to claim 13, wherein the nonvolatile storage device includes a ferroelectric capacitor.

15. The data holding device according to claim 14, wherein the pair of transistors are arranged in a symmetric manner viewed from the ferroelectric capacitor.

16. The data holding device according to claim 14, wherein the pair of transistors are arranged so as to have the same area of overlapping region between the active area thereof and a forming area of the ferroelectric capacitor.

17. The data holding device according to claim 13, wherein the differential pair circuit is connected to the ground nodes of the inverters, the first potential is a power supply potential or a high potential equivalent to the same, and the second potential is a ground potential or a low potential equivalent to the same.

18. The data holding device according to claim 13, wherein the differential pair circuit is connected to the power supply nodes of the inverters, the first potential is a ground potential or a low potential equivalent to the same, and the second potential is a power supply potential or a high potential equivalent to the same.

19. The data holding device according to claim 13, wherein when precharging parasitic capacitances accompanying the output nodes of the inverters, both the differential pair circuit and the second potential setter are disabled, and the first potential setter sets the output nodes of the inverters to the first potential.

* * * * *